(12) United States Patent
Iwai et al.

(10) Patent No.: US 8,637,221 B2
(45) Date of Patent: *Jan. 28, 2014

(54) LITHOGRAPHIC PRINTING PLATE PRECURSOR, PLATE MAKING METHOD THEREOF AND NOVEL POLYMER COMPOUND

(71) Applicant: FUJIFILM Corporation, Tokyo (JP)

(72) Inventors: Yu Iwai, Haibara-gun (JP); Hidekazu Oohashi, Haibara-gun (JP); Takanori Mori, Haibara-gun (JP); Takafumi Nakayama, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/688,379

(22) Filed: Nov. 29, 2012

(65) Prior Publication Data

US 2013/0089818 A1    Apr. 11, 2013

Related U.S. Application Data

(63) Continuation of application No. PCT/JP2011/062854, filed on May 30, 2011.

(30) Foreign Application Priority Data

| May 31, 2010 | (JP) | 2010-125336 |
| Feb. 22, 2011 | (JP) | 2011-036385 |
| Apr. 27, 2011 | (JP) | 2011-099721 |

(51) Int. Cl.
| G03F 7/00 | (2006.01) |
| G03F 7/26 | (2006.01) |
| B41N 1/00 | (2006.01) |
| B41M 5/00 | (2006.01) |

(52) U.S. Cl.
USPC ............... 430/270.1; 430/271.1; 430/281.1; 430/283.1; 430/286.1; 101/453; 101/463.1

(58) Field of Classification Search
USPC .......... 430/270.1, 302; 101/450.1, 453, 463.1
See application file for complete search history.

(56) References Cited

U.S. PATENT DOCUMENTS

| 2002/0177074 A1 | 11/2002 | Hoshi et al. |
| 2004/0214105 A1 | 10/2004 | Hoshi et al. |

(Continued)

FOREIGN PATENT DOCUMENTS

| EP | 1868036 A1 | 12/2007 |
| EP | 1751625 B1 | 9/2011 |

(Continued)

OTHER PUBLICATIONS

International Search Report for PCT/JP2011/062854 mailed on Jul. 5, 2011.

(Continued)

*Primary Examiner* — Chanceity Robinson
(74) *Attorney, Agent, or Firm* — Birch, Stewart, Kolasch & Birch, LLP

(57) ABSTRACT

A lithographic printing plate precursor includes: a support; and an image-recording layer containing (A) a polymerization initiator, (B) a sensitizing dye and (C) a polymerizable compound, and the image-recording layer or an undercoat layer which is optionally provided between the support and the image-recording layer comprises (D) a polymer compound comprising (a1) a repeating unit having a side chain having a structure represented by the following formula (a1-1) and (a2) a repeating unit having a side chain having at least one structure of the formulae (a2-1), (a2-2), (a2-3), (a2-4), (a2-5) and (a2-6) as defined herein.

8 Claims, 1 Drawing Sheet

(56) References Cited

U.S. PATENT DOCUMENTS

| | | |
|---|---|---|
| 2005/0008971 A1 | 1/2005 | Mitsumoto et al. |
| 2005/0074692 A1 | 4/2005 | Makino et al. |
| 2005/0266349 A1 | 12/2005 | Van Damme et al. |
| 2006/0040117 A1 | 2/2006 | Hayashi et al. |
| 2008/0241740 A1 | 10/2008 | Oohashi |
| 2009/0246693 A1 | 10/2009 | Nakamura et al. |

FOREIGN PATENT DOCUMENTS

| | | |
|---|---|---|
| JP | 2002-287334 A | 10/2002 |
| JP | 2005-41206 A | 2/2005 |
| JP | 2005-125749 A | 5/2005 |
| JP | 2006-239860 A | 9/2006 |
| JP | 2007-139840 A | 6/2007 |
| JP | 2008-510634 A | 4/2008 |
| JP | 2008-213177 A | 9/2008 |
| JP | 2008-265275 A | 11/2008 |
| JP | 2009-255495 A | 11/2009 |
| WO | WO 2005/111727 A1 | 11/2005 |

OTHER PUBLICATIONS

Written Opinion of the International Searching Authority for PCT/JP2011/062854 mailed on Jul. 5, 2011.

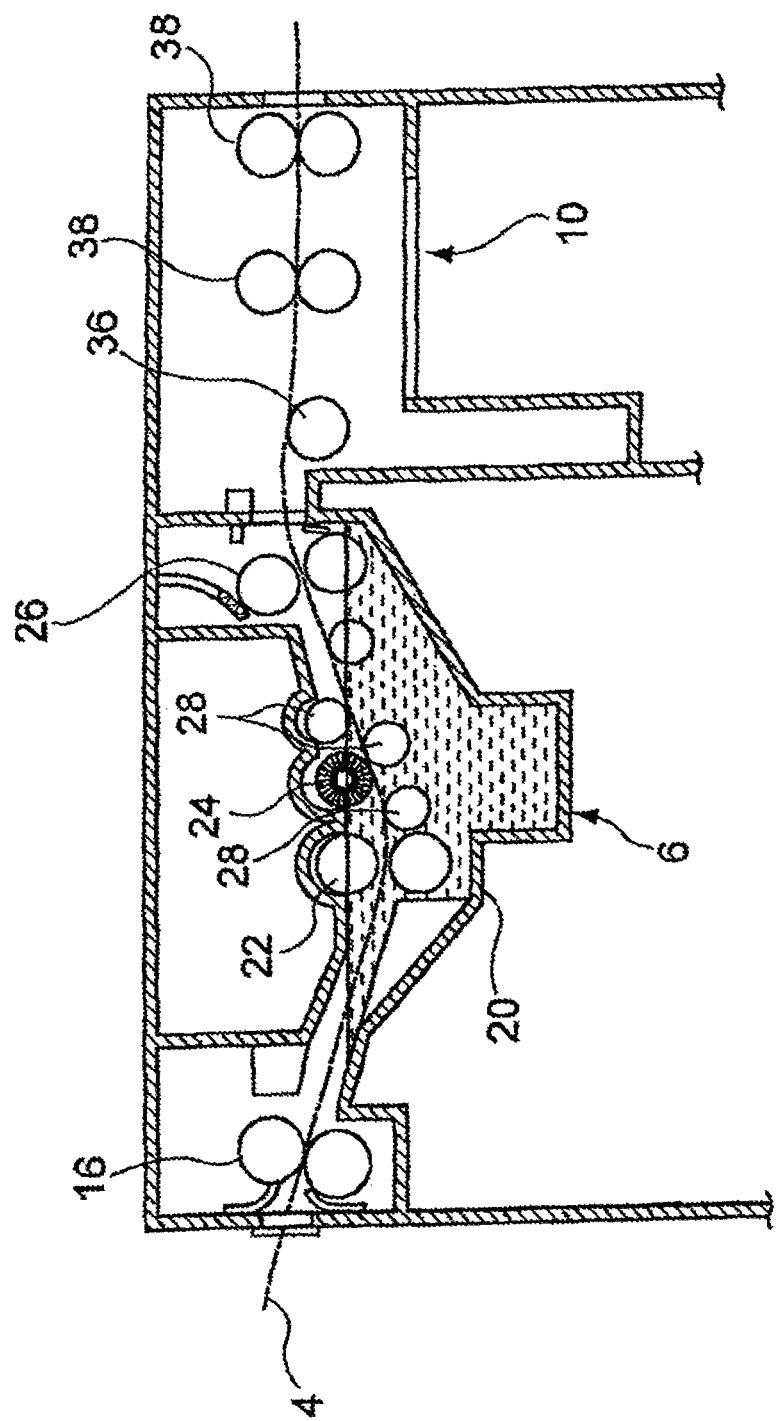

LITHOGRAPHIC PRINTING PLATE PRECURSOR, PLATE MAKING METHOD THEREOF AND NOVEL POLYMER COMPOUND

CROSS REFERENCE TO RELATED APPLICATIONS

This non-provisional application is a Continuation of International Application No. PCT/JP2011/062854 filed on May 30, 2011, which claims the benefit of Japanese Patent Application Nos. 2010-125336 filed in Japan on May 31, 2010, 2011-036385 filed in Japan on Feb. 22, 2011, 2011-099721 filed in Japan on Apr. 27, 2011. The entire contents of all of the above applications are hereby incorporated by reference.

TECHNICAL FIELD

The present invention relates to a lithographic printing plate precursor, a plate making method using the same and a novel polymer compound. More particularly, it relates to a lithographic printing plate precursor capable of undergoing a direct plate making by image exposure with laser, a plate making method of the lithographic printing plate precursor and a novel polymer compound.

BACKGROUND ART

In general, a lithographic printing plate is composed of an oleophilic image area accepting ink and a hydrophilic non-image area accepting dampening water in the process of printing. Lithographic printing is a printing method utilizing the nature of water and oily ink to repel with each other and comprising rendering the oleophilic image area of the lithographic printing plate to an ink-receptive area and the hydrophilic non-image area thereof to a dampening water-receptive area (ink-unreceptive area), thereby making a difference in adherence of the ink on the surface of the lithographic printing plate, depositing the ink only to the image area, and then transferring the ink to a printing material, for example, paper.

In order to produce the lithographic printing plate, a lithographic printing plate precursor (PS plate) comprising a hydrophilic support having provided thereon an oleophilic photosensitive resin layer (image-recording layer) is used. Specifically, the PS plate is exposed through a mask, for example, a lith film, and then subjected to development processing, for example, with an alkaline developer to remove the unnecessary image-recording layer corresponding to the non-image area by dissolving while leaving the image-recording layer corresponding to the image area, thereby obtaining the lithographic printing plate.

Due to the recent progress in the technical field, nowadays the lithographic printing plate can be obtained by a CTP (computer-to-plate) technology. Specifically, a lithographic printing plate precursor is directly subjected to scanning exposure using laser or laser diode without using a film and developed to obtain a lithographic printing plate.

With the progress described above, the issue on the lithographic printing plate precursor has transferred to improvements, for example, in image-forming property corresponding to the CTP technology, printing property or physical property. Also, with the increasing concern about global environment, as another issue on the lithographic printing plate precursor, an environmental problem on waste liquid discharged accompanying the wet treatment, for example, development processing comes to the front.

In response to the environmental problem, simplification of development or plate making or non-processing has been pursued. As one method of simple plate making, a method referred to as an "on-press development" is practiced. Specifically, according to the method after exposure of a lithographic printing plate precursor, the lithographic printing plate precursor is mounted as it is on a printing machine without conducting conventional development and removal of the unnecessary area of image-recording layer is performed at an early stage of printing step.

Also, as a method of simple development, a method referred to as a "gum development" is practiced wherein the removal of the unnecessary area of image-recording layer is performed using not a conventional high alkaline developer but a finisher or gum solution of near-neutral pH.

In the simplification of plate making operation as described above, a system using a lithographic printing plate precursor capable of being handled in a bright room or under a yellow lump and a light source is preferable from the standpoint of workability. Thus, as the light source, a semiconductor laser emitting an infrared ray having a wavelength of 760 to 1,200 or a solid laser, for example, YAG laser, is used. An UV laser is also used.

As the lithographic printing plate precursor capable of undergoing on-press development, for instance, a lithographic printing plate precursor having provided on a support, an image-recording layer (photosensitive layer) containing an infrared absorbing agent, a radical polymerization initiator and a polymerizable compound is described in JP-A-2002-287334 (the term "JP-A" as used herein means an "unexamined published Japanese patent application"). Also, as the lithographic printing plate precursor capable of undergoing gum development, for instance, a lithographic printing plate precursor wherein the development is conducted with a finisher or a gum solution having pH close to neutral is known as described in EP-A-1751625 or EP-A-1868036.

In such a lithographic printing plate precursor of a simple processing type, a support having a surface of high hydrophilicity is heretofore used in order to make possible development with a developer having low pH or dampening water (ordinarily nearly neutral) on a printing machine and as a result, the image area is apt to be removed from the support by dampening water during printing so that sufficient printing durability can not be obtained. On the contrary, when the surface of support renders hydrophobic, ink also adheres on the non-image area during printing to cause printing stain. Thus, it is extremely difficult to achieve a good compatibility between the printing durability and the stain resistance and further improvements are desired.

In view of the above problems, in JP-A-2005-125749 or JP-A-2006-239860, a lithographic printing plate precursor capable of forming, an image without conducting alkali development and comprising a hydrophilic support having thereon a photopolymerizable layer sensitive to laser, wherein a copolymer which contains (a1) a repeating unit having at least one ethylenically unsaturated bond and (a2) a repeating unit having at least one functional group capable of interacting with a surface of the support is contained in the photopolymerizable layer or other layer is proposed and it is described that a lithographic printing plate which is excellent in not only printing durability but also stain resistance is obtained.

Also, in JP-A-2008-213177, a lithographic printing plate precursor comprising a support having thereon a hydrophilic layer composed of a hydrophilic polymer which contains at least one of a reactive group capable of directly chemically bonding with a surface of the support and a reactive group capable of chemically bonding with a surface of the support through a crosslinked structure and a partial structure having a positive charge and a negative charge and which is chemically bonded to the surface of the support and an image-forming layer in this order is proposed and it is described that a lithographic printing plate which is excellent in hydrophilicity of the non-image area and its sustention and also excellent in adhesion property between the image area and the support is obtained.

Further, in JP-T-2008-510634 (the term "JP-T" as used herein means a published Japanese translation of a PCT patent application), a lithographic printing plate precursor comprising a support having thereon an undercoat layer of a copolymer containing (1) a phosphonic acid group and/or a phosphate group and (2) an acid group and/or a group having an ethylene glycol or polyethylene glycol side chain is proposed.

However, with respect to the lithographic printing plate precursor proposed in JP-A-2005-125749 or JP-A-2006-239860, the stain resistance of the lithographic printing plate prepared is insufficient and further a problem arises in that stain occurs when the lithographic printing plate precursor is used after the passage of time from the preparation of lithographic printing plate precursor, that is, the stain resistance after the passage of time is insufficient.

Also, with respect to the lithographic printing plate precursor proposed in JP-A-2008-213177, sufficient results in both the stain resistance without the passage of time and the stain resistance after the passage of time are not obtained. Further, the hydrophilic polymer described in JP-A-2008-213177 has restriction on the producing condition, for example, in that it is necessary to use a nonaqueous solvent at the polymerization reaction in order to introduce the reactive group capable of chemically bonding with a surface of the support through a crosslinked structure into the polymer and a large environmental load.

Further, the lithographic printing plate precursor proposed in JP-T-2008-510634 has a problem of insufficient stain resistance.

SUMMARY OF INVENTION

Therefore, an object of the present invention is to provide a lithographic printing plate precursor which is capable of conducting direct plate making based on digital data, for example, from a computer, by image-recording using a solid laser or semiconductor laser emitting an ultraviolet ray, visible light or infrared ray, particularly, a lithographic printing plate precursor which can be developed on a printing machine or with an aqueous solution having pH of 11 or less, is excellent in developing property, particularly developing property after the passage of time, and can provide a lithographic printing plate exhibiting high printing durability and good stain resistance (including stain resistance after the passage of time), a plate making method of the lithographic printing plate precursor, and a novel polymer compound used in the lithographic printing plate precursor.

As a result of the intensive investigations, the inventors have found that the above-described object can be achieved by using a lithographic printing plate precursor described below.

Specifically, the present invention includes the following items.

(1) A lithographic printing plate precursor comprising a support and an image-recording layer containing (A) a polymerization initiator, (B) a sensitizing dye and (C) a polymerizable compound, wherein the image-recording layer or an undercoat layer which is optionally provided between the support and the image-recording layer contains (D) a polymer compound containing (a1) a repeating unit having a side chain having a structure represented by formula (a1-1) shown below and (a2) a repeating unit having a side chain having at least one structure of the formulae (a2-1), (a2-2), (a2-3), (a2-4), (a2-5) and (a2-6) shown below:

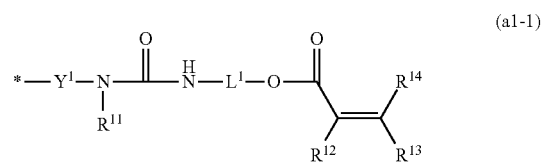
(a1-1)

In formula (a1-1). $R^{11}$ represents a hydrogen atom, an alkyl group, an aryl group, a heterocyclic group, a sulfa group, an alkylsulfonyl group, a arylsulfonyl group, an acyl group, an aryloxycarbonyl group, an alkoxycarbonyl group or a carbamoyl group, $R^{12}$, $R^{13}$ and $R^{14}$ each independently represents a hydrogen atom, an alkyl group or an aryl group, $L^1$ represents a connecting group. $Y^1$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound;

(a2-1)

(a2-2)

(a2-3)

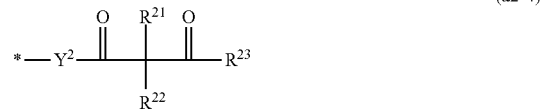
(a2-4)

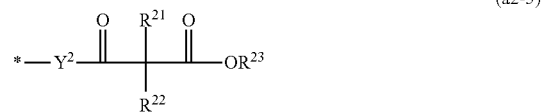
(a2-5)

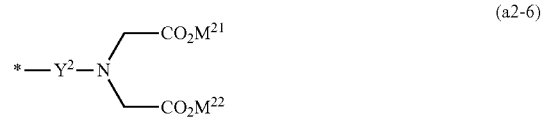
(a2-6)

In the formulae above, $M^{21}$ and $M^{22}$ each independently represents a hydrogen atom, a metal atom belonging to alkali metal or alkaline earth metal or an ammonium, $R^{21}$ to $R^{23}$ each independently represents a hydrogen atom or an alkyl group, $Y^2$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

(2) The lithographic printing plate precursor as described in (1) above, wherein the repeating unit (a2) has a side chain having a structure represented by formula (a2-1) or (a2-2).

(3) The lithographic printing plate precursor as described in (1) or (2) above, wherein the polymer compound (D) further contains (a3) a repeating unit having a side chain having a structure represented by formula (a3-1) or (a3-2) shown below:

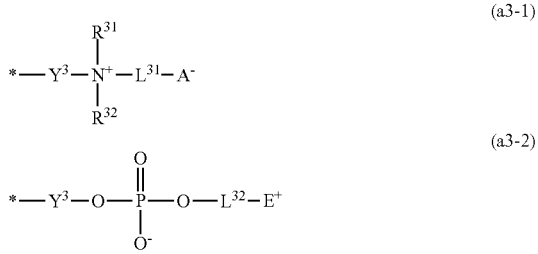

In formula (a3-1), $R^{31}$ and $R^{32}$ each independently represents a hydrogen atom, an alkyl group, an alkenyl group, an alkynyl group, an aryl group or a heterocyclic group, or $R^{31}$ and $R^{32}$ may be combined with each other to from a ring structure, $L^{31}$ represents a connecting group, $A^-$ represents a structure having an anion, $Y^3$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound. In formula (a3-2 represents a connecting group, $E^+$ represents a structure having a cation, $Y^3$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

(4) The lithographic printing plate precursor as described in any one of (1) to (3) above, wherein a side chain having a zwitter ion structure in the repeating unit (a3) has a structure represented by formula (a3-1) and in formula (a3-1), $A^-$ represents a sulfonate.

(5) The lithographic printing plate precursor as described in any one of (1) to (4) above, wherein the polymer compound (D) further has a side chain having a polyoxyalkylene structure represented by formula (a4-1) shown below:

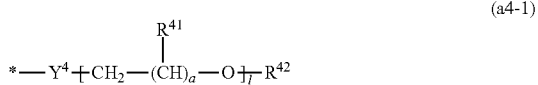

In formula (a4-1), $R^{41}$ represents a hydrogen atom or an alkyl group, $R^{42}$ represents a hydrogen atom, an alkyl group or an aryl group, a represents an integer from 1 to 5, l represents an integer from 2 to 150, $Y^4$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

(6) The lithographic printing plate precursor as described in any one of (1) to (5) above, wherein the polymer compound (D) is contained in the undercoat layer.

(7) A method of preparing a lithographic printing plate comprising exposing imagewise the lithographic printing plate precursor as described in any one of (1) to (6) above and then removing an unexposed area of the image-recording layer by supplying printing ink and dampening water on a printing machine.

(8) A method of preparing a lithographic printing plate comprising exposing imagewise the lithographic printing plate precursor as described in any one of (1) to (6) above and then removing an unexposed area of the image-recording layer by an automatic development processor in the presence of a developer having pH from 2 to 11.

(9) A polymer compound containing at least (a1) to (a3) shown below.

(a1) a repeating unit having a side chain having a structure represented by formula (a1-1) shown below:

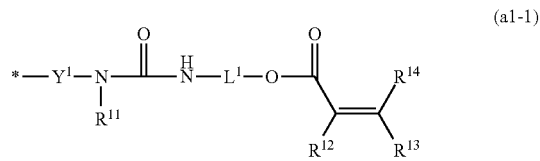

In formula (a1-1), $R^{11}$ represents a hydrogen atom, an alkyl group, an aryl group, a heterocyclic group, a sulfo group, an alkylsulfonyl group, a arylsulfonyl group, an acyl group, an aryloxycarbonyl group, an alkoxycarbonyl group or a carbamoyl group, $R^{12}$, $R^{13}$ and $R^{14}$ each independently represents a hydrogen atom, an alkyl group or an aryl group. $L^1$ represents a connecting group, $Y^1$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

(a2) a repeating unit having a side chain having a structure represented by at least one of formulae (a2-1) and (a2-2):

In the formulae above, $M^{21}$ and $M^{22}$ each independently represents a hydrogen atom, a metal atom belonging to alkali metal or alkaline earth metal or an ammonium, $Y^2$ represents a single bond or a divalent connecting group selected from the group consisting of —CO—, —O—, —HN—, divalent aliphatic group, a divalent aromatic group and a combination of these groups, and * indicates a site connecting to a main chain of the polymer compound.

(a3) a repeating unit having a side chain having a zwitter ion structure represented by formula (a3-1) shown below:

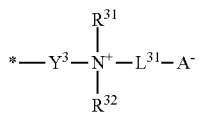
(a3-1)

In formula (a3-1). $R^{31}$ and $R^{32}$ each independently represents a hydrogen atom, an alkyl group, an alkenyl group, an alkynyl group, an aryl group or a heterocyclic group, or $R^{31}$ and $R^{32}$ may be combined with each other to from a ring structure, $L^{31}$ represents a connecting group. $A^-$ represents a sulfonate, represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

(10) The polymer compound as described in (9) above, which further contains (a4) shown below:

(a4) a repeating unit having a side chain having a polyoxyalkylene structure represented by formula (a4-1) shown below:

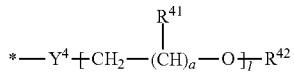
(a4-1)

In formula (a4-1), $R^{41}$ represents a hydrogen atom or an alkyl group, $R^{42}$ represents a hydrogen atom, an alkyl group or an aryl group, a represents an integer from 1 to 5, l l represents an integer from 2 to 150, $Y^4$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

(11) The polymer compound as described in (9) or (10) above, which contains at least repeating units represented by formulae (A1) to (A3) shown below:

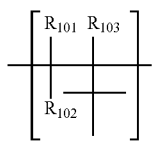
(A1)

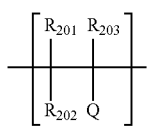
(A2)

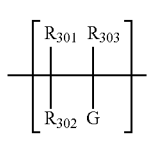
(A3)

In formula (A1), $R^{101}$ to $R^{103}$ each independently represents a hydrogen atom, an alkyl group having from 1 to 6 carbon atoms or a halogen atom, and T represents a structure represented by formula (a1-1) shown below:

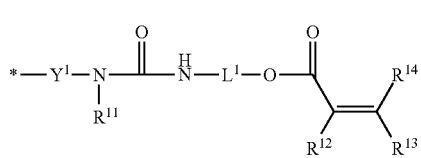
(a1-1)

In formula (a1-1), $R^{11}$ represents a hydrogen atom, an alkyl group, an aryl group, a heterocyclic group, a sulfo group, an alkylsulfonyl group, a arylsulfonyl group, an acyl group, an aryloxycarbonyl group, an alkoxycarbonyl group or a carbamoyl group, $R^{12}$, $R^{13}$ and $R^{14}$ each independently represents a hydrogen atom, an alkyl group or an aryl group. $L^1$ represents a connecting group. $Y^1$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound;

In formula (A2), $R^{201}$ to $R^{203}$ each independently represents a hydrogen atom, an alkyl group having from 1 to 6 carbon atoms or a halogen atom, and Q represents a structure represented by at least any of formulae (a2-1) and (a2-2) shown below:

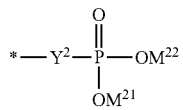
(a2-1)

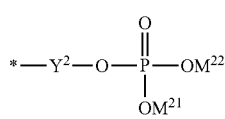
(a2-2)

In formulae (a2-1) and (a2-2), $M^{21}$ and $M^{22}$ each independently represents a hydrogen atom, a metal atom belonging to alkali metal or alkaline earth metal or an ammonium, $Y^2$ represents a single bond or a divalent connecting group selected from the group consisting of —CO—, —O—, —HN—, a divalent aliphatic group, a divalent aromatic group and a combination of these groups, and indicates a site connecting to a main chain of the polymer compound;

In formula (A3). $R^{301}$ to $R^{303}$ each independently represents a hydrogen atom, an alkyl group having from 1 to 6 carbon atoms or a halogen atom, and G represents a structure represented by formula (a3-1) shown below:

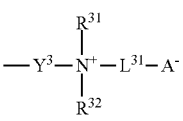
(a3-1)

In formula (a3-1), $R^{31}$ and $R^{32}$ each independently represents a hydrogen atom, an alkyl group, an alkenyl group, an alkynyl group, an aryl group or a heterocyclic group, or $R^{31}$ and $R^{32}$ may be combined with each other to from a ring structure, $L^{31}$ represents a connecting group, $A^-$ represents a sulfonate, $Y^3$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

It is estimated that the effects of the invention may occur for the following reasons. Since the polymer compound (D) having a side chain having a structure represented by formula (a1-1) has high hydrophilicity, a support surface having high hydrophilicity which has not been achieved heretofore is obtained in the non-image area. On the other hand, in the image area, the polymerizable compound in the image-recording layer undergoes radical polymerization with the specific polymer compound to achieve strongly high adhesion property. As a result, it is believed to be able to provide the lithographic printing plate precursor very excellent in stain resistance and time lapse stability and excellent in developing property and printing durability and the method of preparing a lithographic printing plate. It is also believed that due to a hydrogen bond derived from the urea structure in the skeleton of formula (a1-1), the polymer compounds aggregate each other to form a strong film on the support to improve the printing durability.

Further, the polymer compound having a side chain having a structure represented by formula (a1-1) can be synthesized using a polymer compound having a side chain having an amine structure as a precursor. Since, the amine compound ordinarily has high nucleophilic reactivity, the desired reaction can be conducted even in a protic solvent. As a result, even into a polymer compound which has low solubility in an aprotic solvent but has high solubility in a protic solvent, for example, an alcohol or skater, a polymerizable group can be introduced in the protic solvent by utilizing the reactivity of the amine structure, whereby a polymer compound having high hydrophilicity and containing a radical polymerizable group can be synthesized.

BRIEF DESCRIPTION OF DRAWING

FIG. 1 is a view schematically showing a configuration of an automatic development processor.

DESCRIPTION OF EMBODIMENTS

The lithographic printing plate precursor according to the invention comprises a support and an image-recording layer containing (A) a polymerization initiator, (B) a sensitizing dye and (C) a polymerizable compound, wherein the image-recording layer or an undercoat layer which is optionally provided between the support and the image-recording layer contains (D) a polymer compound containing (a1) a repeating unit having a side chain having a structure represented by formula (a1-1) shown below and (a2) a repeating unit having a side chain having at least any structure represented by formulae (a2-1) to (a2-6) shown below (hereinafter, also referred to as a specific polymer compound).

The specific polymer compound, other elements of the lithographic printing plate precursor and a plate making method are described in detail below.
<(D) Specific Polymer Compound>
(a1) Repeating Unit Having Side Chain Having Structure Represented by Formula (a1-1)

The specific polymer compound according to the invention contains a repeating unit having a side chain having a structure represented by formula (a1-1).

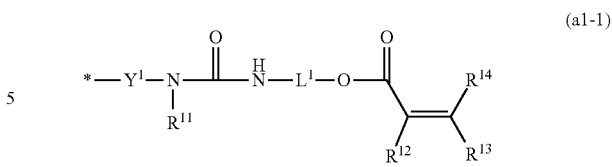

In formula (a1-1), $R^{11}$ represents a hydrogen atom, an alkyl group, an aryl group, a heterocyclic group, a sulfo group, an alkylsulfonyl group, a arylsulfonyl group, an acyl group, an aryloxycarbonyl group, an alkoxycarbonyl group or a carbamoyl group, $R^{12}$, $R^{13}$ and $R^{14}$ each independently represents a hydrogen atom, an alkyl group or an aryl group, $L^1$ represents a connecting group, $Y^1$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

More specifically, the alkyl group represented by $R^{11}$ may be any of straight-chain, branched and cyclic, substituted or unsubstituted alkyl group. The alkyl group includes a straight-chain or branched alkyl group (preferably a substituted or unsubstituted alkyl group having from 1 to 30 carbon atoms, for example, a methyl group, an ethyl group, a n-propyl group, an isopropyl group, a tert-butyl group, a n-octyl group, an cicosyl group, a 2-chloroethyl group, a 2-cyanoethyl group or a 2-ethyl hexyl group), a cycloalkyl group (preferably a substituted or unsubstituted cycloalkyl group having from 3 to 30 carbon atoms, for example, a cyclohexyl group, a cyclopentyl group or a 4-n-dodecylcyclohexyl group), a bicycloalkyl group (preferably a substituted or unsubstituted bicycloalkyl group having from 5 to 30 carbon atoms, that is, a monovalent group formed by eliminating one hydrogen atom from a bicycloalkane having from 5 to 30 carbon atoms, for example, a bicycle[1,2,2]heptan-2-yl group or a bicycle [2,2,2]octan-3-yl group), and a cycloalkyl group having more cyclic structures, for example, a tricycle structure. The alkyl group included in the substituent described hereinafter (for example, the alkyl group in the alkylthio group) also has the same meaning as described above.

The aryl group represented by $R^{11}$ preferably represents a substituted or unsubstituted aryl group having from 6 to 30 carbon atoms, for example, a phenyl group, a p-tolyl group, a naphthyl group, a m-chlorophenyl group or an o-hexadecanoylaminophenyl group). The heterocyclic group represented by $R^{11}$ is preferably a monovalent group formed by eliminating one hydrogen atom from a 5-membered or 6-membered, substituted or unsubstituted, aromatic or non-aromatic heterocyclic compound, more preferably a 5-membered or 6-membered aromatic heterocyclic group having from 3 to 30 carbon atoms. For example, a 2-furyl group, a 2-thienyl group, a 2-pyrimidinyl or a 2-benzothiazolyl group is exemplified. The alkylsulfonyl group represented by $R^{11}$ is preferably a substituted or unsubstituted alkylsulfonyl group having from 1 to 30 carbon atoms and the arylsulfonyl group represented by $R^{11}$ is preferably a substituted or unsubstituted arylsulfonyl group having from 6 to 30 carbon atoms. For example, a methylsulfonyl group, an ethylsulfonyl group, a phenylsulfonyl group or a p-methylphenylsulfonyl group is exemplified. The acyl group represented by $R^{11}$ is preferably a formyl group, a substituted or unsubstituted alkylcarbonyl group having from 1 to 30 carbon atoms, a substituted or unsubstituted arylcarbonyl group having from 7 to 30 carbon atoms, or a substituted or unsubstituted heterocyclic carbonyl group having from 4 to 30 carbon atoms in which the heterocyclic group is connected to the carbonyl group with its carbon atom. For example, an acetyl group, a pivaloyl group, a 2-chloroacetyl group, a stearoyl group, a benzoyl group, a p-n-octyloxyphenylcarbonyl group, a 2-pyridylcarbonyl or a 2-furylcarbonyl group is exemplified. The aryloxycarbonyl group represented by $R^{11}$ is preferably a substituted or unsubstituted aryloxycarbonyl group having from 7 to 30 carbon atoms. For example, a phenoxycarbonyl group, an o-chlorophenoxycarbonyl group, m-nitrophenoxycarbonyl group or a p-tert-butylphenoxycarbonyl group is exemplified. An alkoxycarbonyl group represented by $R^{11}$ is preferably a substituted or unsubstituted alkoxycarbonyl group having from 2 to 30 carbon atoms. For example, a methoxycarbonyl group, an ethoxycarbonyl group, a tert-butoxycarbonyl group or a n-octadecyloxycarbonyl group is exemplified. A carbamoyl group represented by $R^{11}$ is preferably a substituted or unsubstituted carbamoyl group having from 1 to 30 carbon atoms. For example, a carbamoyl group, an N-methylcarbamoyl group, an N,N-dimethylcarbamoyl group, an N,N-di-n-octylcarbamoyl group or an N-(methylsulfonyl)carbamoyl group is exemplified.

Among them, $R^{11}$ is preferably a hydrogen atom or an alkyl group. Of the alkyl groups, a methyl group and an ethyl group are particularly preferred.

The alkyl group and aryl group represented by $R^{12}$, $R^{13}$ or $R^{14}$ are preferably the alkyl group and aryl group described for $R^{11}$, respectively.

The connecting group represented by $L^1$ is preferably a connecting group selected from —CO—, —O—, —HN—, a divalent aliphatic group, a divalent aromatic group and a combination of these groups, and preferably has 30 or less carbon atoms including a number of carbon atom of the substituent which may be present described hereinafter. The connecting group is more preferably an alkylene group (having preferably from 1 to 20 carbon atoms, more preferably from 1 to 10 carbon atoms) or an arylene group (having preferably from 5 to 15 carbon atoms, more preferably from 6 to 10 carbon atoms), for example, a phenylene group or a xylylene group. Specific examples thereof include connecting groups shown below.

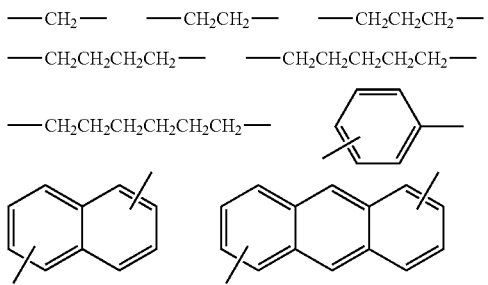

Among them, from the standpoint of stain resistance, $L^1$ is preferably a straight-chain alkylene group having from 2 to 5 carbon atoms, more preferably a straight-chain alkylene group having 2 or 3 carbon atoms, and most preferably a straight-chain alkylene group having 2 carbon atoms.

The connecting group may have a substituent. Examples of the substituent include a halogen atom (e.g., F, Cl, Br or I), a hydroxy group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group and a diarylamino group.

$Y^1$ represents a single bond or a divalent connecting group selected from the group consisting of —CO—, —O—, —HN—, a divalent aliphatic group, a divalent aromatic group and a combination of these groups.

Specific examples of the combination of groups represented by $Y^1$ are set forth below. In each of the specific examples shown below, the left side connects to the main chain.

L1: —CO—O-divalent aliphatic group—
L2: —CO—O-divalent aromatic group—
L3: —CO—NH-divalent aliphatic group—
L4: —CO—NH-divalent aromatic group—

The divalent aliphatic group includes an alkylene group, a substituted alkylene group, an alkenylene group, a substituted alkenylene group, an alkinylene group, a substituted alkinylene group and a polyalkyleneoxy group. Among them, an alkylene group, a substituted alkylene group, an alkenylene group and a substituted alkenylene group are preferred, and an alkylene group and a substituted alkylene group are more preferred.

Of the divalent aliphatic groups, a chain structure is preferable than a cyclic structure, and further a straight-chain structure is more preferable than a chain structure having a branch. A number of carbon atoms included in the divalent aliphatic group is preferably from 1 to 20, more preferably from 1 to 15, still more preferably from 1 to 12, yet still more preferably from 1 to 10, and most preferably from 1 to 8.

Examples of the substituent for the divalent aliphatic group include a halogen atom (e.g., F, Cl, Br or I), a hydroxy group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group and a diarylamino group.

The divalent aromatic group includes an arylene group which may have a substituent. Specifically, a substituted or unsubstituted phenylene group, naphthylene group and anthrylene group are exemplified. Among then, a phenylene group is preferred.

Examples of the substituent for the divalent aromatic group include an alkyl group in addition to the substituents described for the divalent aliphatic group above.

Specific examples of the structure represented by formula (a1-1) include structures shown below.

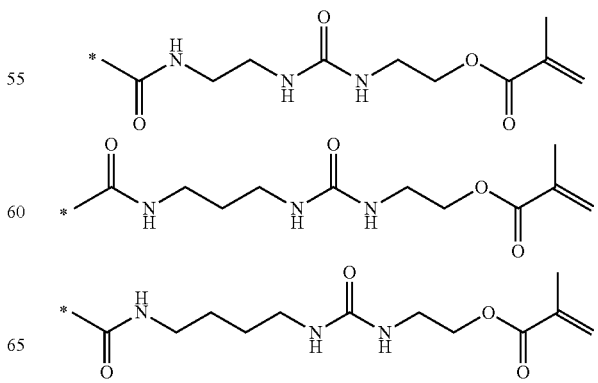

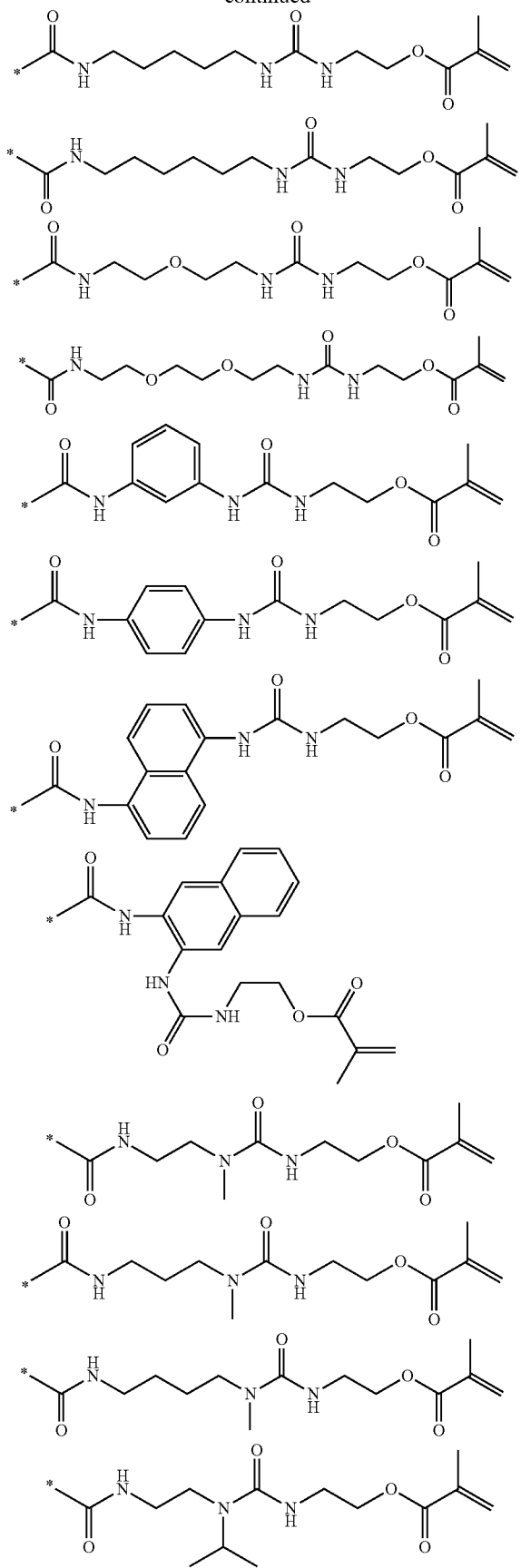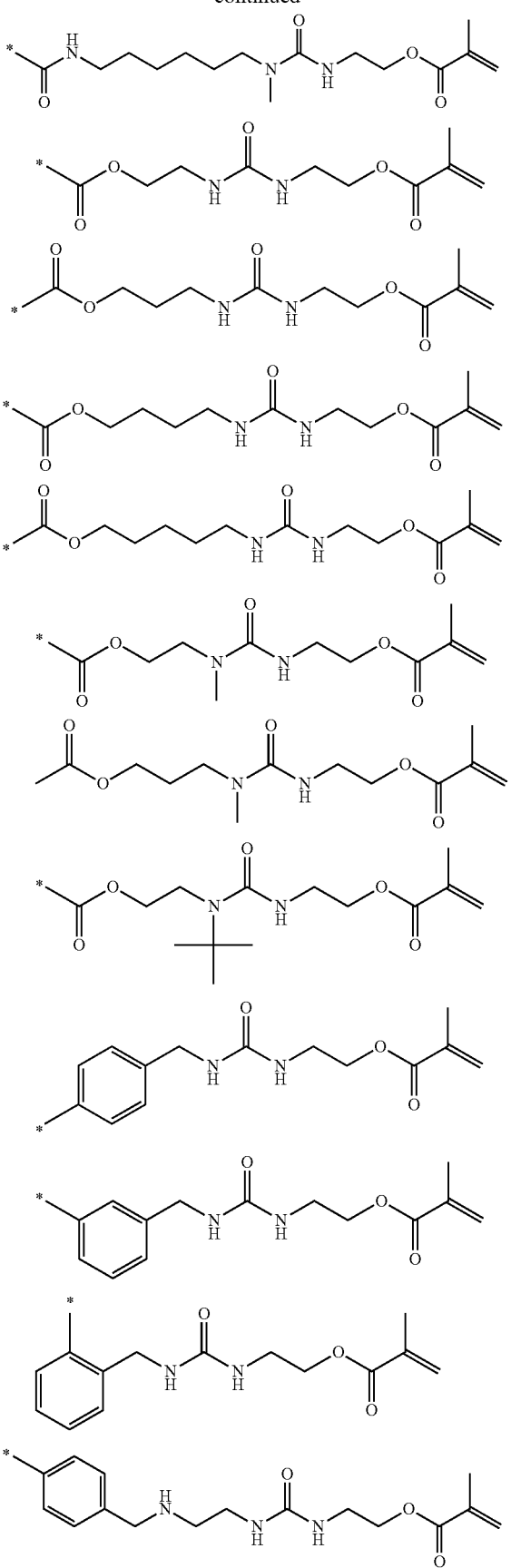

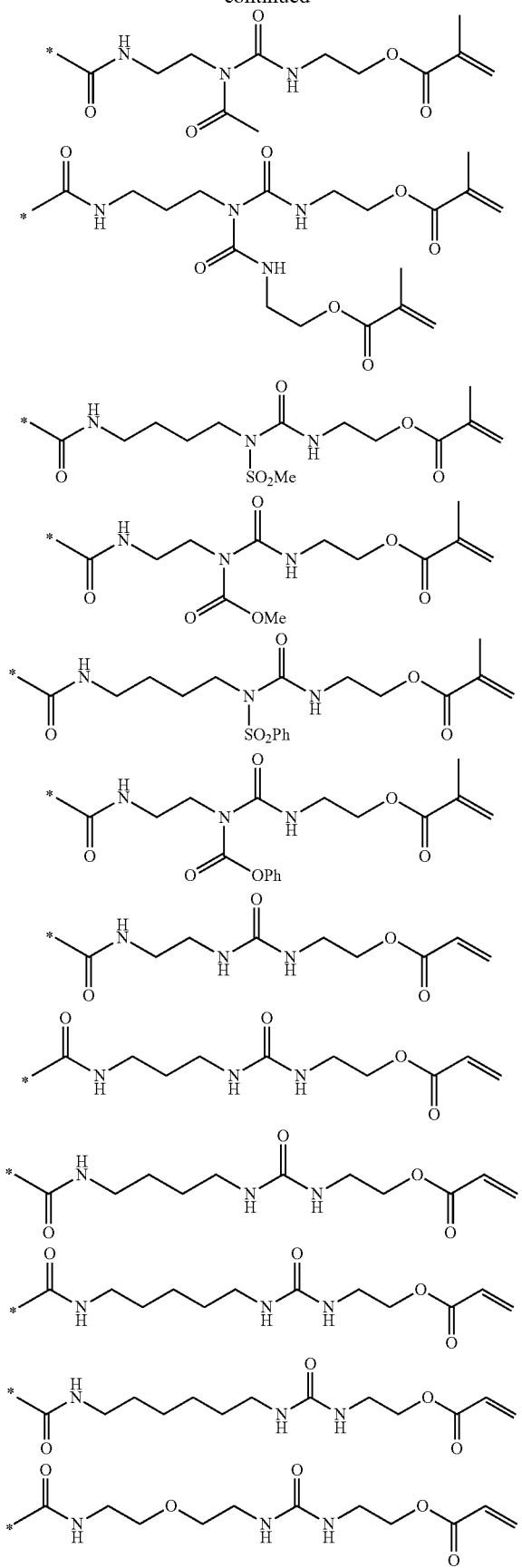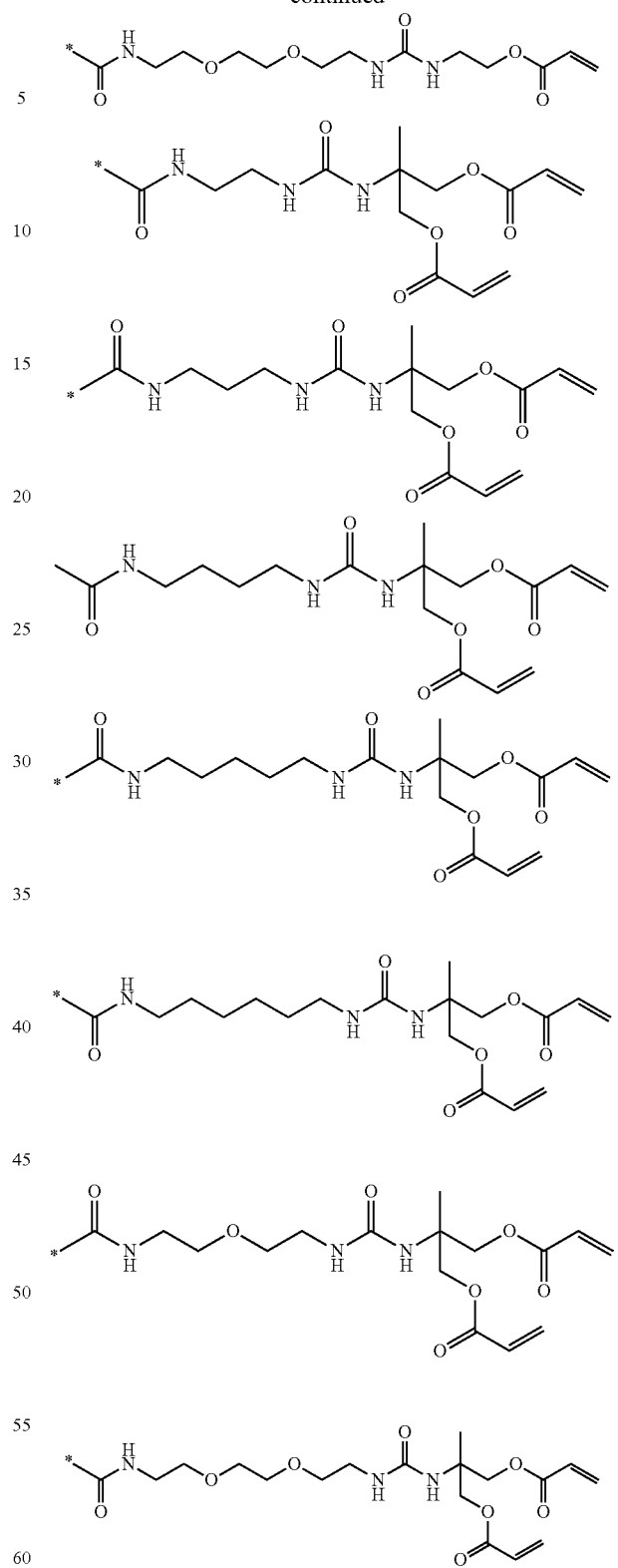
The repeating unit (a1) having a side chain having a structure represented by formula (a1-1) according to the invention, which has at least one radical polymerizable reactive group, is preferably a repeating unit represented by formula (A1) shown below:

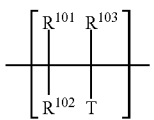
(A1)

In formula (A1), $R^{101}$ to $R^{103}$ each independently represents a hydrogen atom, an alkyl group having from 1 to 6 carbon atoms or a halogen atom, and T represents the structure represented by formula (a1-1) described above. The preferred embodiments are also same as those described in formula (a1-1) above.

In the specific polymer compound, the repeating unit (a1) having a side chain having a structure represented by formula (a1-1) is contained preferably from 1 to 50% by weight, more preferably from 1 to 30% by weight, most preferably from 1 to 20% by weight, per unit mass of the specific polymer compound.

(a2) Repeating Unit Having Side Chain Having Structure Capable of Interacting with Surface of Support The specific polymer compound according to the invention contains a repeating unit (a2) having a side chain having any structure capable of interacting with a surface of support represented by formulae (a2-1), (a2-2), (a2-3), (a2-4), (a2-5) and (a2-6) shown below, in order to enhance adhesion property to the support.

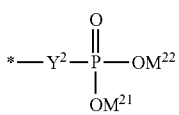
(a2-1)

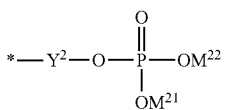
(a2-2)

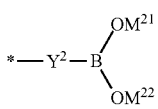
(a2-3)

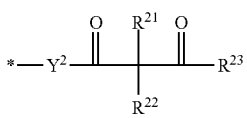
(a2-4)

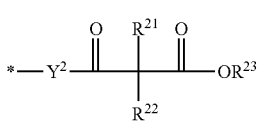
(a2-5)

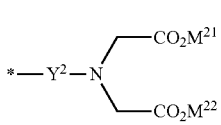
(a2-6)

In the formulae (a2-1) to (a2-6) $M^{21}$ and $M^{22}$ each independently represents a hydrogen atom, a metal atom belonging to alkali metal or alkaline earth metal or an ammonium, $R^{21}$ to $R^{23}$ each independently represents a hydrogen atom or an alkyl group, $Y^2$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

Examples of the alkyl group represented by any one of $R^{21}$ to $R^{23}$ include a methyl group, an ethyl group, a propyl group, an octyl group, an isopropyl group, a tert-butyl group, an isopentyl group, a 2-ethylhexyl group, a 2-methylhexyl group and a cyclopentyl group.

$Y^2$ represents a single bond or a divalent connecting group selected from the group consisting of —CO—, —O—, —HN—, a divalent aliphatic group, a divalent aromatic group and a combination of these groups.

Specific examples of the combination of groups represented by $Y^2$ are set forth below. In each of the specific examples shown below, the left side connects to the main chain.

L1: —CO—O-divalent aliphatic group—
L2: —CO—O-divalent aromatic group—
L3: —CO—NH-divalent aliphatic group—
L4: —CO—NH-divalent aromatic group—

The divalent aliphatic group and divalent aromatic group are same as the divalent aliphatic group and divalent aromatic group for $Y^1$ above, respectively, and examples of the substituent for the divalent aliphatic group and divalent aromatic group are also same as those described for $Y^1$ above.

$Y^2$ is preferably a single bond, —CO—, a divalent aliphatic group, a divalent aromatic group or any one of L1 to L4 described above, more preferably a single bond, a divalent aromatic group or any one of L1 to L4, and most preferably a single bond, L1 or L2.

From the standpoint of stain resistance and printing durability, the structure capable of interacting with the surface of support is preferably the structure represented by formula (a2-1), (a2-2) or (a2-6), more preferably the structure represented by formula (a2-1) or (a2-2), and most preferably the structure represented by formula (a2-2). In formula (a2-1) or (a2-2), both $M^{21}$ and $M^{22}$ are preferably hydrogen atoms, sodium atoms or kalium atoms, and are most preferably sodium atoms.

Specifically, structures shown below are exemplified.

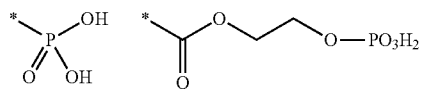

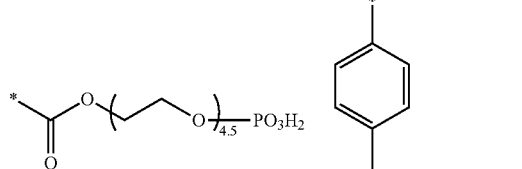

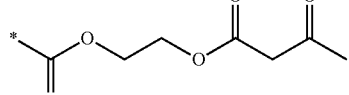

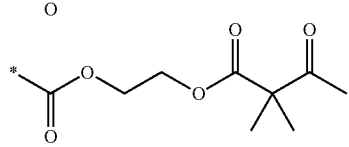

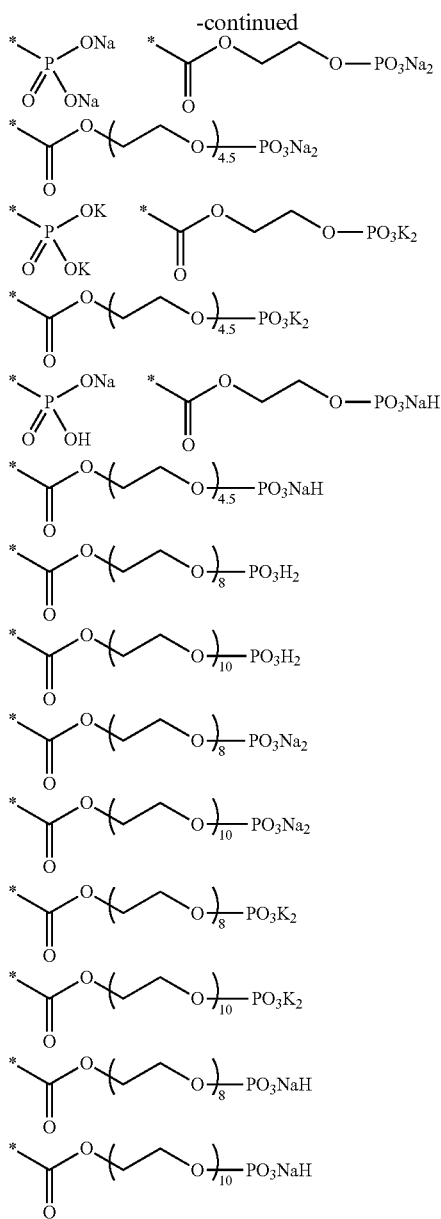

The repeating unit (a2) having at least one structure capable of interacting with the surface of support is preferably a repeating unit represented by formula (A2) shown below.

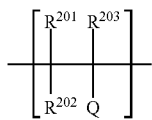
(A2)

In formula (A2), $R^{201}$ to $R^{203}$ each independently represents a hydrogen atom, an alkyl group having from 1 to 6 carbon atoms or a halogen atom, and Q represents the structure capable of interacting with the surface of support selected from the structure represented by formulae (a2-1) to (a2-6) described above. The preferred embodiments are also same as those described in formula (a2-1) to (a2-6) above.

The content of the repeating unit (a2) having at least one functional group capable of interacting with the surface of support in the specific polymer compound according to the invention is preferably in a range from 2 to 95% by weight, more preferably in a range from 3 to 50% by weight, most preferably in a range from 5 to 25% by weight, based on the total repeating unit of the specific polymer compound, from the standpoint of stain resistance and printing durability.

(a3) Repeating Unit Having Side Chain Having Twitter Ion Structure

The specific polymer compound according to the invention preferably contains a repeating, unit having a side chain having a zwitter ion structure in order to make the surface of support in the non-image area high hydrophilicity. The side chain having a zwitter ion structure is preferably represented by formula (a3-1) or (a3-2) shown below:

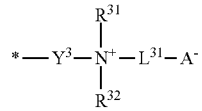
(a3-1)

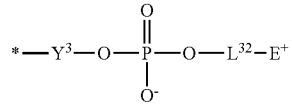
(a3-2)

In formula (a3-1), $R^{31}$ and $R^{32}$ each independently represents a hydrogen atom, an alkyl group, an alkenyl group, an alkynyl group, an aryl group or a heterocyclic group, or $R^{31}$ and $R^{32}$ may be combined with each other to from a ring structure, $L^{31}$ represents a connecting group, $A^-$ represents a structure having an anion, $Y^3$ represents a divalent connecting group connecting to a main chain of the polymer compound, and * indicates a site connecting to a main chain of the polymer compound.

The ring structure formed by combining $R^{31}$ and $R^{32}$ with each other may contain, a hetero atom, for example, an oxygen atom and is preferably a 5-membered to 10-membered ring, and more preferably a 5-membered or 6-membered ring.

A number of carbon atoms of each of $R^{31}$ and $R^{32}$ including a number of carbon atoms of a substituent which may be present described hereinafter is preferably from 1 to 30, more preferably from 1 to 20, particularly preferably from 1 to 15, and most preferably from 1 to 8.

Examples of the alkyl group represented by each of $R^{31}$ and $R^{32}$ include a methyl group, an ethyl group, a propyl group, an octyl group, an isopropyl group, a tert-butyl group, an isopentyl group, a 2-ethylhexyl group, a 2-methylhexyl group and a cyclopentyl group.

Examples of the alkenyl group represented by each of $R^{31}$ and $R^{32}$ include a vinyl group, an allyl group, a prenyl group (for example, a dimethylallyl group or a geranyl group) and an oleyl group.

Examples of the alkynyl group represented by each of $R^{31}$ and $R^{32}$ include an ethynyl group, a propargyl group and a trimethylsilylethynyl group.

Examples of the aryl group represented by each of $R^{31}$ and $R^{32}$ include a phenyl group, a 1-naphtyl group and a 2-naphthyl group. Examples of the heterocyclic group include a furanyl group, a thiophenyl group and a pyridinyl group.

These groups may have a substituent. Examples of the substituent include a halogen atom (e.g., F, Cl, Br or I), a hydroxy group, a carboxyl group, an amino group, a cyano group, an aryl group, an alkoxy group, an aryloxy group, an acyl group, an alkoxycarbonyl group, an aryloxycarbonyl group, an acyloxy group, a monoalkylamino group, a dialkylamino group, a monoarylamino group and a diarylamino group.

$R^{31}$ and $R^{32}$ each particularly preferably represents a hydrogen atom, a methyl group or an ethyl group in view of the effect and ready availability, and each most preferably represents a methyl group or an ethyl group.

The divalent connecting group represented by Y3 includes a single bond or a divalent connecting group selected from the group consisting of —CO—, —O—, —NH—, a divalent aliphatic group, a divalent aromatic group and a combination thereof.

Specific examples of the combination of groups represented by $Y^3$ are set forth below. In each of the specific examples shown below, the left side connects to the main chain.

L1: —CO—O-divalent aliphatic group—
L2: —CO—O-divalent aromatic group—
L3: —CO—NH-divalent aliphatic group—
L4: —CO—NH-divalent aromatic group—
L5: —CO-divalent aliphatic group—
L6: —CO-divalent aromatic group—
L7: —CO-divalent aliphatic group-CO—O-divalent aliphatic group—
L8: —CO-divalent aliphatic group-O—CO-divalent aliphatic group—
L9: —CO-divalent aromatic group-CO—O-divalent aliphatic group—
L10: —CO-divalent aromatic group-O—CO-divalent aliphatic group—
L11: —CO-divalent aliphatic gr up-CO—O-divalent aromatic group—
L12: —CO-divalent aliphatic group-O—CO-divalent aromatic group—
L13: —CO-divalent aromatic group-CO—O-divalent aromatic group—
L14: —CO-divalent aromatic group-O—CO-divalent aromatic group—
L15: —CO—O-divalent aromatic group-O—CO—NH-divalent aliphatic group—
L16: —CO—O-divalent aliphatic group-O—CO—NH-divalent aliphatic group—

The divalent aliphatic group and divalent aromatic group described above are same as the divalent aliphatic group and divalent aromatic group described for $Y^1$ hereinbefore. Examples of the substituent for the divalent aliphatic group and divalent aromatic group are also same as those described for $Y^1$.

$Y^3$ is preferably a single bond, —CO—, a divalent aliphatic group, a divalent aromatic group or any one of L1 to L4 described above. Further, from the standpoint of stain resistance, $Y^3$ is preferably L1 or L3, and more preferably L3. Moreover, the divalent aliphatic group in L3 is preferably a straight-chain alkylene group having from 2 to 4 carbon atoms, and in view of synthesis, it is most preferably a straight-chain alkylene group having 3 carbon atoms.

$L^{31}$ has the same meaning as $L^1$. From the standpoint of stain resistance, $L^{31}$ is preferably a straight-chain alkylene group having from 3 to 5 carbon atoms, more preferably as straight-chain alkylene group having 4 or 5 carbon atoms, and most preferably a straight-chain alkylene group having 4 carbon atoms.

In formula (a3-1), $A^-$ preferably represents a carboxylate, a sulfonate, a phosphonate or a phosphinate.

Specifically, anions shown below are exemplified.

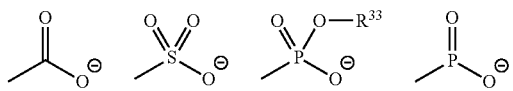

In the above formula, $R^{33}$ has the same meaning as the above-recited $R^{31}$ and $R^{32}$.

From the standpoint of stain resistance, $A^-$ is most preferably a sulfonate. Further, in formula (a3-1), a combination where $L^{31}$ is a straight-chain alkylene group having 4 to 5 carbon atoms and $A^-$ is a sulfonate is preferred, and a combination where $L^{31}$ is a straight-chain alkylene group having 4 carbon atoms and $A^-$ is a sulfonate is most preferred.

A combination where $Y^3$ is L1 or L3. $R^{31}$ and $R^{32}$ each represents an ethyl group or a methyl group, $L^{31}$ is a straight-chain alkylene group having 4 to 5 carbon atoms and $A^-$ is as sulfonate is preferred.

Further, a combination where $Y^3$ is L3, $R^{31}$ and $R^{32}$ represents a methyl group, $L^{31}$ is a straight-chain alkylene group having 4 carbon atoms and $A^-$ is a sulfonate is more preferred.

Specifically, structural formulae shown below are preferred.

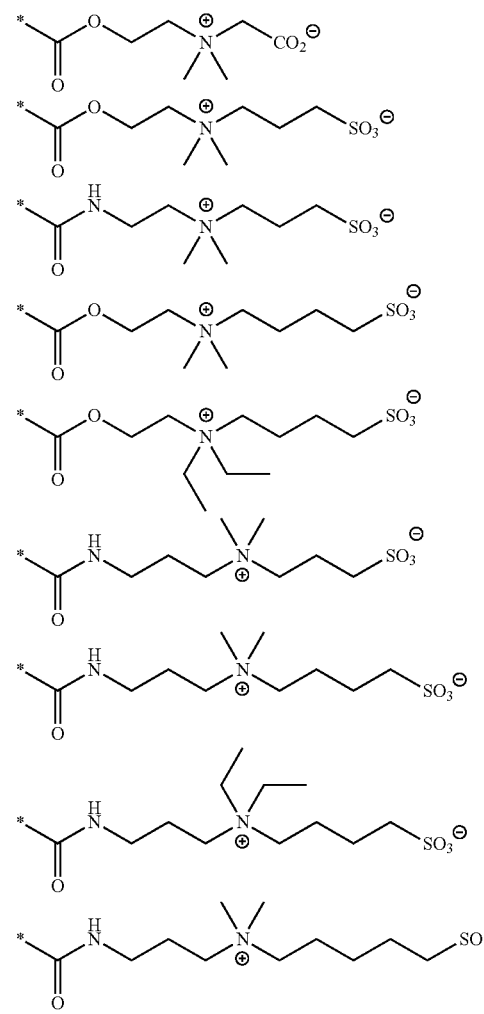

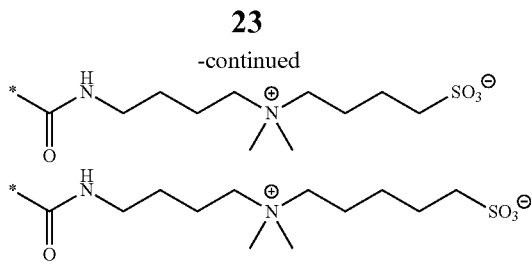

In formula (a3-2), $L^{32}$ represents a connecting group and is preferably selected from the group consisting of —CO—, —O—, —NH—, a divalent aliphatic group, a divalent aromatic group and a combination thereof. Specific examples and preferred examples thereof are same as those described for the connecting, group represented by $L^{31}$ above.

$Y^3$ has the same meaning as $Y^3$ in formula (a3-1) and preferred examples thereof are also same as those described for $Y^3$.

$E^+$ represents a structure having a cation. $E^+$ preferably represents a structure having an ammonium, a phosphonium, an iodonium or a sulfonium, more preferably a structure having an ammonium or a phosphonium, and particularly preferably a structure having an ammonium. Examples of the structure having a cation include a trimethylammonio group, a triethylammonio group, a tributylammonio group, a benzyldimethylammonio group, a diethylhexylammonio group, a (2-hydroxyethyl)dimethylammonio group, a pyridinio group, an N-methylimidazolio group, an N-acridinio group, a trimethylphosphonio group, a triethylphosphouio group and a triphenylphosphonio group.

A most preferred combination of $L^{32}$, $Y^3$ and $E^+$ is a combination where $L^{32}$ is an alkylene group having from 2 to 4 carbon atoms, $Y^3$ is L1 or L3 and $E^+$ is a trimethylammonio group or a triethylammonio group.

Specifically, structures shown below are exemplified.

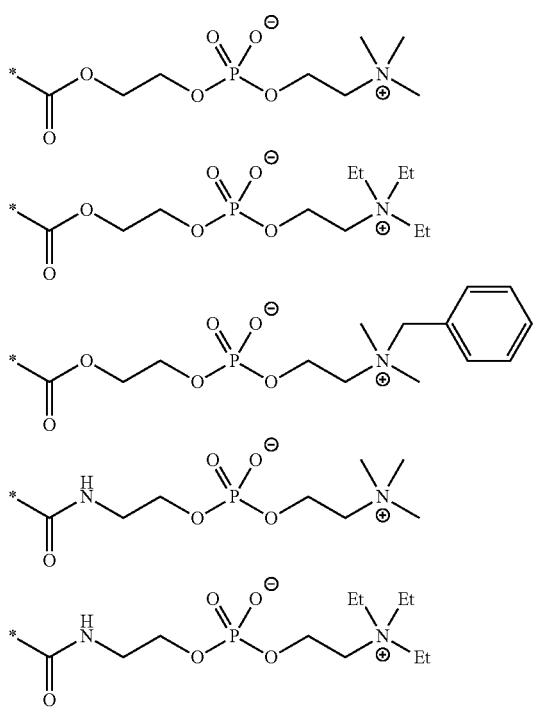

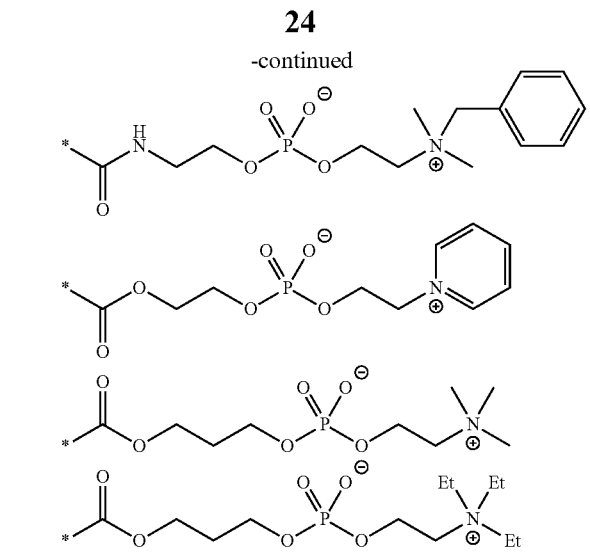

In the invention, specifically, the repeating unit having a zwitter ion structure is preferably represented by formula (A3) shown below.

In formula (A3), $R^{301}$ to $R^{303}$ each independently represents a hydrogen atom, an alkyl group having from 1 to 6 carbon atoms or a halogen atom. G represents a side chain having a zwitter ion structure and is preferably a structure represented by formula (a3-1) or (a3-2) described above. Preferred examples and combinations with respect to formulae (a3-1) and (a3-2) are same as those described above.

In formula (A3), a particularly preferable side chain for G is a structure represented by formula (a3-1).

The content of the repeating unit (a3) having a zwitter ion structure in the specific polymer compound according to the invention is preferably in a range from 5 to 95% by weight, more preferably in a range from 5 to 80% by weight still more preferably in a range from 10 to 60% by weight, most preferably in a range from 15 to 45% by weight, based on the total repeating unit of the specific polymer compound, from the standpoint of stain resistance.

(a4) Repeating Unit Having Polyoxyalkylene Structure

The specific polymer compound according to the invention preferably further has (a4) repeating unit having a side chain having a polyoxyalkylene structure. The polyoxyalkylene structure is preferably a polyoxyalkylene structure represented by formula (a4-1) shown below.

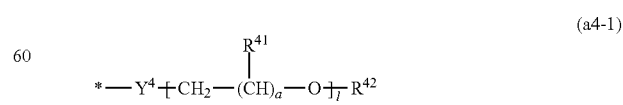

In formula (a4-1), $R^{41}$ represents a hydrogen atom or an alkyl group, $R^{42}$ represents a hydrogen atom, an alkyl group or an aryl group, a represents an integer from 1 to 5, 1 represents an integer from 2 to 150. $Y^4$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

In formula (a4-1), examples of the alkyl group represented by $R^{41}$ or $R^{42}$ include a methyl group, an ethyl group, a propyl group, an octyl group, an isopropyl group, a tert-butyl group, an isopentyl group, a 2-ethylhexyl group, a 2-methylhexyl group and a cyclopentyl group. Examples of the aryl group represented by $R^{42}$ include a phenyl group, a 1-naphtyl group and a 2-naphthyl group.

$R^{41}$ is most preferably a hydrogen atom. $R^{42}$ is preferably a hydrogen atom or a methyl group, and more preferably a methyl group.

a is preferably 1 or 2, and most preferably 1, from the standpoint of stain resistance. l represents an integer from 2 to 150, and is preferably from 9 to 150, more preferably from 9 to 100, still more preferably from 20 to 100, particularly preferably from 50 to 100, from the standpoint of stain resistance.

$Y^4$ represents a single bond or a divalent connecting group selected from the group consisting of —CO—, —O—, —HN—, a divalent aliphatic group, a divalent aromatic group and a combination of these groups. The divalent aliphatic group and divalent aromatic group are same as those described for $Y^1$ above.

$Y^4$ is most preferably a connecting group represented by L17 shown below.

L17: —CO—O—

In L17, the left side connects to the main chain.

A most preferred combination of $Y^4$, $R^{41}$ and $R^{42}$ is a combination where $Y^4$ is L17, $R^{41}$ is a hydrogen atom and $R^{42}$ is a methyl group.

The polyoxyalkylene structure includes specific examples shown below.

In the specific examples, an n value including a decimal indicates an average value of repeating unit number in a mixture of compounds having different oxyalkylene repeating unit numbers.

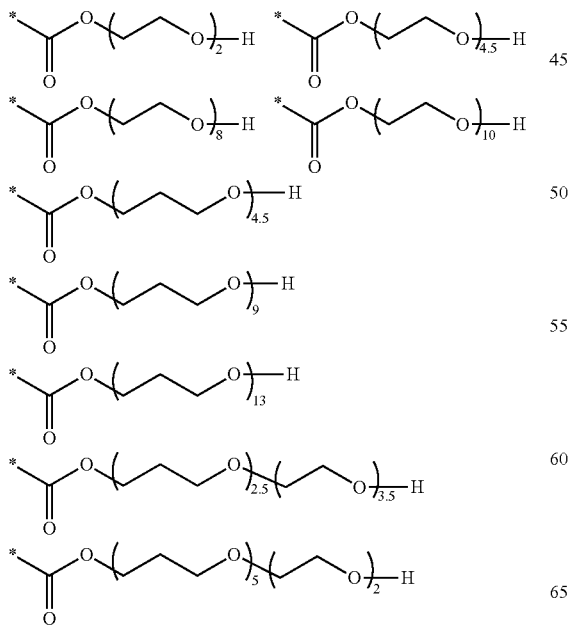

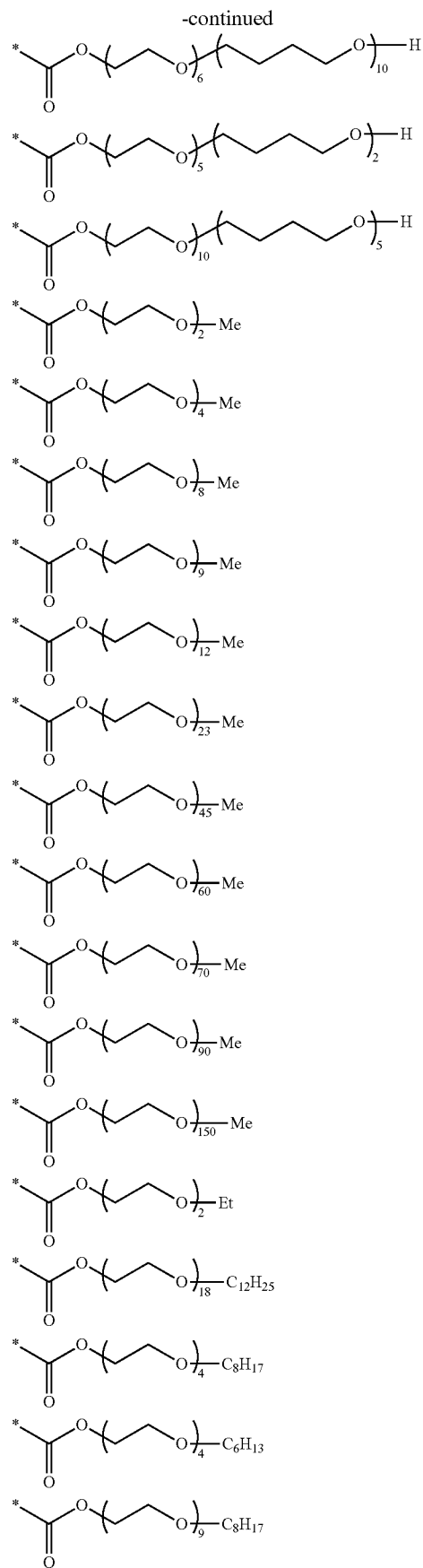

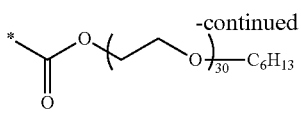

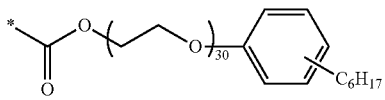

In the invention, specifically, the repeating unit having polyoxyalkylene structure is preferably represented by formula (A4) shown below.

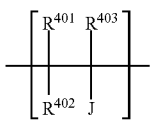

In formula (A4), $R^{401}$ to $R^{403}$ each independently represents a hydrogen atom, an alkyl group having from 1 to 6 carbon atoms or a halogen atom. J represents a polyoxyalkylene structure represented by formula (a4-1) described above, and preferred embodiments are also same as those described for formula (a4-1).

The content of the repeating unit (a4) having a polyoxyalkylene structure in the specific polymer compound according to the invention is preferably in a range from 5 to 95% by weight, more preferably in a range from 20 to 80% by weight, most preferably in a range from 20 to 49% by weight, based on the total repeating unit of the specific polymer compound, from the standpoint of on-press development property and stain resistance.

Although the specific polymer compound according to the invention is able to be synthesized by any hitherto known method, a radical polymerization method and a subsequent urearization reaction of an amino group in a side chain of polymer with an isocyanate having a radical polymerization reactive group is preferably used for the synthesis thereof. In case the urearization reaction of an amino group in a side chain of polymer with an isocyanate having a radical polymerization reactive group is utilized, it is preferable that as many amino groups as possible disappear by the reaction from the standpoint of stain resistance. As amine number remaining at the side chains of the polymers, 0.2 mmol/g or less is preferable, 0.10 mmol/g or less is more preferable and 0.05 mmol/g or less is further more preferable.

Ordinary radical polymerization methods are described, for example, in *Shin Kobunshi Jikkengaku* 3, (*New Polymer Experimentation* 3, edited by The Society of Polymer Science, Japan, published on Mar. 28, 1996 (Kyoritsu Shuppan Co., Ltd.), *Kobunshi no Gosei to Hanno* 1 (*Synthesis and Reaction of Polymer* 1), edited by The Society of Polymer Science, Japan, published in May, 1992 Kyoritsu Shuppan Co., Ltd.), *Shin Jikken Kagaku Koza* 19, *Kobunshi Kagaku* (*I*), (*New Experimental Chemistry Course* 19, *Polymer Chemistry* (*I*)), edited by The Chemical Society of Japan, published on Nov. 20, 1980 (Manizen Co., Ltd.) and *Busshitsu Kogaku Koza, Kobunshi Gosei Kagaku,* (*Material Engineering Course, Polymer Synthesis Chemistry*), published in September, 1995 (Tokyo Denki University Press) and these methods can be applied.

Further, the specific polymer compound (D) may be a copolymer containing other repeating unit in addition to the repeating units described above. A monomer capable of using copolymerization of the specific polymer compound includes a monomer selected, for example, from acrylic acid esters, methacrylic acid esters, acrylamides, methacrylamides, styrenes, acrylonitrile and methacrylonitrile.

Specifically, as the acrylic acid ester, an alkyl acrylate (preferably having from 1 to 20 carbon atoms in the alkyl group thereof), for example, methyl acrylate, ethyl acrylate, propyl acrylate, butyl acrylate, amyl acrylate, ethylhexyl acrylate, octyl acrylate, tert-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate or tetrahydrofurfuryl acrylate) and an aryl acrylate (for example, phenyl acrylate) are exemplified.

As the methacrylic acid ester, an alkyl methacrylate (preferably having from 1 to 20 carbon atoms in the alkyl group thereof), for example, methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate or tetrahydrofurfuryl methacrylate) and an aryl methacrylate (for example, phenyl methacrylate, cresyl methacrylate or naphthyl methacrylate) are exemplified.

As the styrene, styrene, an alkylstyrene (for example, methylstyrene, dimethylstyrene, trimethylstyrene, ethyl styrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylsryrene or acetoxymethylstyrene), an alkoxystyrene (for example, methoxystyrene, 4-methoxy-3-methylstyrene or dimethoxystyrene), or a halogen-containing styrene (for example, chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene or 4-fluoro-3-trifluoromethylstyrene) are exemplified.

As other specific examples, for example, acrylonitrile, methactylonitrile, methacrylic acid, acrylic acid and 2-acrylamido-2-methylpropanesulfonic acid are exemplified.

A weight average molecular weight (Mw) of the specific polymer compound according to the invention can be appropriately set according to performance design of the lithographic printing plate precursor. The weight average molecular weight is preferably from 2,000 to 1,000,000, more preferably from 2,000 to 500,000, and most preferably from 10,000 to 500,000. In the range described above, sufficient printing durability and stain resistance are achieved.

Specific examples of the specific polymer compound are set forth below together with the weight average molecular weight thereof, but the invention should not be construed as being limited thereto. The composition ratio in the polymer compound is indicated by a weight percentage.

(1)
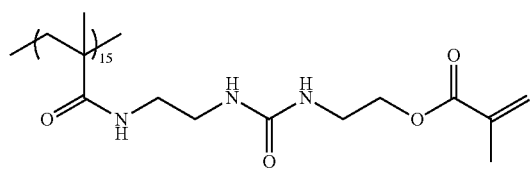
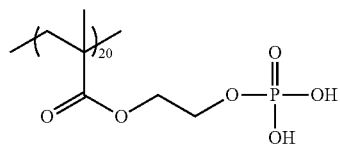
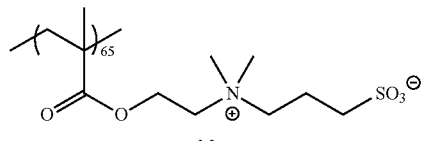
Mw: 150,000
(2)
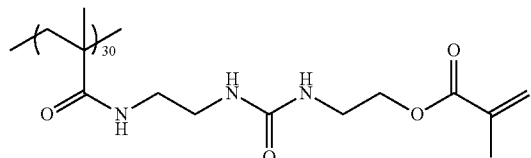
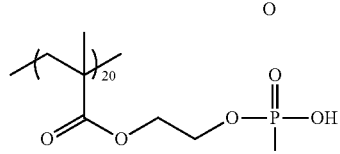
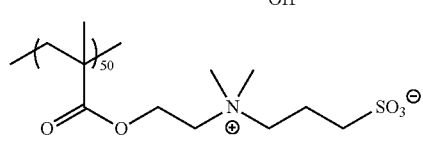
Mw: 100,000
(3)
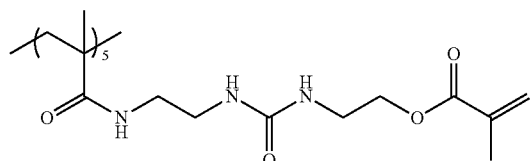
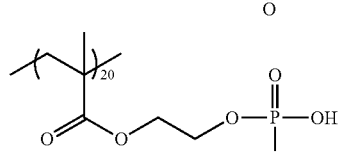
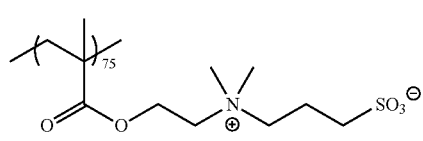
Mw: 250,000
-continued
(4)
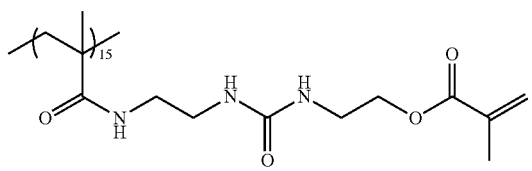
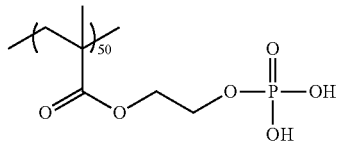
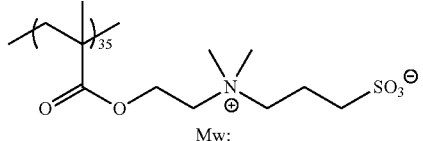
Mw: 120,000
(5)
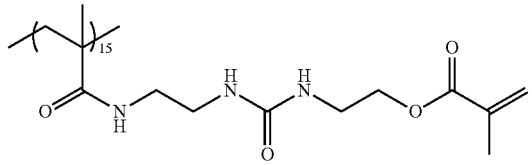
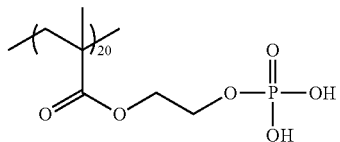
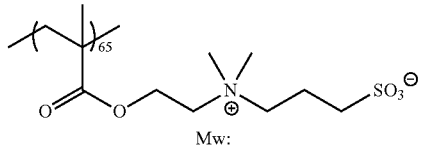
Mw: 5,000
(6)
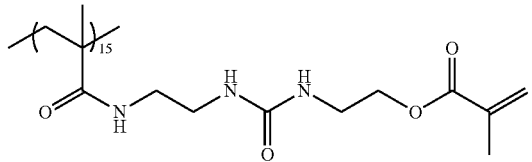
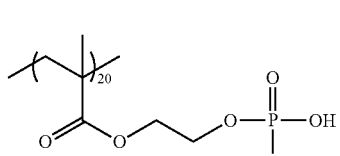
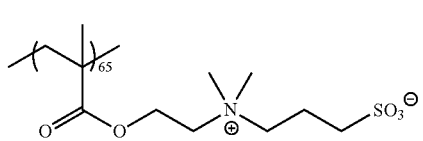
Mw: 10,000

(7)
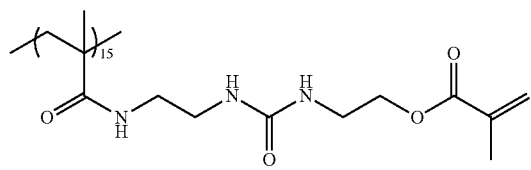
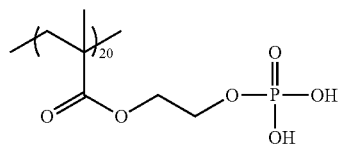
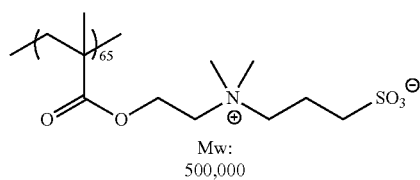
Mw: 500,000
(8)
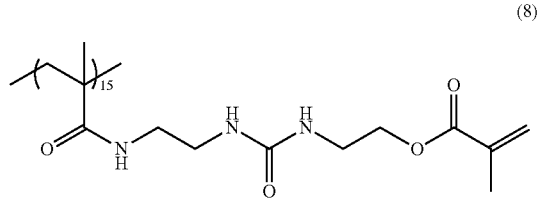
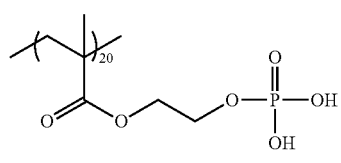
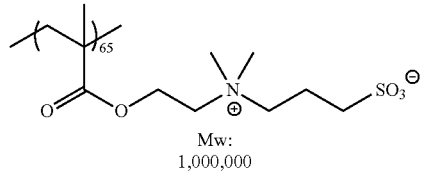
Mw: 1,000,000
(9)
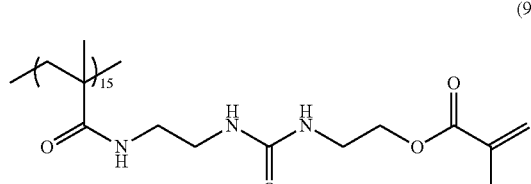
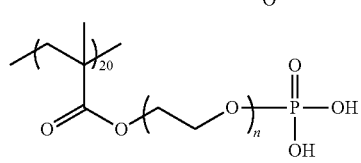
n (repeating unit number) = 4.5
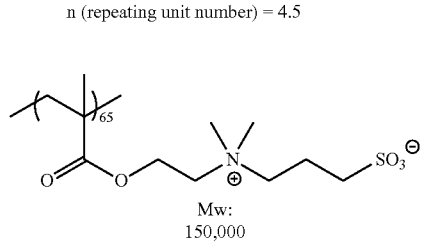
Mw: 150,000
(10)
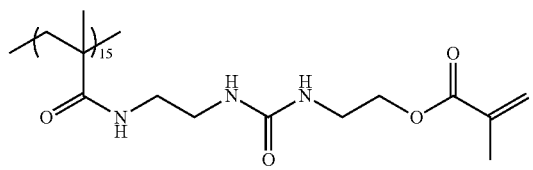
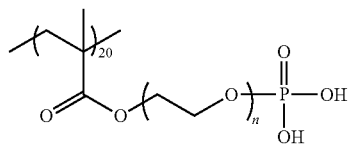
n (repeating unit number) = 8
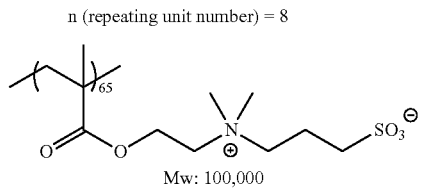
Mw: 100,000
(11)
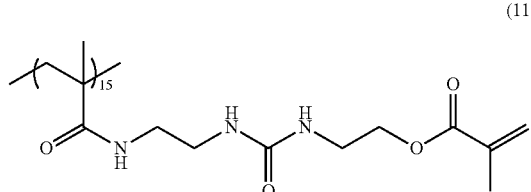
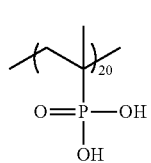
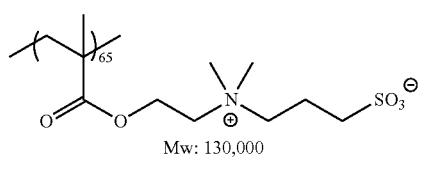
Mw: 130,000
(12)
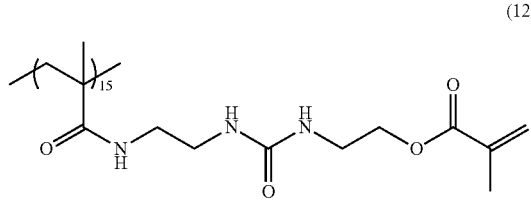
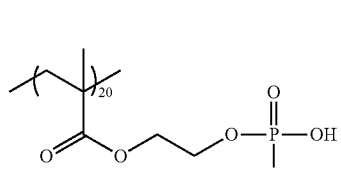
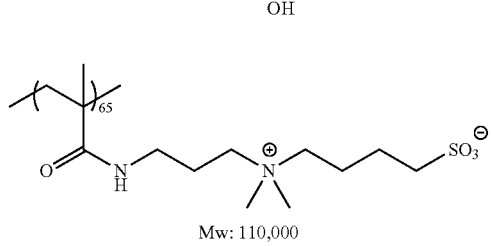
Mw: 110,000

-continued
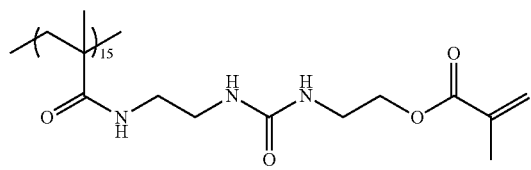
(13)
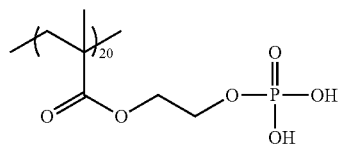
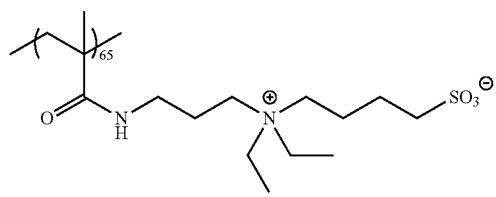
Mw: 140,000
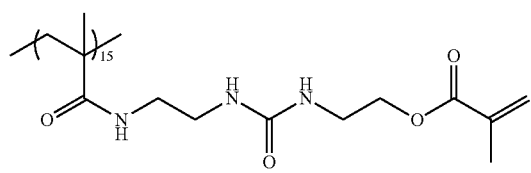
(14)
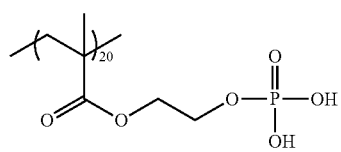
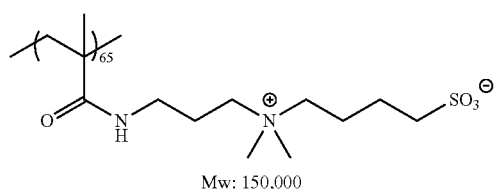
Mw: 150,000
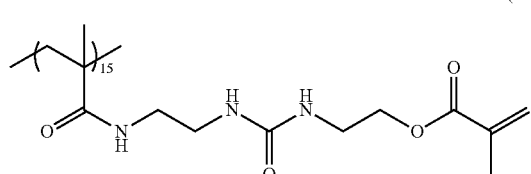
(15)
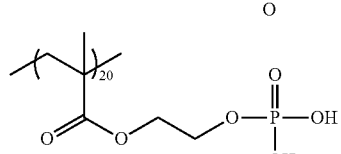
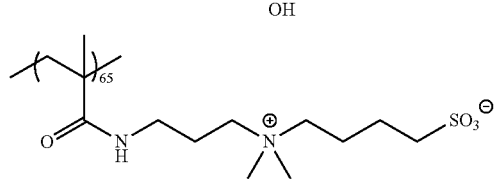
Mw: 120,000
-continued
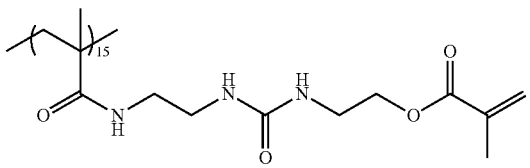
(16)
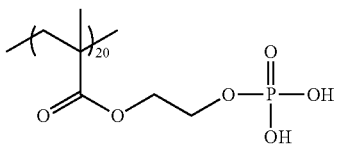
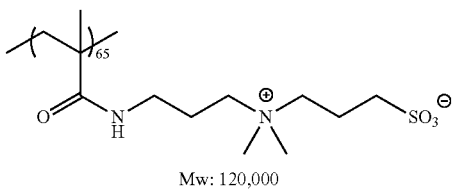
Mw: 120,000
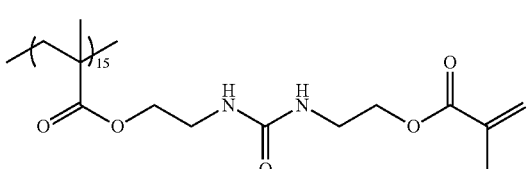
(17)
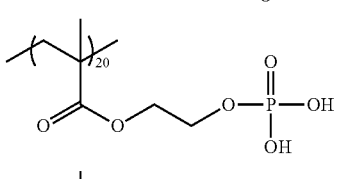
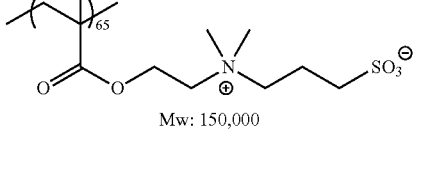
Mw: 150,000
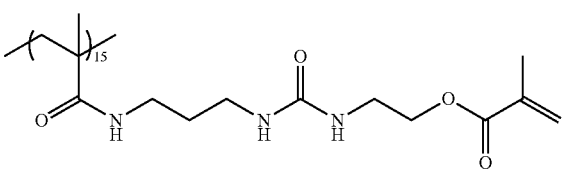
(18)
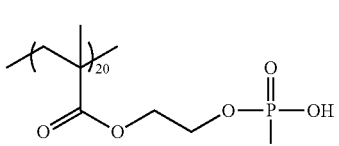
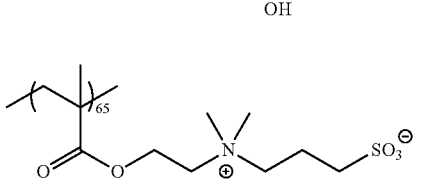
Mw: 160,000

-continued

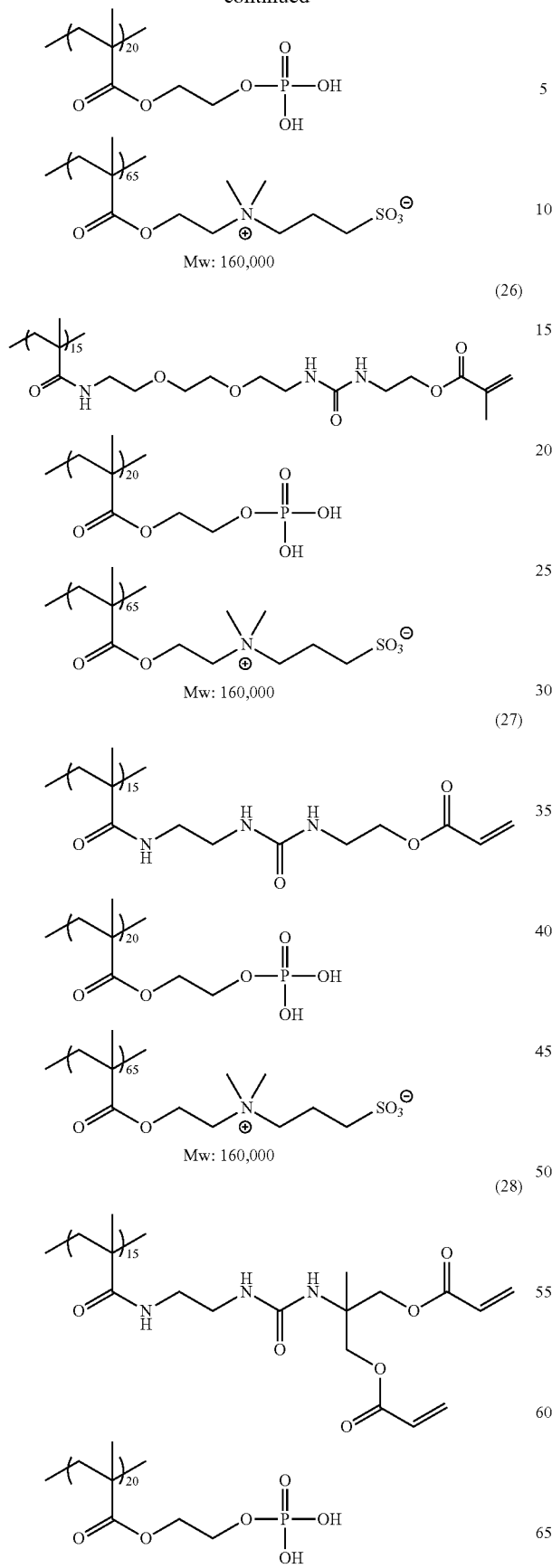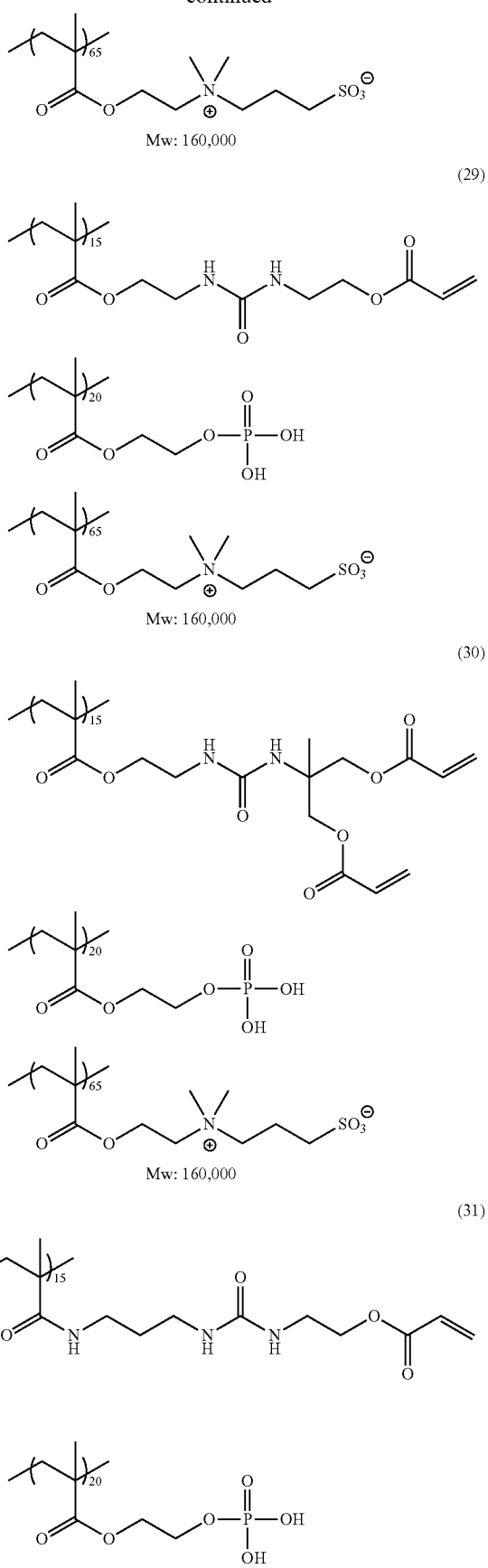

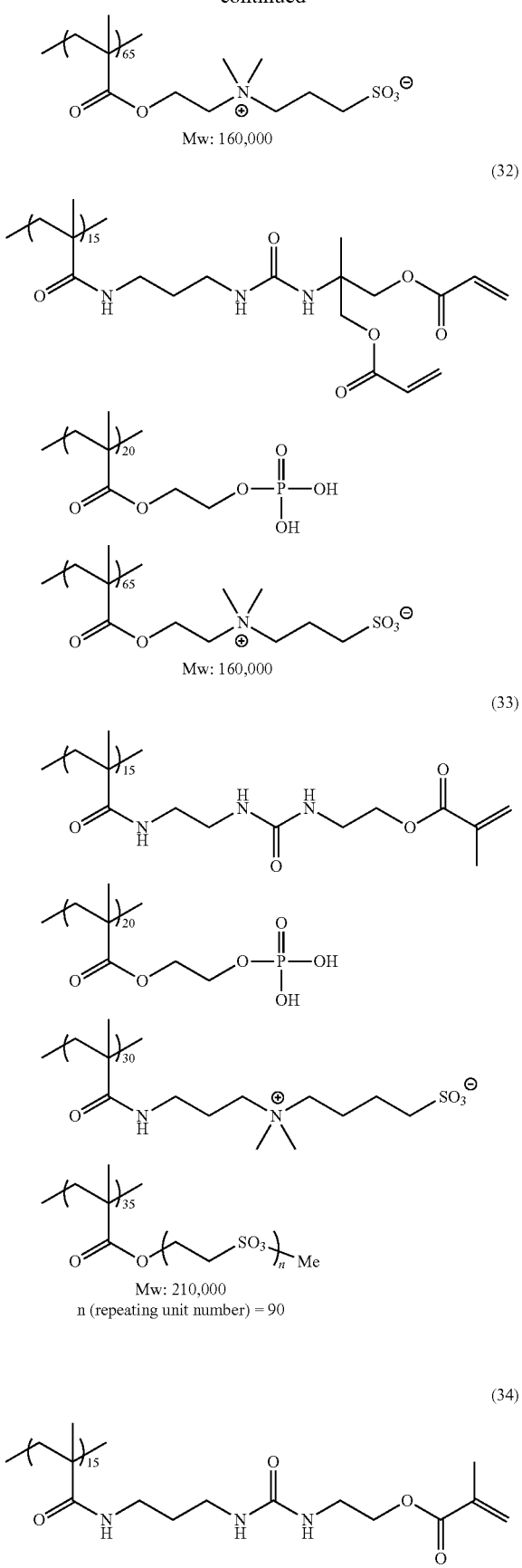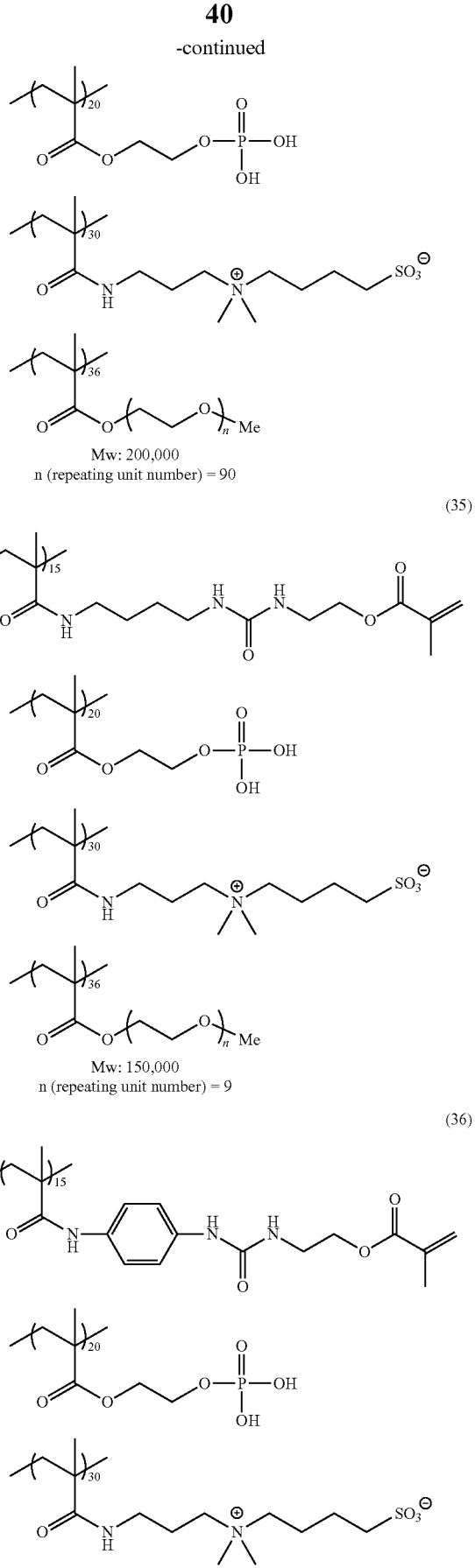

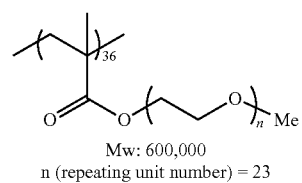
Mw: 600,000
n (repeating unit number) = 23
(37)
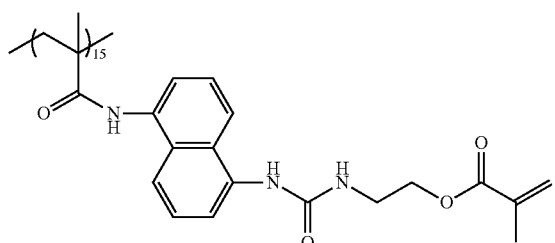
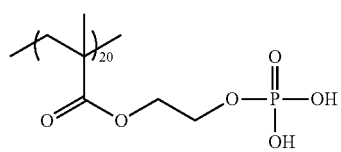
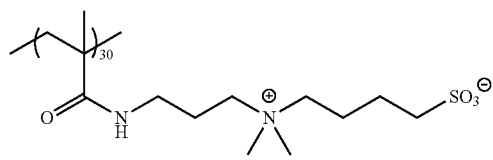
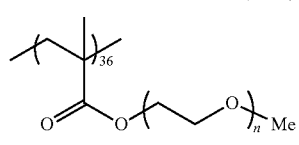
Mw: 310,000
n (repeating unit number) = 90
(38)
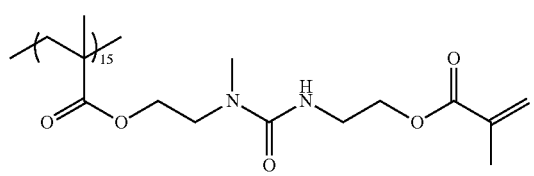
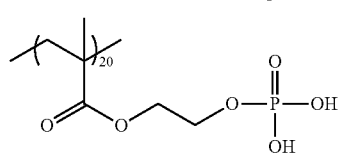
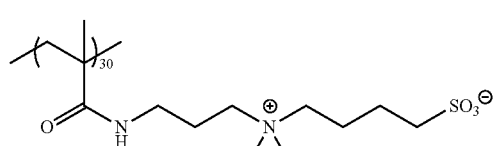
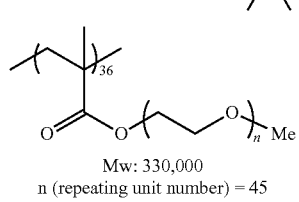
Mw: 330,000
n (repeating unit number) = 45
(39)
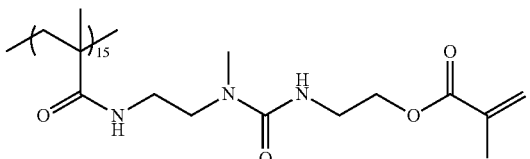
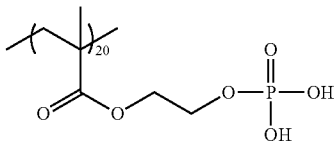
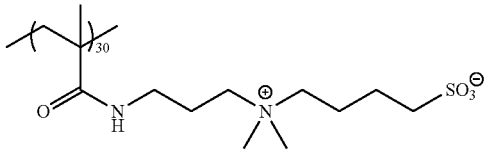
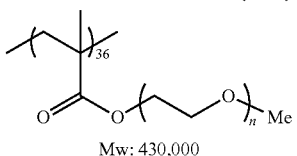
Mw: 430,000
n (repeating unit number) = 45
(40)
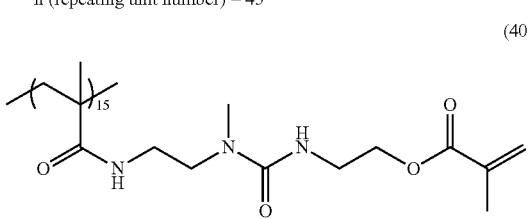
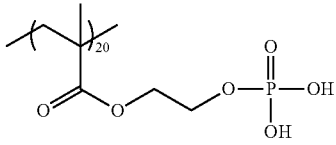
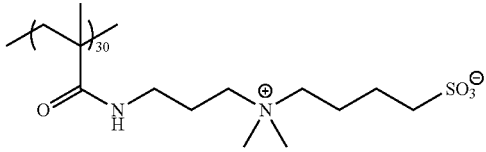
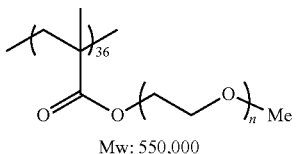
Mw: 550,000
n (repeating unit number) = 90
(41)
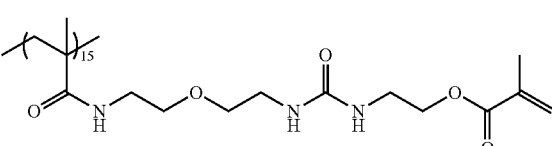
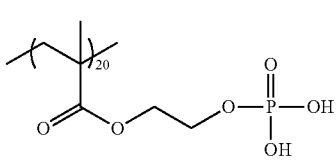

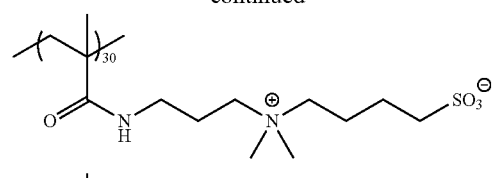
Mw: 210,000
n (repeating unit number) = 90
(42)
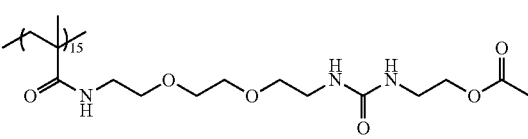
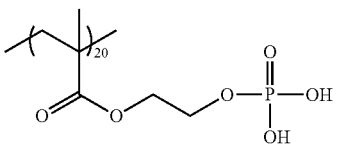
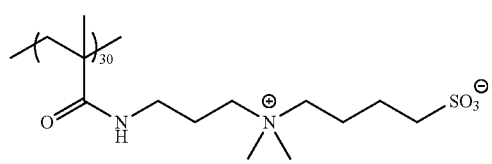
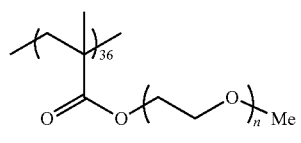
Mw: 310,000
n (repeating unit number) = 23
(43)
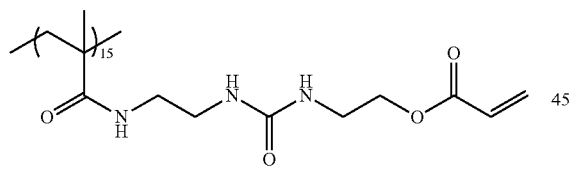
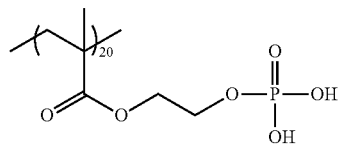
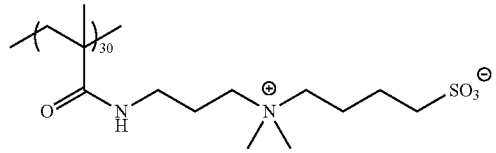
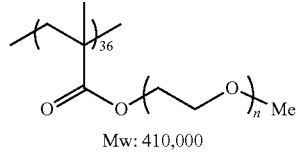
Mw: 410,000
N (repeating unit number) = 90
(44)
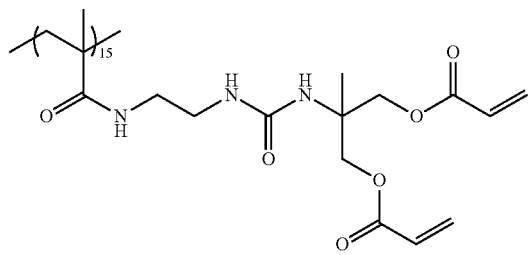
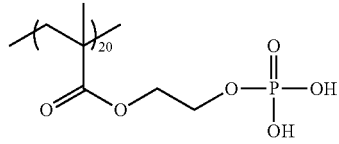
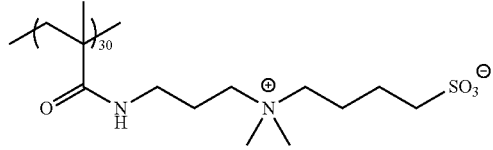
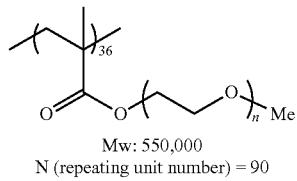
Mw: 550,000
N (repeating unit number) = 90
(45)
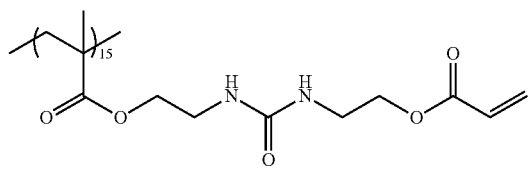
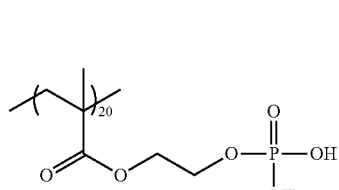
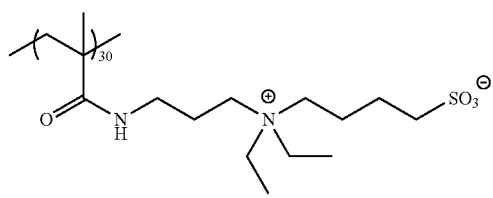
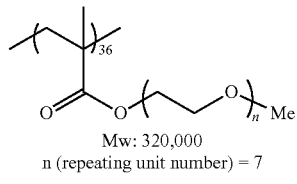
Mw: 320,000
n (repeating unit number) = 7

(46)
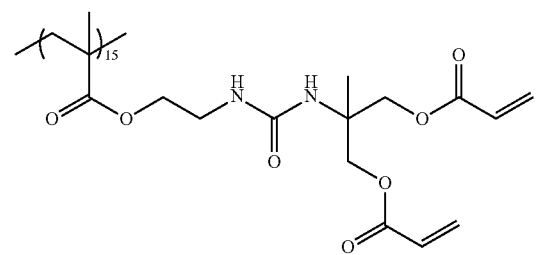
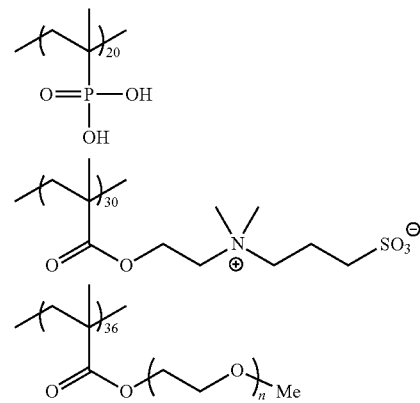
Mw:430,000
n (repeating unit number) = 9
(47)
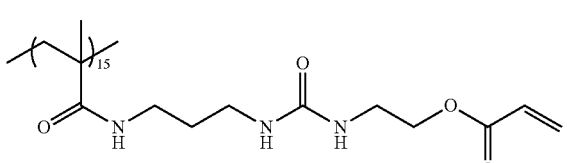
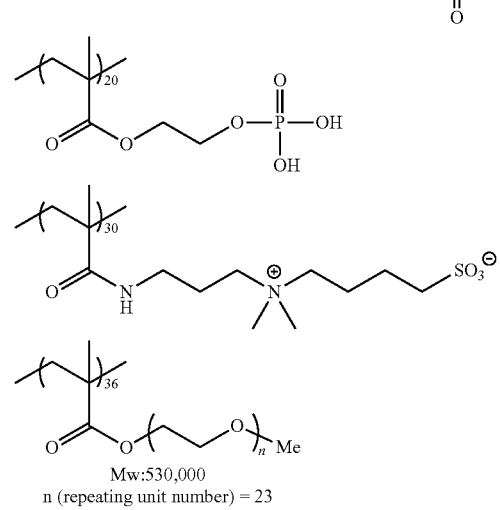
Mw:530,000
n (repeating unit number) = 23
(48)
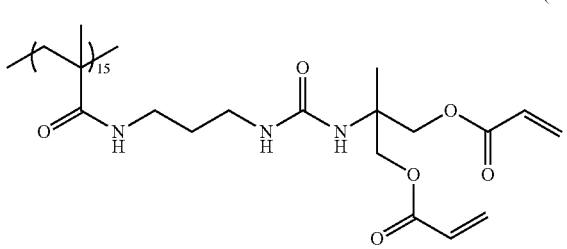
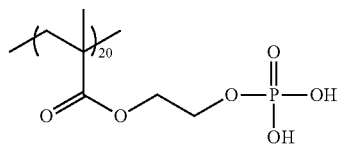
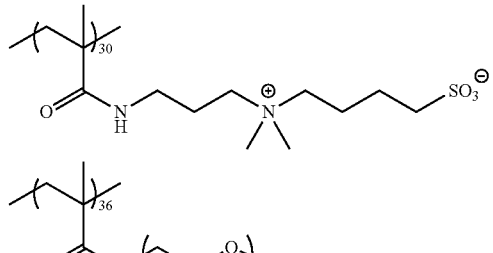
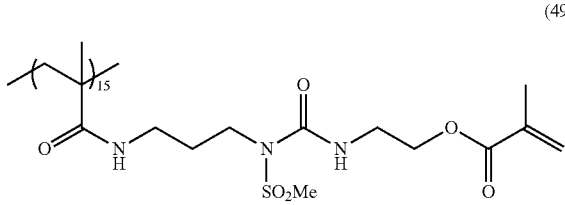
Mw: 200,000
n (repeating unit number) = 45
(49)
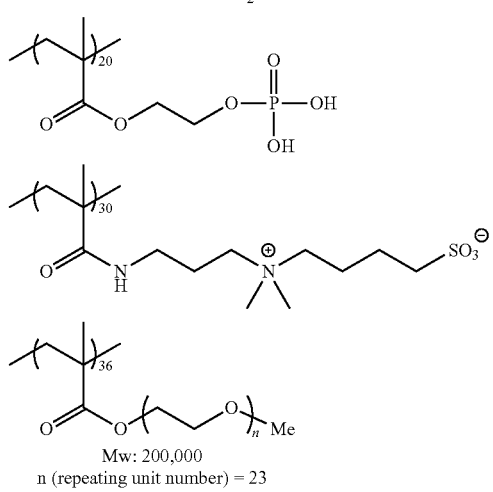
Mw: 200,000
n (repeating unit number) = 23
(50)
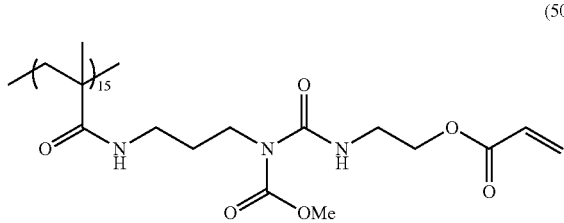
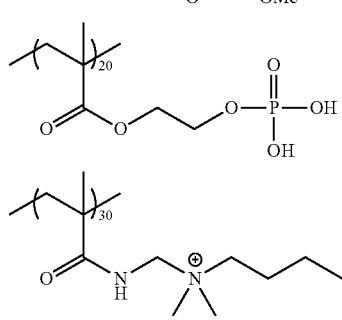

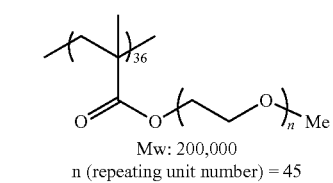
Mw: 200,000
n (repeating unit number) = 45
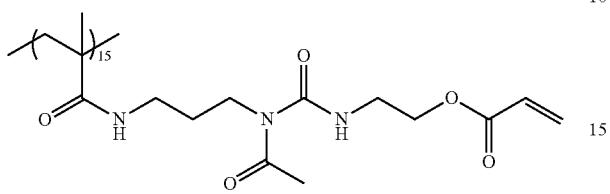
(51)
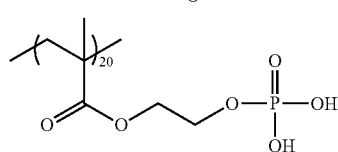
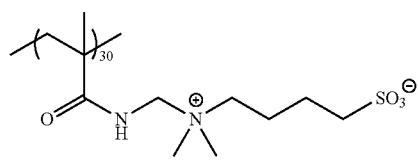
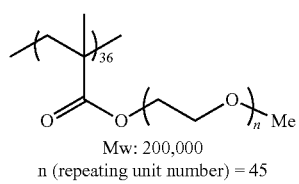
Mw: 200,000
n (repeating unit number) = 45
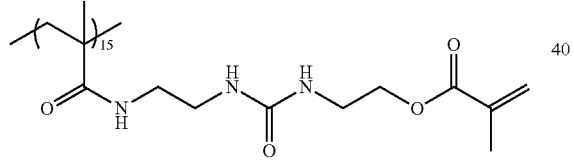
(52)
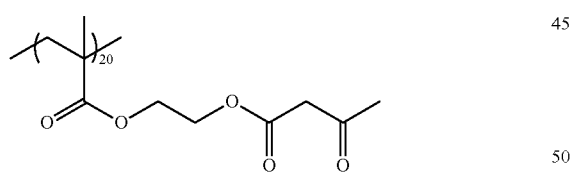
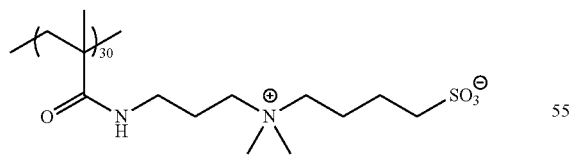
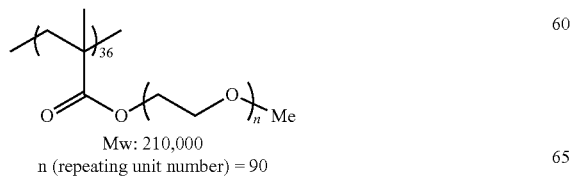
Mw: 210,000
n (repeating unit number) = 90
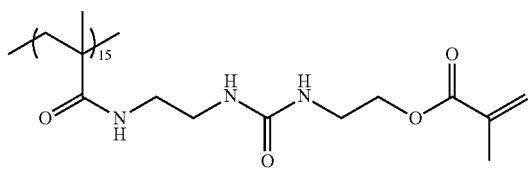
(53)
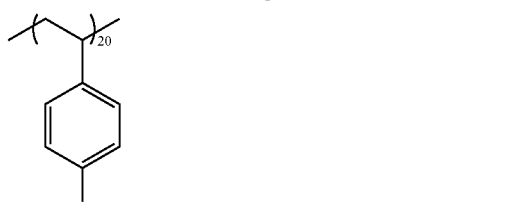
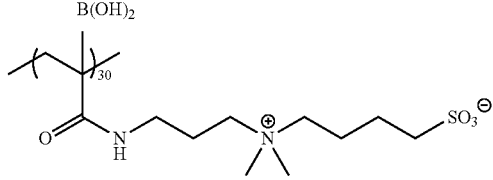
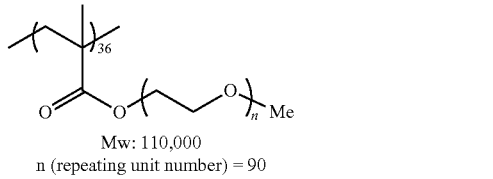
Mw: 110,000
n (repeating unit number) = 90
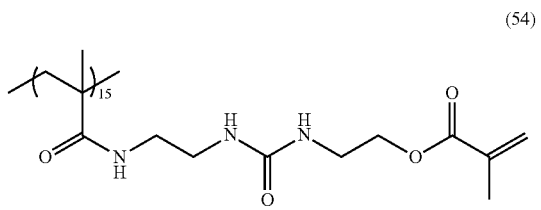
(54)
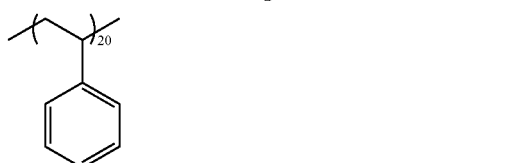
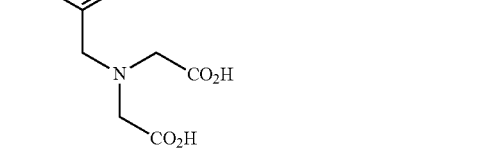
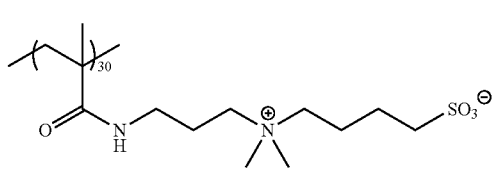
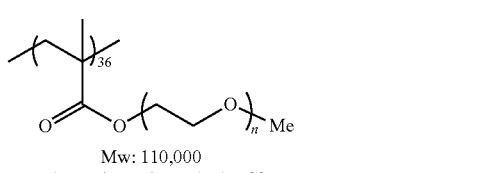
Mw: 110,000
n (repeating unit number) = 90

(55)
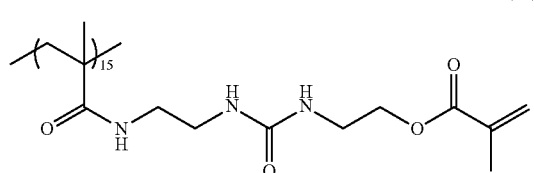
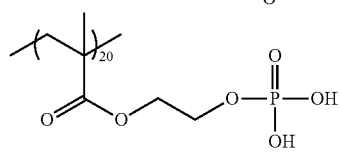
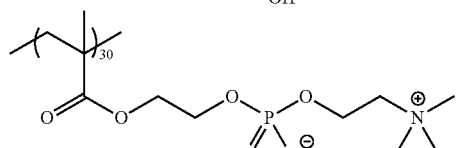
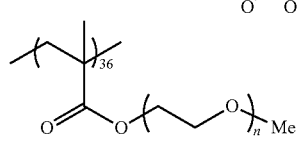
Mw: 450,000
n (repeating unit number) = 90
(56)
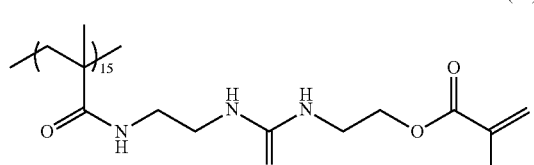
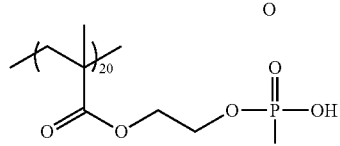
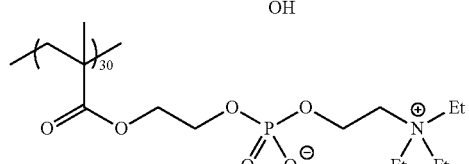
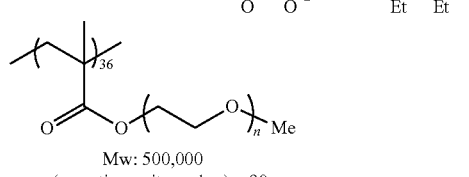
Mw: 500,000
n (repeating unit number) = 90
(57)
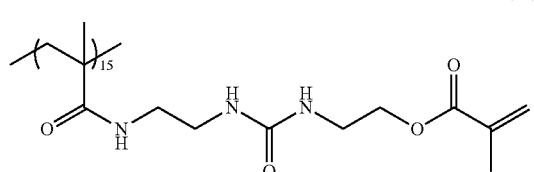
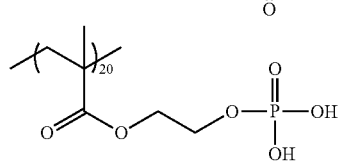
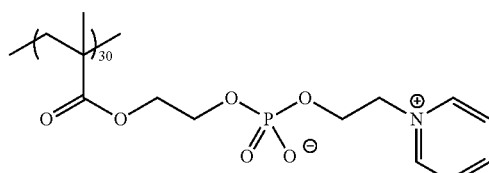
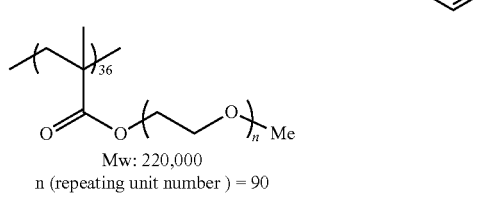
Mw: 220,000
n (repeating unit number) = 90
(58)
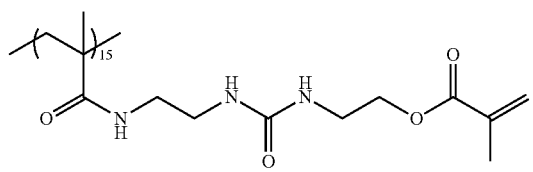
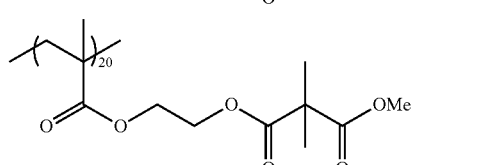
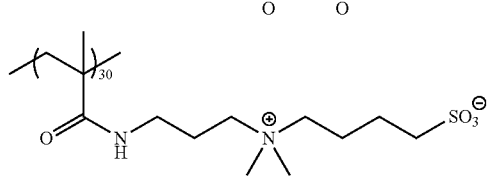
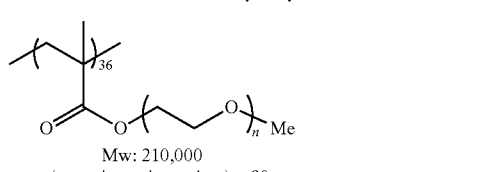
Mw: 210,000
n (repeating unit number) = 90
(58)
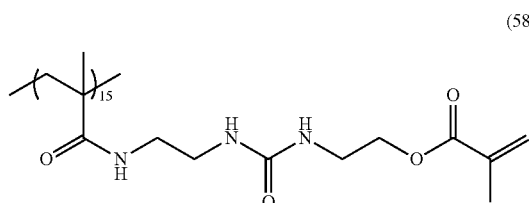
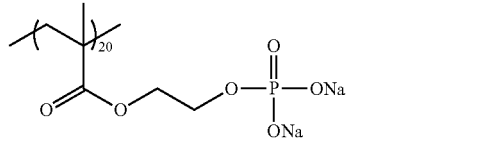
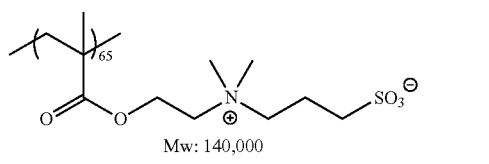
Mw: 140,000

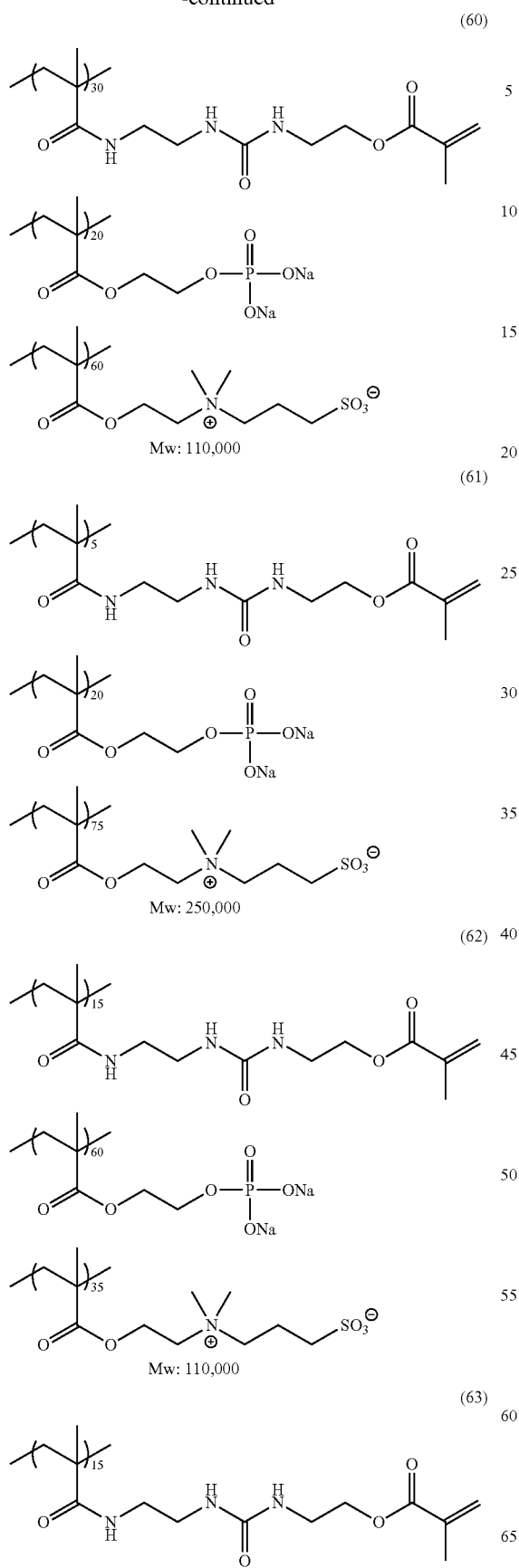
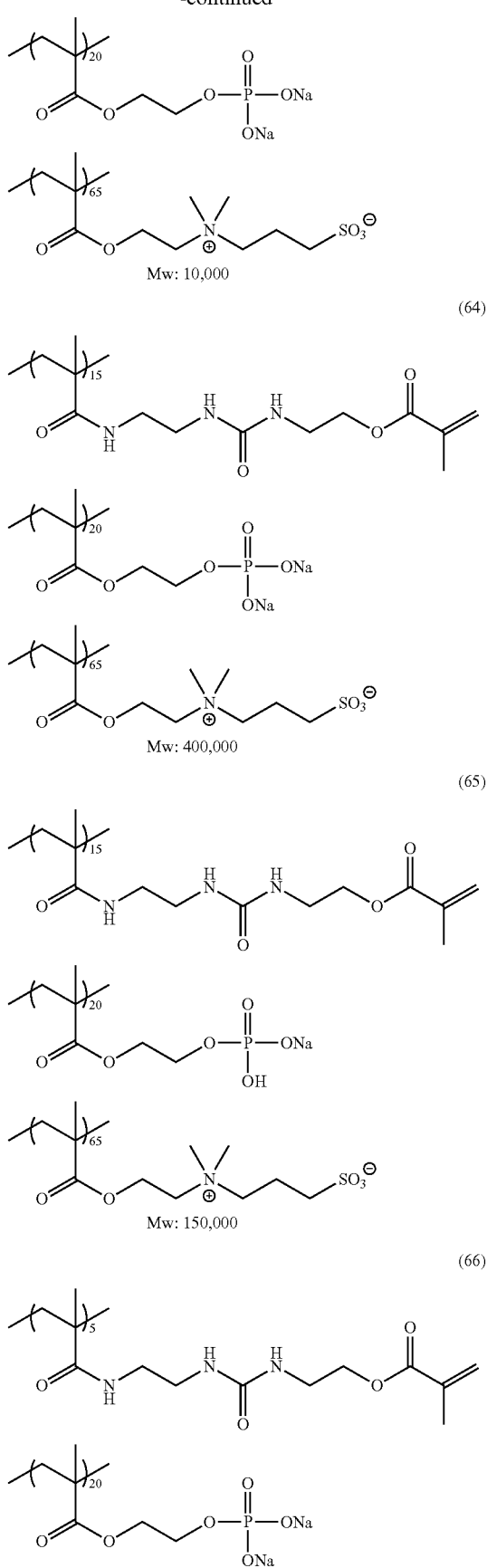

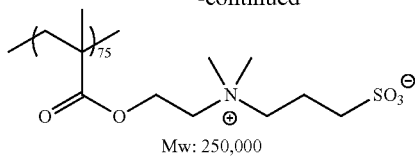
Mw: 250,000
(67)
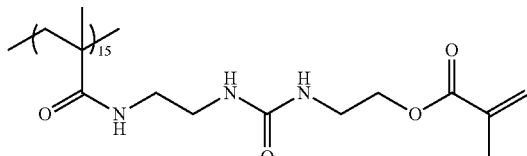
n (repeating unit number) = 45
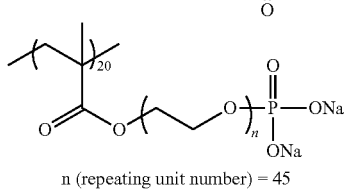
Mw: 160,000
(68)
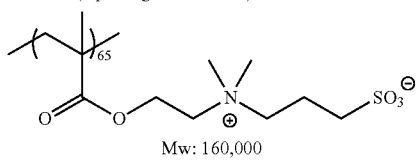
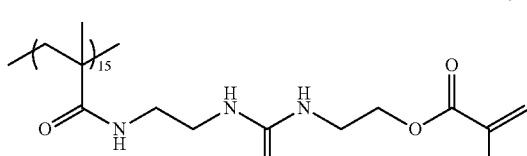
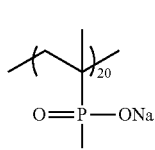
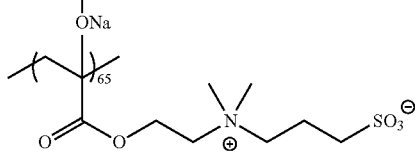
Mw: 110,000
(69)
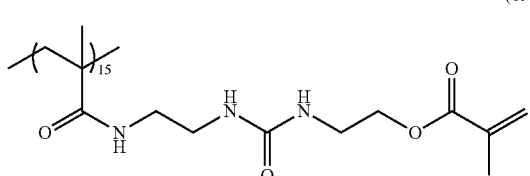
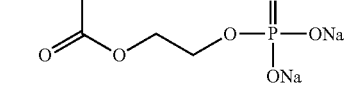
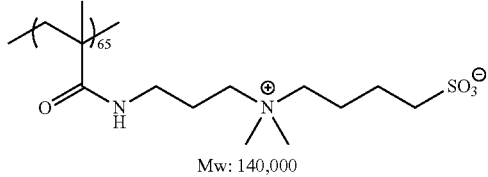
Mw: 140,000
(70)
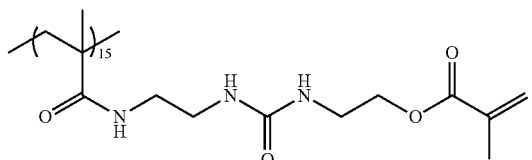
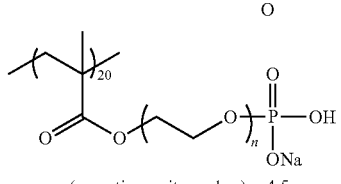
n (repeating unit number) = 4.5
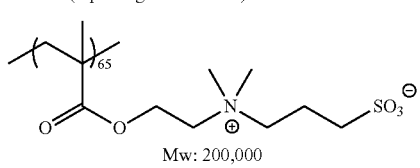
Mw: 200,000
(71)
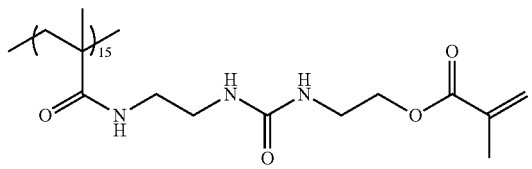
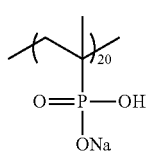
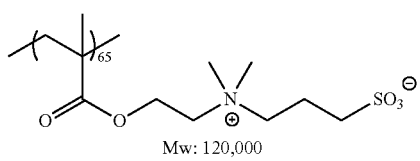
Mw: 120,000
(72)
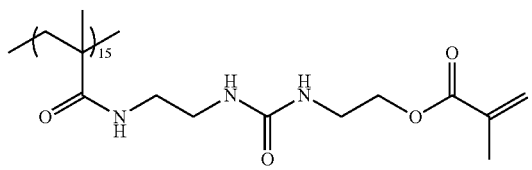
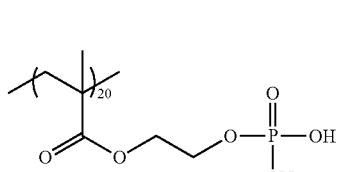
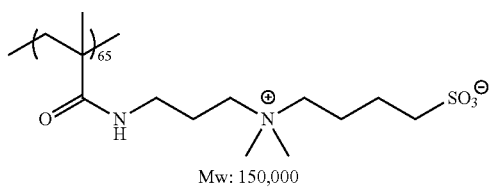
Mw: 150,000

(73)
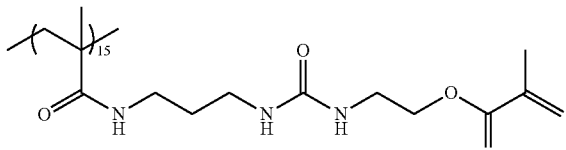
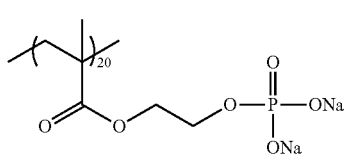
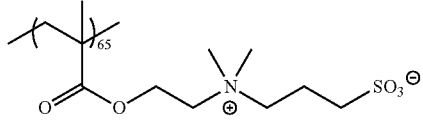
Mw: 200,000
(74)
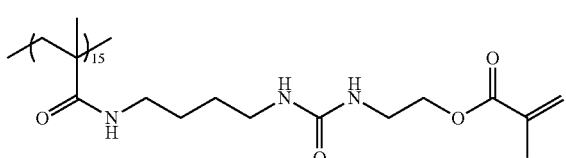
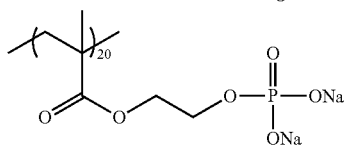
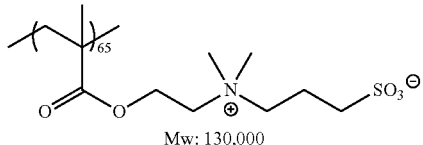
Mw: 130,000
(75)
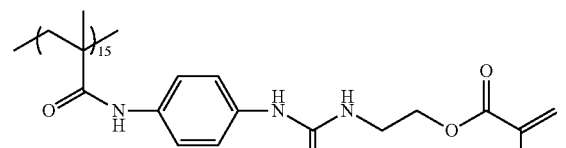
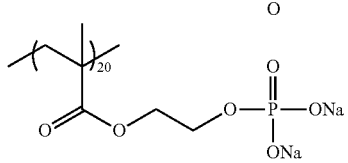
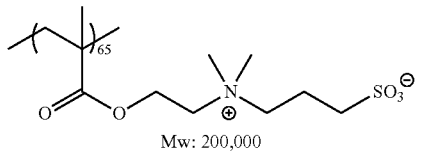
Mw: 200,000
(76)
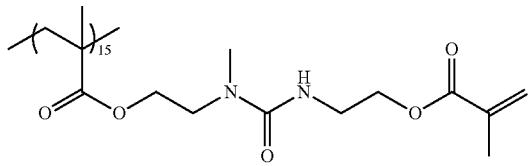
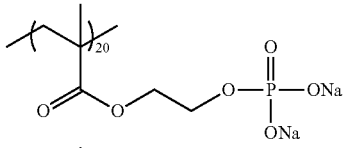
Mw: 130,000
(77)
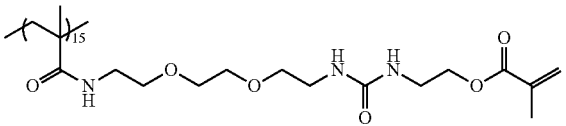
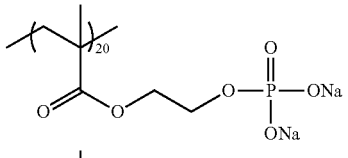
Mw: 280,000
(78)
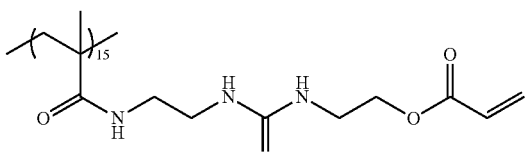
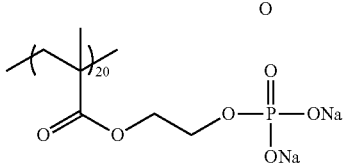
Mw: 150,000
(79)
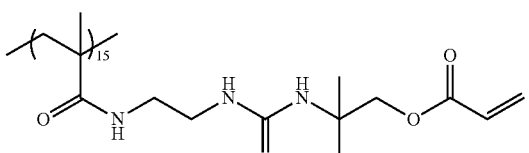
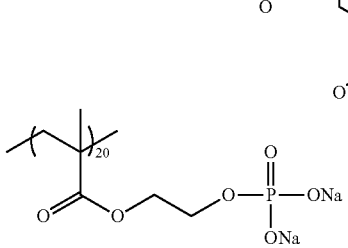

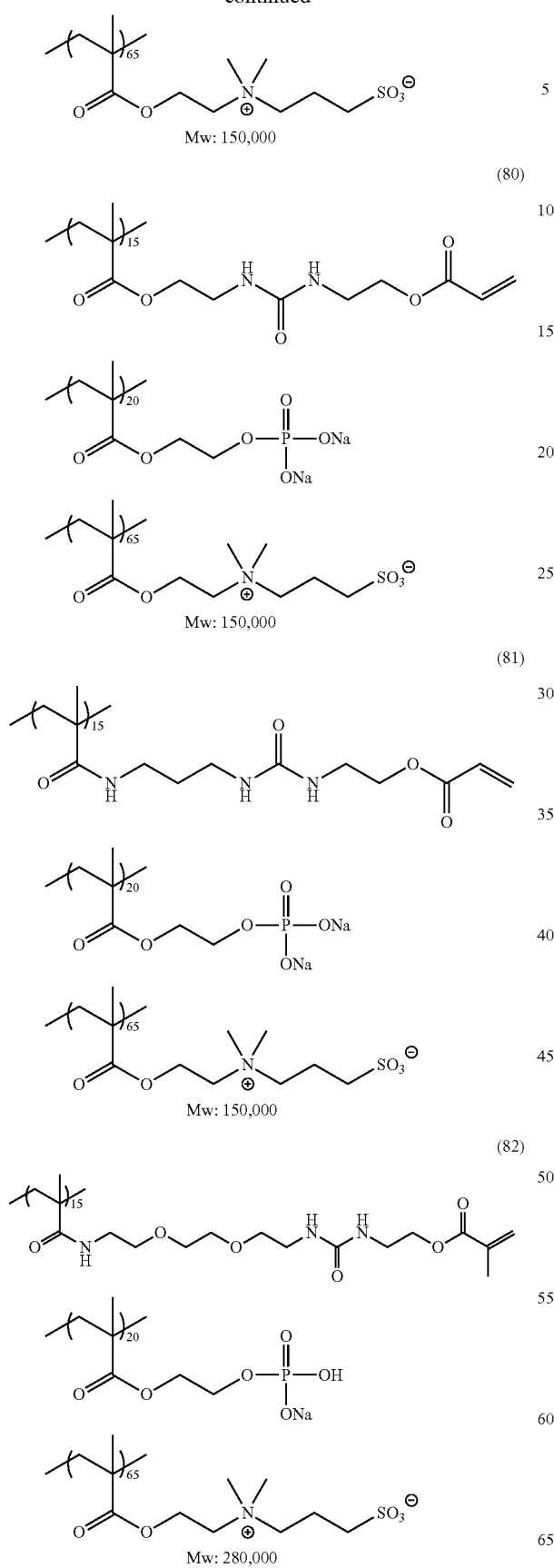
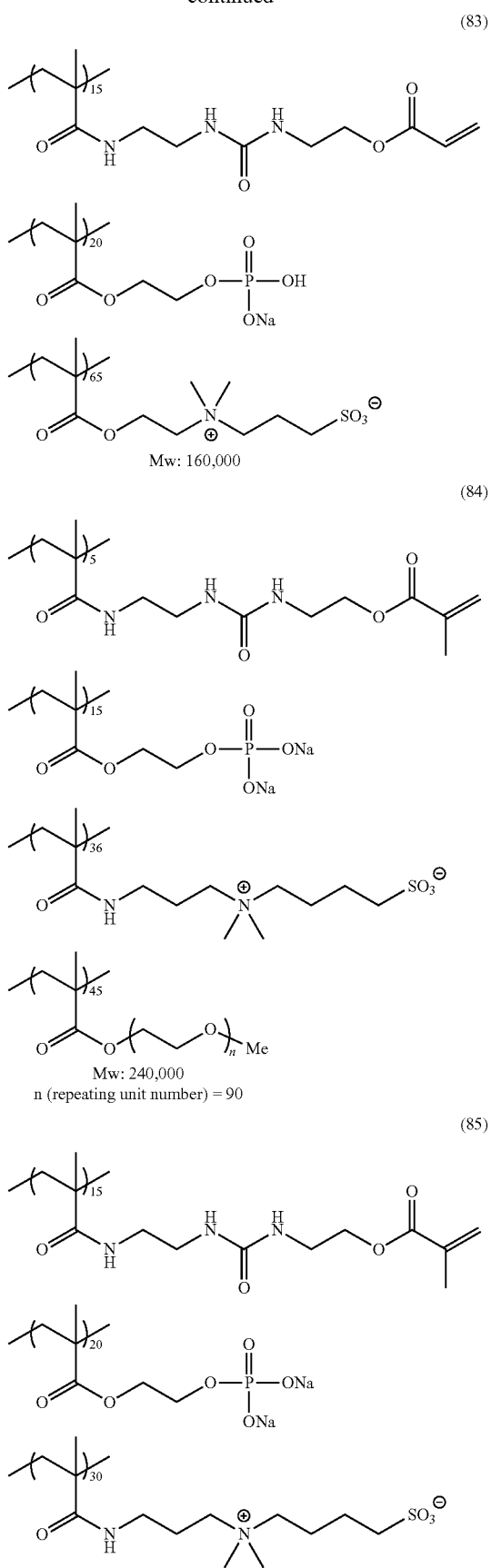

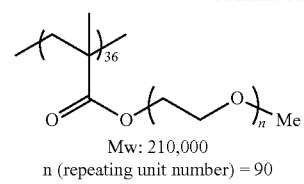
Mw: 210,000
n (repeating unit number) = 90
(86)
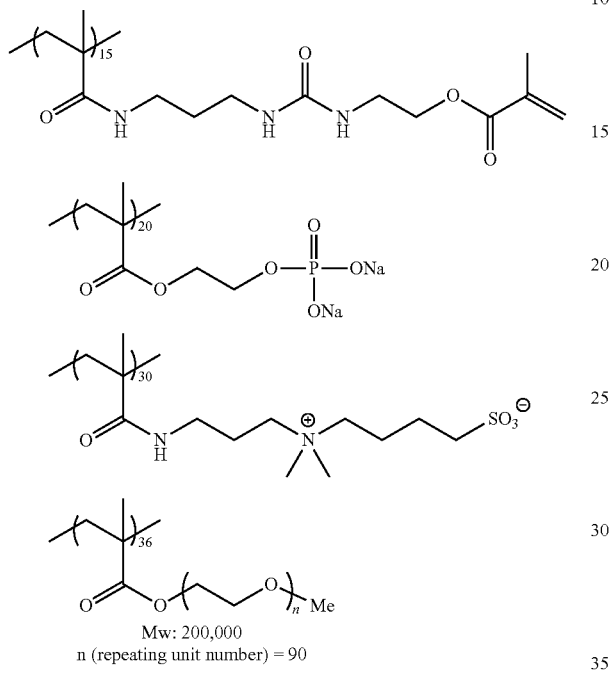
Mw: 200,000
n (repeating unit number) = 90
(87)
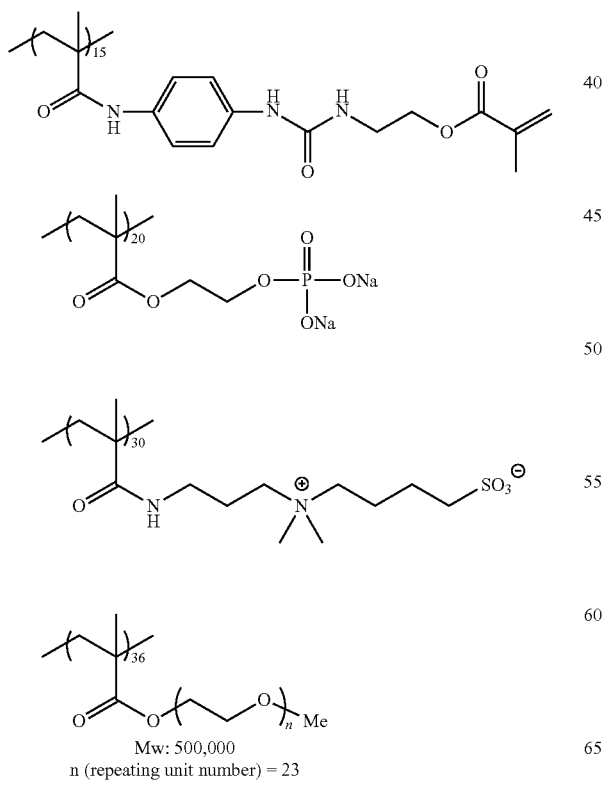
Mw: 500,000
n (repeating unit number) = 23
(88)
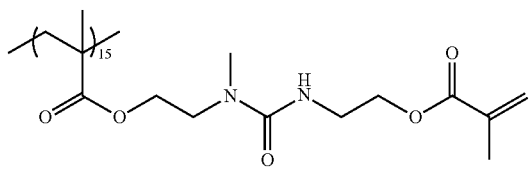
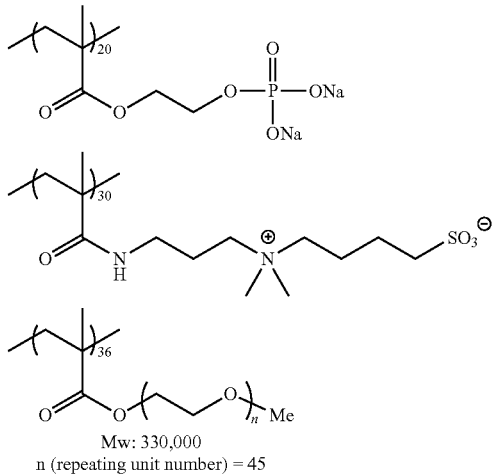
Mw: 330,000
n (repeating unit number) = 45
(89)
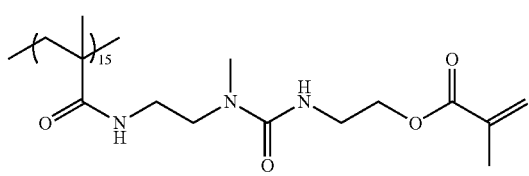
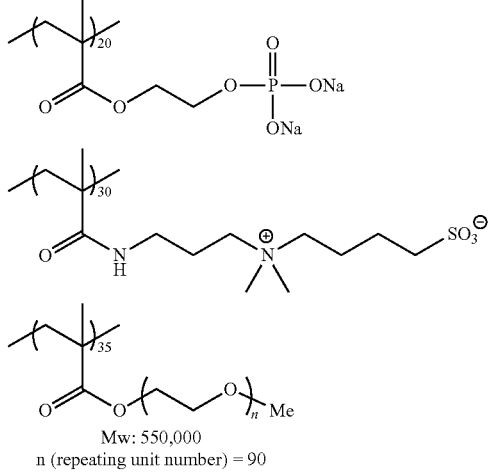
Mw: 550,000
n (repeating unit number) = 90
(90)
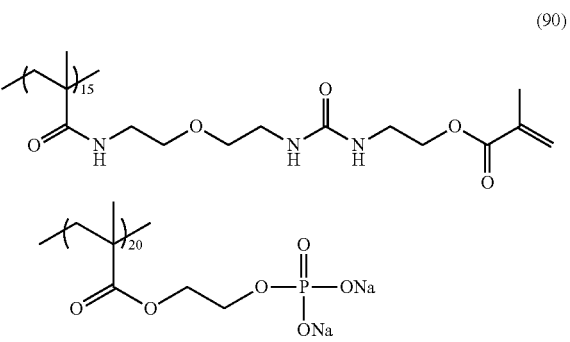

-continued
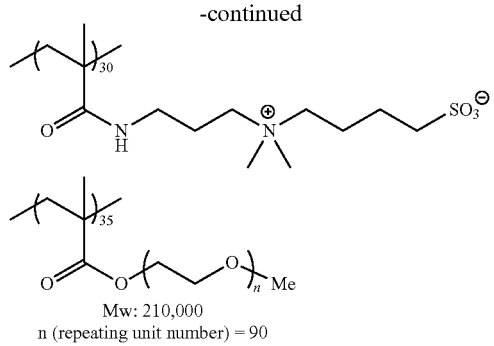
Mw: 210,000
n (repeating unit number) = 90
(91)
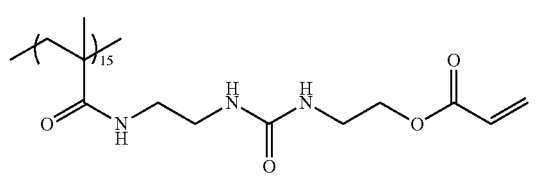
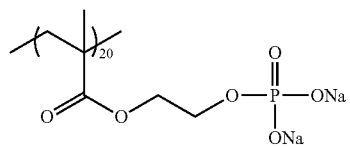
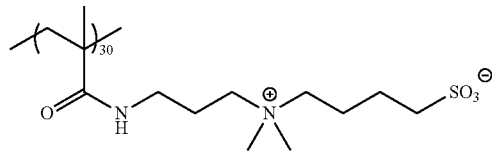
Mw: 410,000
n (repeating unit number) = 90
(92)
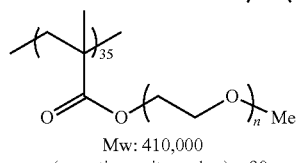
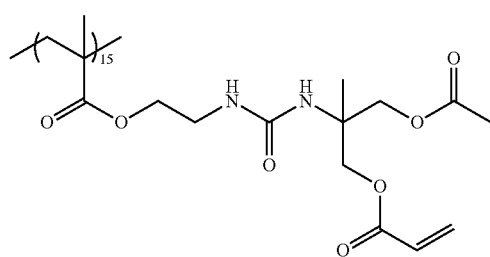
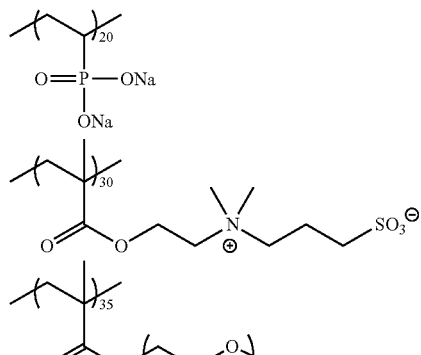
Mw: 430,000
n (repeating unit number) = 9
-continued
(93)
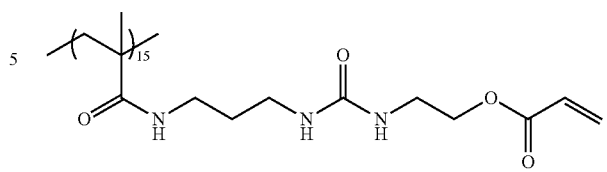
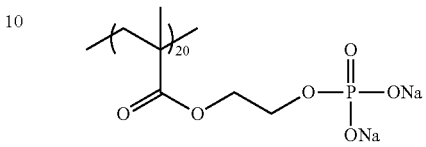
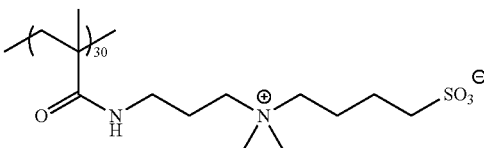
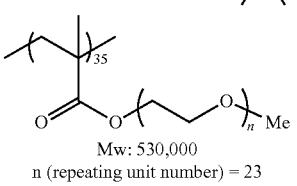
Mw: 530,000
n (repeating unit number) = 23
(94)
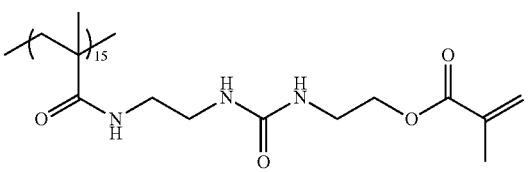
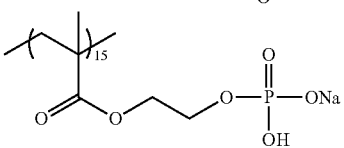
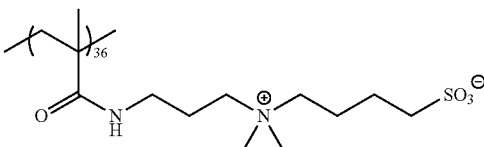
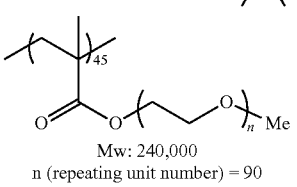
Mw: 240,000
n (repeating unit number) = 90
(95)
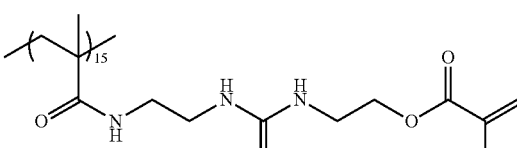
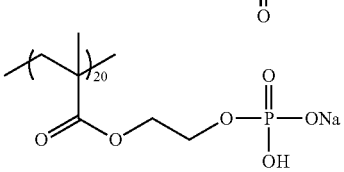

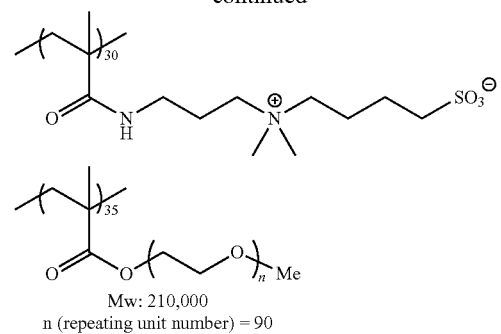
Mw: 210,000
n (repeating unit number) = 90
(96)
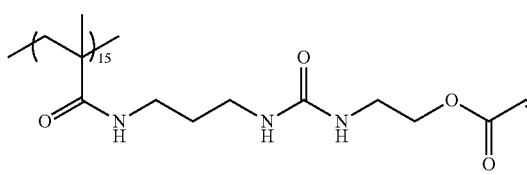
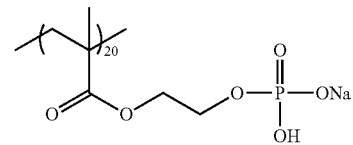
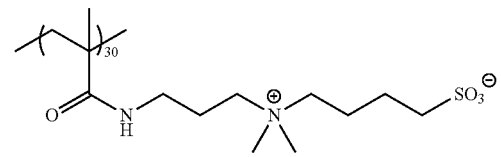
Mw: 530,000
n (repeating unit number) = 23
(97)
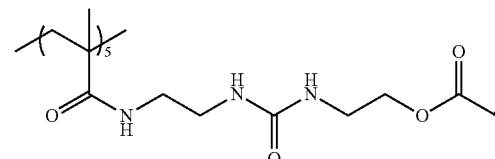
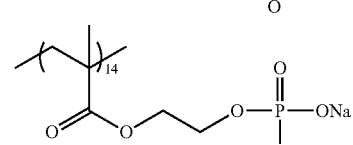
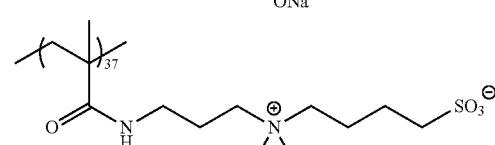
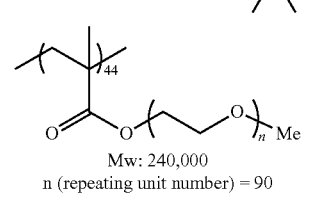
Mw: 240,000
n (repeating unit number) = 90
(98)
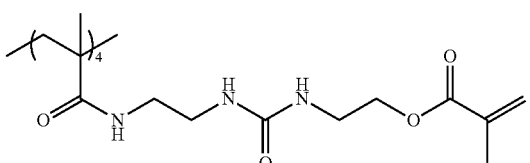
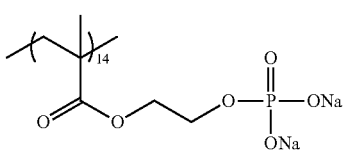
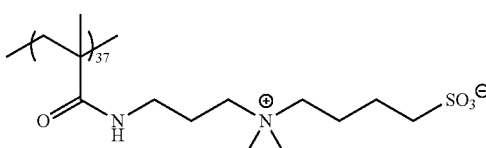
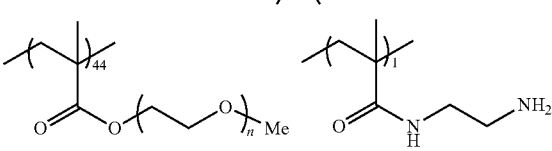
Mw: 240,000
n (repeating unit number) = 90
(99)
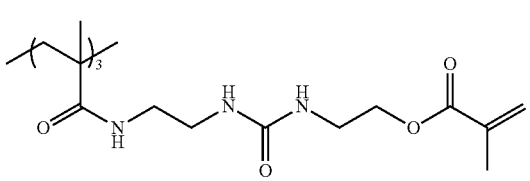
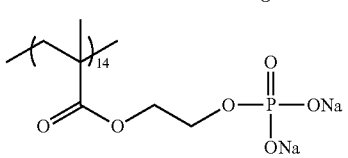
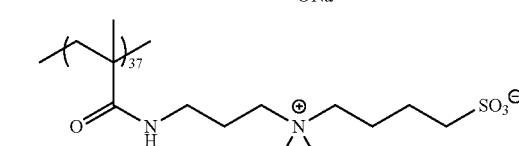
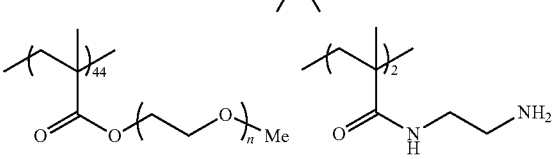
Mw: 240,000
n (repeating unit number) = 90
(100)
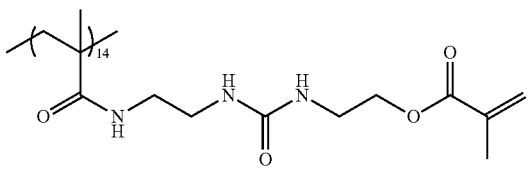

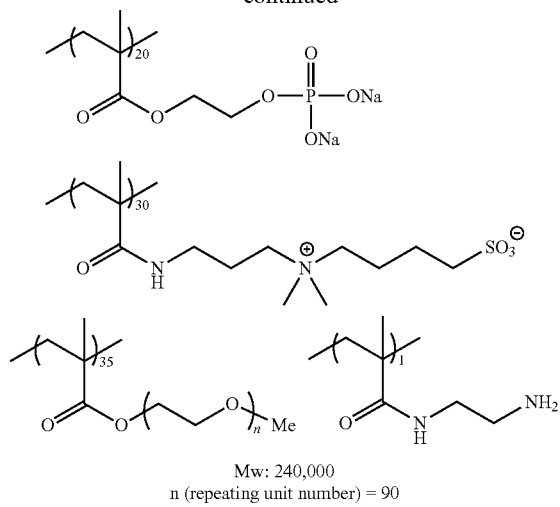

(101)

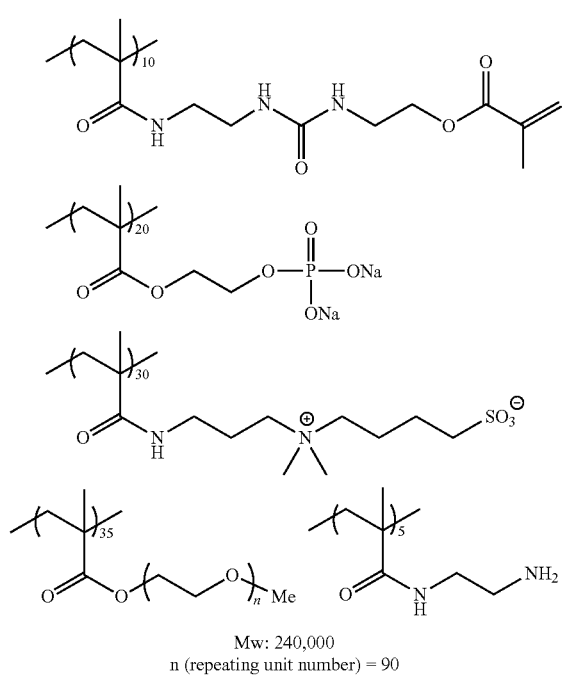

(102)

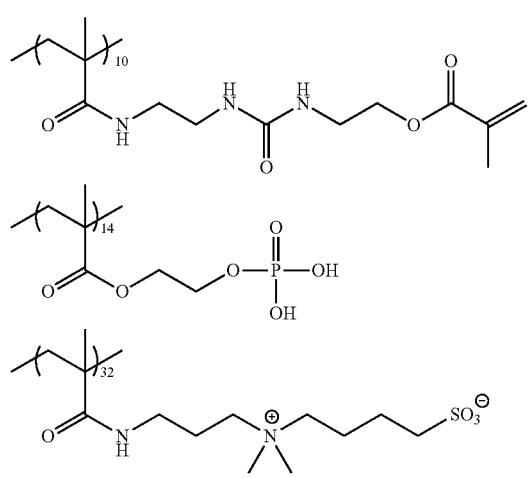

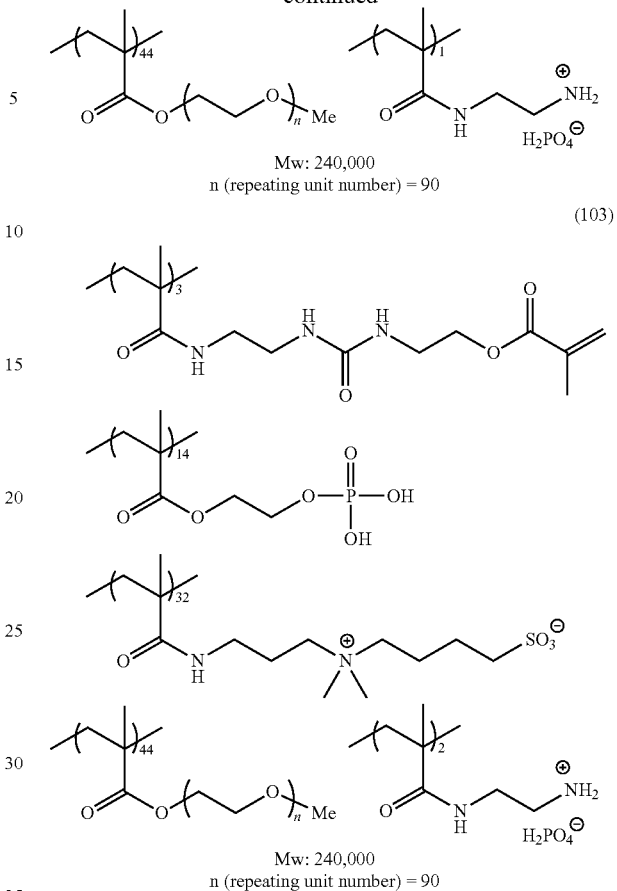

(103)

The specific polymer compound according to the invention is used by incorporating into an image-recording layer or an undercoat layer provided between a support and an image-recording layer. In case of incorporating into the image-recording layer, the content thereof is preferably from 0.1 to 20% by weight, more preferably from 0.2 to 10% by weight, most preferably from 0.5 to 5% by weight, based on the total weight of the image-recording layer. In case of incorporating into the undercoat layer, the content thereof is preferably flora 10 to 100% by weight, more preferably from 20 to 100% by weight, most preferably from 50 to 100% by weight, based on the total weight of the undercoat layer.

In the range described above, the effects of the specific polymer compound according to the invention on the developing property, printing durability, stain resistance and time lapse stability can be achieved.

(Image-Recording Layer)

The image-recording layer for use in the invention contains (A) polymerization initiator, (B) a sensitizing dye and (C) a polymerizable compound.

<(A) Polymerization Initiator>

As the polymerization initiator for the invention, a radical polymerization initiator is preferably used. As the radical polymerization initiator, radical polymerization initiators known to those skilled in the art can be used without limitation. Specifically, for example, a trihalomethyl compound, a carbonyl compound, an organic peroxide, an azo compound, an azide compound, a metallocene compound, a hexaarylbi-imidazole compound, an organic boron compound, a disulfone compound, an oxime ester compound, an onium salt and a iron arctic complex are exemplified. Among them, at least one compound selected from the group consisting of the hexaarylbiimidazole compound, onium salt, trihalomethyl compound and metallocene compound is preferred, and the hexaaryibiimidazole compound is particularly preferred. The radical polymerization initiators may be appropriately used in combination of two or more thereof.

The hexaarylbiimidazole compound includes, for example, lophine dimers described in JP-B-45-37377 (the term "JP-B" as used herein means an "examined Japanese patent publication") and JP-B-44-86516, specifically, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,o'-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenyl biimidazole and 2,2'-bis(o-trifluoromethylphenyl)-4,4',5,5'-tetraphenylbiimidazole.

The hexaarylbiimidazole compound is particularly preferably used together with a sensitizing dye having an absorption maximum, in a wavelength range from 350 to 450 nm described hereinafter.

The onium salt preferably used in the invention includes a sulfonium salt, an iodonium salt and a diazonium salt. Particularly, a diaryliodonium salt and a triarylsulfonium salt are preferably used. The onium salt is particularly preferably used together with an infrared absorbing agent having an absorption maximum in a wavelength range from 750 to 1,400 nm.

As other radical polymerization initiators, polymerization initiators described in Paragraph Nos. [0071] to [0129] of JP-A-2007-206217 are preferably used.

The polymerization initiators are preferably used individually or in combination of two or more thereof according to the invention.

The amount of the polymerization initiator used in the image-recording layer according to the invention is preferably from 0.01 to 20% by weight, more preferably front 0.1 to 15% by weight, still more preferably from 1.0 to 10% by weight, based on the weight of the total solid content of the image-recording layer.

<(B) Sensitizing Dye>

The image-recording layer according to the invention contains a sensitizing dye. The sensitizing dye can be used without particular limitation as far as it absorbs light at the image exposure to form the excited state and provides energy to the polymerization initiator described above with electron transfer, energy transfer or heat generation thereby improving the polymerization initiation function. Particularly, a sensitizing dye having an absorption maximum in a wavelength range from 350 to 450 nm or from 750 to 1,400 nm is preferably used.

Examples of the sensitizing dye having an absorption maximum in a wavelength range from 350 to 450 nm include merocyanine dyes, benzopyranes, coumarins, aromatic ketones and anthracenes.

Of the sensitizing dyes having an absorption maximum in a wavelength range from 350 to 450 nm a dye represented by formula (I) shown below is more preferable in view of high sensitivity.

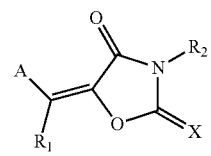

In formula (I), A represents an aromatic cyclic group which may have a substituent or a heterocyclic group which may have a substituent, X represents an oxygen atom, a sulfur atom or $=N(R_3)$, and $R_1$, $R_2$ and $R_3$ each independently represents a monovalent non-metallic atomic group, or A and $R_1$ or $R_2$ and $R_3$ may be combined with each other to form an aliphatic or aromatic ring.

The formula (I) will be described in more detail below. $R_1$, $R_2$ and $R_3$ each independently represents a monovalent non-metallic atomic group, preferably a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxy group, a substituted or unsubstituted alkylthio group, a hydroxy group or a halogen atom.

Now, A in formula (I) is described below. A represents an aromatic cyclic group which may have a substituent or a heterocyclic group which may have a substituent. The aromatic cyclic group which may have a substituent and heterocyclic group which may have a substituent are same as the substituted or unsubstituted aryl group and substituted or unsubstituted aromatic heterocyclic residue described for any one of $R_1$, $R_2$ and $R_3$ in formula (I), respectively.

Specific examples of the sensitizing dye include compounds described in Paragraph Nos. [0047] to [0053] of JP-A-2007-58170.

Further, sensitizing dyes represented by formulae (II) or (III) shown below can also be used.

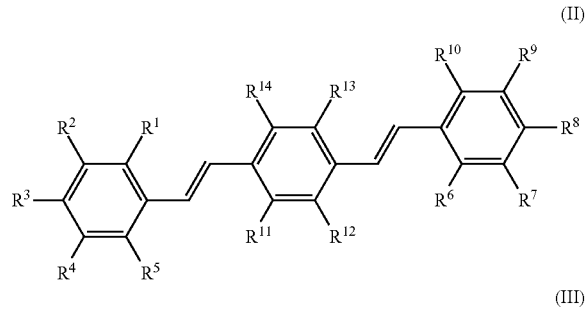

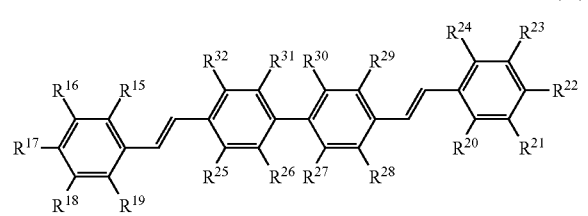

In formula (II), $R^1$ to $R^{14}$ each independently represents a hydrogen atom, an alkyl group, an alkoxy group, a cyano group or a halogen atom, provided that at least one of $R^1$ to $R^{10}$ represents an alkoxy group having 2 or more carbon atoms.

In formula (III), $R^{15}$ to $R^{32}$ each independently represents a hydrogen atom, an alkyl group, an alkoxy group, a cyano group or a halogen atom, provided that at least one of $R^{15}$ to $R^{24}$ represents an alkoxy group having 2 or more carbon atoms.

As specific examples of these sensitizing dyes, compounds described in EP-A-1349006 and WO 2005/029187 are preferably used.

Further, sensitizing dyes described in JP-A-2007-171406, JP-A-2007-206216, JP-A-2007-206217, JP-A-2007-225701, JP-A-2007-225702, JP-A-2007-316582 and JP-A-2007-328243 are also preferably used.

Next, the sensitizing dye having an absorption maximum in a wavelength range from 750 to 1,400 (hereinafter, also referred to as an "infrared absorbing agent") preferably used in the invention is described in detail below. The infrared absorbing agent used is preferably a dye or pigment.

As the dye, commercially available dyes and known dyes described in literatures, for example, *Senryo Binran* (*Dye Handbook*) compiled by The Society of Synthetic Organic Chemistry, Japan (1970) can be used. Specifically, the dyes includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Of the dyes, cyanine dyes, squarylium dyes, pyrylium dyes, nickel thiolate complexes and indolenine cyanine dyes are particularly preferred. The cyanine dyes and indolenine cyanine dyes are more preferred. As particularly preferable examples of the dye, a cyanine dye represented by formula (a) shown below is exemplified.

Formula (a):

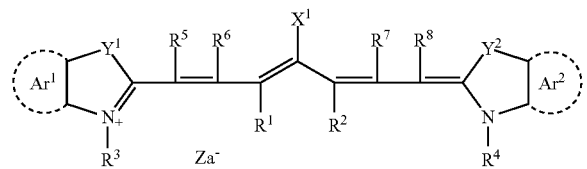

In formula (a), $X^1$ represents a hydrogen atom, a halogen atom, $-N(R^9)(R^{10})$, $-X^2-L^1$ or a group shown below. $R^9$ and $R^{10}$, which may be the same or different, each represents an aromatic hydrocarbon group having from 6 to 10 carbon atoms, which may have a substituent, an alkyl group having from 1 to 8 carbon atoms or a hydrogen atom or $R^9$ and $R^{10}$ may be combined with each other to from a ring, and preferably represents a phenyl group. $X^2$ represents an oxygen atom or a sulfur atom, $L^1$ represents a hydrocarbon group having from 1 to 12 carbon atoms, an aromatic cyclic group containing a hetero atom (a nitrogen atom, a sulfur atom, an oxygen atom, a halogen atom or a selenium atom) or a hydrocarbon group having from 1 to 12 carbon atoms and containing a hetero atom. $Xa^-$ has the same meaning as $Za^-$ defined hereinafter. $R^a$ represents a hydrogen atom or a substituent selected from an alkyl group, an aryl group, a substituted or unsubstituted amino group and a halogen atom.

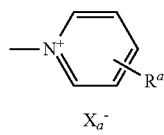

$R^1$ and $R^2$ each independently represents a hydrocarbon group having from 1 to 12 carbon atoms. In view of the preservation stability of a coating solution for image-recording layer, it is preferred that $R^1$ and $R^2$ each represents a hydrocarbon group having two or more carbon atoms. It is also preferred that $R^1$ and $R^2$ are combined with each other to form a ring, and in case of forming the ring, to form a 5-membered ring or 6-membered ring is particularly preferred.

$Ar^1$ and $Ar^2$, which may be the same or different, each represents an aromatic hydrocarbon group which may have a substituent. Preferable examples of the aromatic hydrocarbon group include a benzene ring group and a naphthalene ring group. Preferable examples of the substituent include a hydrocarbon group having 12 or less carbon atoms, a halogen atom and an alkoxy group having 12 or less carbon atoms. $Y^1$ and $Y^2$, which may be the same or different, each represents a sulfur atom or a dialkylmethylene group having 12 or less carbon atoms. $R^3$ and $R^4$, which may be the same or different, each represents a hydrocarbon group having 20 or less carbon atoms, which may have a substituent. Preferable examples of the substituent include an alkoxy group having 12 or less carbon atoms, a carboxyl group and a sulk) group. $R^5$, $R^6$, $R^7$ and $R^8$, which may be the same or different, each represents a hydrogen atom or a hydrocarbon group having 12 or less carbon atoms. In view of the availability of raw materials, a hydrogen atom is preferred. $Za^-$ represents a counter anion. However, $Za^-$ is not necessary when the ermine dye represented by formula (a) has an anionic substituent in the structure thereof and neutralization of charge is not needed. Preferable examples of the counter ion for $Za^-$ include a halide ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion in view of the preservation stability of a coating solution for image-recording layer.

Specific examples of the cyanine dye represented by formula (a), which can be preferably used in the invention, include those described in Paragraph Nos. [0017] to [0019] of JP-A-2001-133969.

Further, other particularly preferable examples include specific indole cyartine dyes described in JP-A-2002-278057.

Examples of the pigment for use in the invention include commercially available pigments and pigments described in *Colour Index (C.I.)*, *Saishin Ganryo Binran* (*Handbook of the Newest Pigments*) compiled by Pigment Technology Society of Japan (1977), *Saishin Ganryo Oyou Gijutsu* (*Newest Application on Technologies for Pigments*), CMC Publishing Co., Ltd. (1986) and *Insatsu Ink Gijutsu* (*Printing Ink Technology*), CMC Publishing Co., Ltd. (1984).

The amount of the sensitizing dye added is preferably from 0.05 to 30 parts by weight, more preferably from 0.1 to 20 parts by weight, most preferably from 0.2 to 10 parts by weight, per 100 parts by weight of the total solid content of the image-recording layer.

<(C) Polymerizable Compound>

The polymerizable compound for use in the image-recording layer according to the invention is an addition-polymerizable compound having at least one ethylenically unsaturated double bond and it is selected from compounds having at least one, preferably two or more, terminal ethylenically unsaturated double bonds. The polymerizable compound has a chemical form, for example, a monomer, a prepolymer, specifically, a dimer, a trimer or an oligomer, or a mixture thereof. Examples of the monomer include unsaturated carboxylic acids (fig example, acrylic acid, methacrylic acid, itaconic acid, crotonic acid, isocrotonic acid or maleic acid) and esters or amides thereof. Preferably, esters of an unsaturated carboxylic acid with a polyhydric alcohol compound and amides of an unsaturated carboxylic acid with a polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy compound, or a dehydration condensation reaction product of the unsaturated carboxylic acid ester or amide with a monofunctional or polyfunctional carboxylic acid is also preferably used. Moreover, an addition reaction product of an unsaturated carboxylic acid ester or amide having an electrophilic substituent, for example, an isocyanate group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used. These compounds are described in references including JP-T-2006-508380, JP-A-2002-287344, JP-A-2008-256850, JP-A-2001-342222, JP-A-9-179296, JP-A-9-179297, JP-A-9-179298, JP-A-2004-294935, JP-A-2006-243493, JP-A-2002-275129, JP-A-2003-64130, JP-A-2003-280187 and JP-A-10-333321.

Specific examples of the monomer, which is an ester of a polyhydric alcohol compound with an unsaturated carboxylic acid, include, as an acrylic acid ester, for example, ethylene glycol diacrylate, 1,3-butanediol diacrylate, tetramethylene glycol diacrylate, propylene glycol diacrylate, trimethylolpropane triacrylate, hexanediol diacrylate, tetraethylene glycol diacrylate, pentaerythritol tetraacrylate, sorbitol triacrylate, isocyanuric acid ethylene oxide (EO) modified triacrylate and polyester acrylate oligomer. As a methacrylic acid ester, for example, tetramethylene glycol dimethacrylate, neopentyl glycol dimethacrylate, trimethylolpropane trimethacrylate, ethylene glycol dimethacrylate, pentaerythritol trimethacrylate, bis[p-(3-methacryloxy-2-hydroxypropoxy)phenyl]dimethylmethane and bis[p-(methacryloxyethoxy)phenyl]dimethylmethane are exemplified. Specific examples of the monomer, which is an amide of a polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Urethane type addition-polymerizable compounds produced using an addition reaction between an isocyanate and a hydroxy group are also preferably used and specific examples thereof include vinylurethane compounds having two or more polymerizable vinyl groups per molecule obtained by adding a vinyl monomer containing a hydroxy group represented by formula (b) shown below to a polyisocyanate compound having two or more isocyanate groups per molecule, described in JP-B-48-41708.

   (b)

wherein $R_4$ and $R_5$ each independently represents H or $CH_3$.

Also, urethane acrylates as described in JP-A-51-37193, JP-B-2-32293, JP-B-2-16765, JP-A-2003-344997 and JP-A-2006-65210, urethane compounds having an ethylene oxide skeleton described in JP-B-58-49860, JP-B-56-17654, JP-B-62-39417, JP-B-62-39418, JP-A-2000-250211 and JP-A-2007-94138, and urethane compounds having a hydrophilic group described in U.S. Pat. No. 7,153,632, JP-T-8-505958, JP-A-2007-293221 and JP-A-2007-293223 are preferably used.

Of the compounds described above, an isocyanuric acid ethylenenxide-modified acrylate, for example, tris(acryloyloxyethyl) isocyanurate or bis(acryloyloxyethyl)hydroxyethyl isocyanurate is particularly preferred from the standpoint of excellent balance between hydrophilicity relating to the on-press development property and polymerization ability relating to the printing durability.

Details of the method of using the polymerizable compound, for example, selection of the structure, individual or combination use or an amount added, can be appropriately determined in accordance with the characteristic design of the final lithographic printing plate precursor. The polymerizable compound is used preferably in a range from 5 to 75% by weight, more preferably in a range from 10 to 70% by weight, particularly preferably in a range from 15 to 60% by weight, based on the total solid content of the image-recording layer.

<(E) Other Components>

The image-recording layer according to the invention may further contain other components, if desired.

(1) Polymer Binder

In the image-recording layer according to the invention, a polymer binder can be used for the purpose of improving film strength of the image-recording layer. The polymer binder which can be used in the invention can be selected from those heretofore known without restriction, and a polymer having a film-firming property is preferred. Among them, an acrylic resin, a polyvinyl acetal resin and a polyurethane resin are preferred.

As the polymer binder preferable for the invention, a polymer having a crosslinkable functional group for improving film strength of the image area in its main chain or side chain, preferably in its side chain, as described in JP-A-2008-195018 is exemplified. Due to the crosslinkable functional group, crosslinkage is formed between the polymer molecules to facilitate curing.

As the crosslinkable functional group, an ethylenically unsaturated group, for example, a (meth)acryl group, a vinyl group, an allyl group or a styryl group or an epoxy group is preferred. The crosslinkable functional group can be introduced into the polymer by a polymer reaction or copolymerization. For instance, a reaction between an acrylic polymer or polyurethane having a carboxyl group in its side chain and glycidyl methacrylate or a reaction between a polymer having an epoxy group and a carboxylic acid containing an ethylenically unsaturated group, for example, methacrylic acid can be utilized.

The content of the crosslinkable group in the polymer binder is preferably from 0.1 to 10.0 mmol, more preferably from 0.25 to 7.0 mmol, most preferably from 0.5 to 5.5 mmol, based on 1 g of the polymer binder.

It is also preferred that the polymer binder for use in the invention further contains a hydrophilic group. The hydrophilic group contributes to impart the on-press development property to the image-recording layer. In particular, coexistence of the crosslinkable group and the hydrophilic group makes it possible to maintain good balance between printing durability and developing property.

The hydrophilic group includes, for example, a hydroxy group, a carboxyl group, an alkylene oxide structure, an amino group, an ammonium group, an amido group, a sulfa group and a phosphoric acid group. Among them, an alkylene oxide structure containing from 1 to 120 alkylene oxide units having 2 or 3 carbon atoms is preferred and an alkylene oxide structure containing from 2 to 120 alkylene oxide units having 2 or 3 carbon atoms is more preferred. In order to introduce a hydrophilic group into the polymer binder, a monomer having the hydrophilic group may be copolymerized.

The polymer may be used in the form of fine particle as described, for example, in WO 2003/087939 and the average particle size thereof is preferably from 30 to 1,000 nm, and more preferably from 60 to 300 nm.

In order to control the ink-receptive property, an oleophilic group, for example, an alkyl group, an aryl group, an aralkyl group or an alkenyl group may be introduced into the polymer binder according to the invention. Specifically, an oleophilic group-containing monomer, for example, an alkyl methacrylate is copolymerized.

Specific examples (1) to (11) of the polymer binder for use in the invention are set forth below, but the invention should not be construed as being limited thereto. A ratio of the repeating unit in the polymer binder shown below is indicated by a molar ratio.

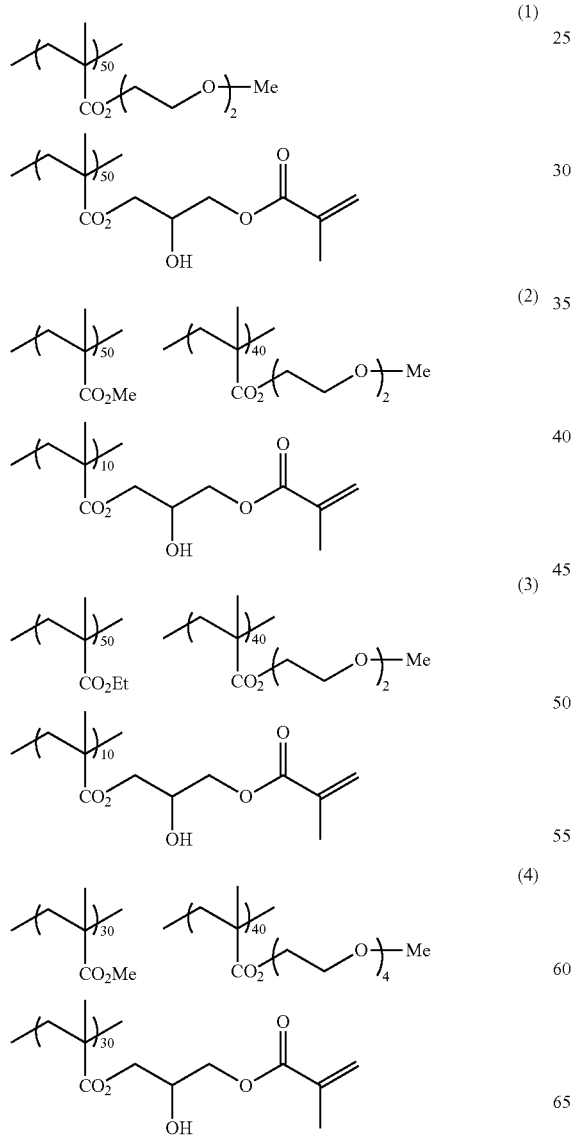

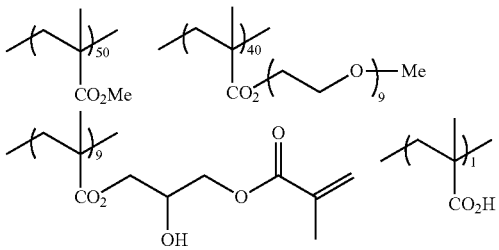

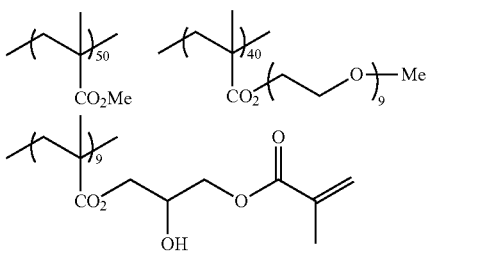

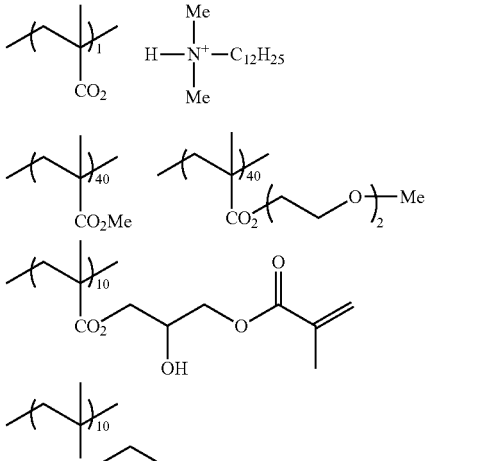

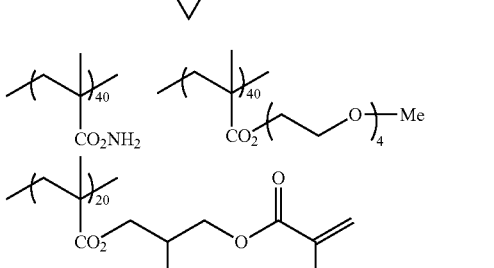

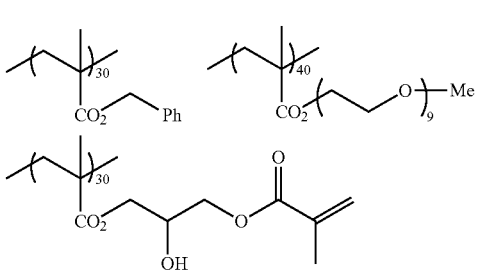

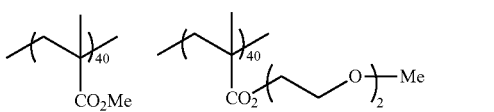

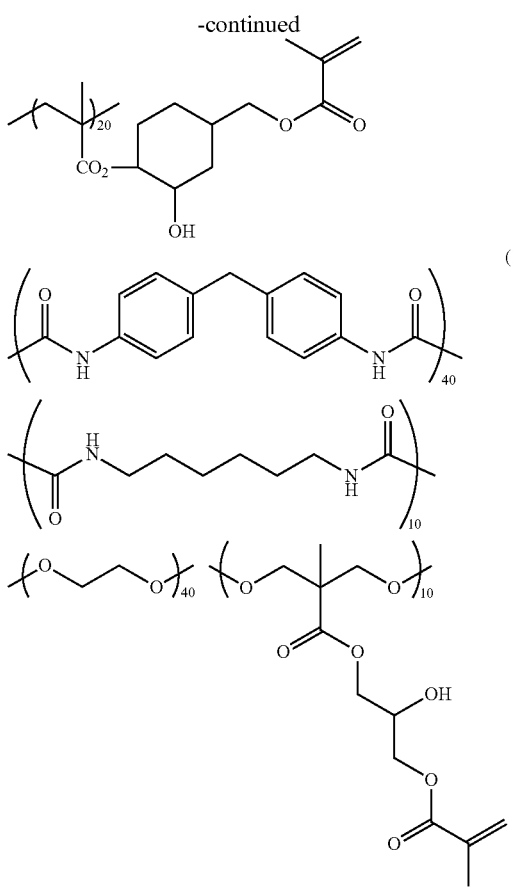

The weight average molecular weight (Mw) of the polymer binder according to the invention is preferably 2,000 or more, more preferably 5,000 or more, and still more preferably from 10,000 to 300,000.

According to the invention, a hydrophilic polymer, for example, polyacrylic acid or polyvinyl alcohol described in JP-A-2008-195018 may be used, if desired. Further, an oleophilic polymer binder is used together with a hydrophilic polymer binder.

The content of the polymer binder is preferably from 5 to 90% by weight, more preferably from 5 to 80% by weight, still more preferably from 10 to 70% by weight, based on the total solid content of the image-recording layer.

(2) Hydrophobilizing Precursor

According to the invention, a hydrophobilizing precursor can be used in order to improve the on-press development property. The hydrophobilizing precursor for use in the invention is a fine particle capable of converting the image-recording layer to be hydrophobic when heat is applied. The fine particle is preferably at least one fine particle selected from hydrophobic thermoplastic polymer fine particle, thermo-reactive polymer fine particle, polymer fine particle having a polymerizable group, microcapsule having a hydrophobic compound encapsulated and microgel (crosslinked polymer fine particle). Among them, polymer fine particle having a polymerizable group and microgel are preferred.

As the hydrophobic thermoplastic polymer fine panicle, hydrophobic thermoplastic polymer fine particles described, for example, in *Research Disclosure*, No. 33303, January (1992), JP-A-9-123387, JP-A-9-131850, JP-A-9-171249, JP-A-9-171250 and European Patent 931,647 are preferably exemplified.

Specific examples of the polymer constituting the polymer fine particle include a homopolymer or copolymer of a monomer, for example, ethylene, styrene, vinyl chloride, methyl acrylate, ethyl acrylate, methyl methacrylate, ethyl methacrylate, vinylidene chloride, acrylonitrile, vinyl carbazole or an acrylate or methacrylate having a polyalkylene structure and a mixture thereof. Among, them, polystyrene, a copolymer containing styrene and acrylonitrile and polymethyl methacrylate are more preferred.

The average particle size of the hydrophobic thermoplastic polymer fine particle for use in the invention is preferably from 0.01 to 2.0 μm.

The thermo-reactive polymer fine particle for use in the invention includes polymer fine particle having a thermo-reactive group and forms a hydrophobilized region by crosslinkage due to thermal reaction and change in the functional group involved therein.

As the thermo-reactive group of the polymer fine particle having a thermo-reactive group for use in the invention, although a functional group performing any reaction can be used as long as a chemical bond is formed, a polymerizable group is preferred. For instance, an ethylenically unsaturated group (for example, an acryloyl group, a methacryloyl group, a vinyl group or an allyl group) performing a radical polymerization reaction, a cationic polymerizable group (for example, a vinyl group, a vinyloxy group, an epoxy group or an oxetanyl group), an isocyanate group performing an addition reaction or a blocked form thereof an epoxy group, a vinyloxy group and a functional group having an active hydrogen atom (for example, an amino group, a hydroxy group or a carboxyl group) as the reaction partner thereof a carboxyl group performing a condensation reaction and a hydroxyl group or an amino group as the reaction partner thereof, and an acid anhydride performing a ring opening addition reaction and an amino group or a hydroxyl group as the reaction partner thereof are preferably exemplified.

As the microcapsule for use in the invention, microcapsule having all or part of the constituting components of the image-recording layer encapsulated as described, for example, in JP-A-2001-277740 and JP-A-2001-277742 is exemplified. The constituting components of the image-recording layer may be present outside the microcapsules. It is a more preferable embodiment of the image-recording layer containing microcapsules that hydrophobic constituting components are encapsulated in microcapsules and hydrophilic components are present outside the microcapsules.

The image-recording layer according to the invention may be an embodiment containing a crosslinked resin particle, that is, a microgel. The microgel can contain a part of the constituting components of the image-recording layer at least one of in the inside and on the surface thereof. Particularly, an embodiment of a reactive microgel containing a radical polymerizable group on the surface thereof is preferred in view of the image-forming sensitivity and printing durability.

As a method of microencapsulation or microgelation of the constituting components of the image-recording layer, known methods can be used.

The average particle size of the microcapsule or microgel is preferably from 0.01 to 3.0 μm, more preferably from 0.05 to 2.0 μm, particularly preferably from 0.10 to 1.0 μm. In the range described above, good resolution and good time lapse stability can be achieved.

The content of the hydrophobilizing precursor is preferably in a range from 5 to 90% by weight based on the total solid content of the image-recording layer.

(3) Hydrophilic Low Molecular Weight Compound

The image-recording layer according to the invention may contain a hydrophilic low molecular weight compound in order to improve the on-press development property without accompanying the decrease in the printing durability.

The hydrophilic low molecular weight compound includes a water-soluble organic compound, for example, a glycol compound, e.g., ethylene glycol, diethylene glycol triethylene glycol, propylene glycol, dipropylene glycol or tripropylene glycol, or an ether or ester derivative thereof, a polyol compound, e.g., glycerine, pentaerythritol or bis(2-hydroxyethyl) isocyanurate, an organic amine compound, e.g., triethanol amine, diethanol amine or monoethanol amine, or a salt thereof, an organic sulfonic acid compound, e.g., an alkyl sulfuric acid, toluene sulfonic acid or benzene sulfonic acid, or a salt thereof, an organic sulfamic acid compound, e.g., an alkyl sulfamic acid, or a salt thereof, an organic sulfuric acid compound, e.g., an alkyl sulfuric acid or an alkyl ether sulfuric acid, or a salt thereof, an organic phosphonic acid compound, e.g., phenyl phosphonic acid, or a salt thereof, an organic carboxylic acid, e.g., tartaric acid, oxalic acid, citric acid, malic acid, lactic acid, gluconic acid or an amino acid, or a salt thereof and a betaine compound.

According to the invention, it is preferred to incorporate at least one compound selected from a polyol compound, an organic sulfate compound, an organic sulfonate compound and a betaine compound into the image-recording layer.

Specific examples of the organic sulfonate compound include an alkylsulfonate, for example, sodium n-butylsulfonate, sodium n-hexylsulfonate, sodium 2-ethylhexylsulfonate, sodium cyclohexylsulfonate or sodium n-octylsulfonate; an alkylsulfonate containing an ethylene oxide chain, for example, sodium 5,8,11-trioxapentadocane-1-sulfonate, sodium 5,8,11-trioxaheptadecane-1-sulfonate, sodium 13-ethyl-5,8,11-trioxaheptadecane-1-sulfonate or sodium 5,8,11,14-tetraoxatetracosane-1-sulfonate; an arylsulfonate, for example, sodium benzenesulfonate, sodium p-toluenesulfonate, sodium p-hydroxybenzenesulfonate, sodium p-styrenesulfonate, sodium isophthalic acid dimethyl-5-sulfonate, sodium 1-naphtylsulfonate, sodium 4-hydroxynaphtylsulfate, disodium 1,5-naphthalenedisulfonate or trisodium 1,3,6-naphthalenetrisulfonate, and compounds described in Paragraph Nos. [0026] to [0031] of JP-A-2.007-276454 and Paragraph Nos. [0020] to [0047] of JP-A-2009-154525. The salt may also be potassium salt or lithium salt.

The organic sulfate compound includes a sulfate of alkyl, alkenyl, alkynyl, aryl or heterocyclic monoether of polyethylene oxide. The number of ethylene oxide unit is preferably from 1 to 4. The salt is preferably a sodium salt, a potassium salt or a lithium salt. Specific examples thereof include compounds described in Paragraph Nos. [0034] to [0038] of JP-A-2007-276454.

As the betaine compound, a compound wherein a number of carbon atoms included in a hydrocarbon substituent on the nitrogen atom is from 1 to 5 is preferred. Specific examples thereof include trimethylammonium acetate, dimethylpropylammonium acetate, 3-hydroxy-4-trimethylammoniobutyrate, 4-(1-pyridinio)butyrate, 1-hydroxyethyl-1-imidazolioacetate, trimethylammonium mathanesulfonate, dimethylpropylammonium methanesulfonate, 3-trimethylammonio-1-porpanesulfonate and 3-(1-pyridinio)-1 porpanesulfonate.

Since the hydrophilic low molecular weight compound has a small structure of hydrophobic portion and almost no surface active function, degradations of the hydrophobicity and film strength in the image area due to penetration of dampening water into the exposed area (image area) of the image-recording layer are prevented and thus, the ink receptive-property and printing durability of the image-recording layer can be preferably maintained.

The amount of the hydrophilic low molecular weight compound added to the image-recording layer is preferably from 0.5 to 20% by weight, more preferably from 1 to 15% by weight, still more preferably from 2 to 10% by weight, based on the total solid content of the image-recording layer. In the range described above, good on-press development property and printing durability are obtained.

The hydrophilic low molecular weight compounds may be used individually or as a mixture of two or more thereof.

(4) Oil-Sensitizing Agent

In order to improve the ink-receptive property, an oil-sensitizing agent, for example, a phosphonium compound, a nitrogen-containing low molecular weight compound or an ammonium group-containing polymer can be used in the image-recording layer. In particular, in the case where an inorganic stratiform compound is incorporated into a protective layer, the oil-sensitizing agent functions as a surface covering agent of the inorganic stratiform compound and prevents deterioration of the ink-receptive property during printing due to the inorganic stratiform compound.

As preferable examples of the phosphonium compound, phosphonium compounds described in JP-A-2006-297907 and JP-A-2007-50660 are exemplified. Specific examples of the phosphonium compound include tetrabutylphosphonium iodide, butyltriphenylphosphonium bromide, tetraphenylphosphonium bromide, 1,4-bis(tripherzylphosphonio)butane di(hexafluoropbosphate), 1,7-bis(triphenylphosphonio)heptane sulfate and 1,9-bis(triphenylphosphonio)nonane naphthalene-2,7-disulfonate.

As the nitrogen-containing low molecular weight compound, an amine salt and a quaternary ammonium salt are exemplified. Also, an imidazolinium salt, a benzimidazolinium salt, a pyridinium salt and a quinolinium salt are exemplified. Of the nitrogen-containing low molecular weight compounds, the quaternary ammonium salt and pyridinium salt are preferably used. Specific examples the nitrogen-containing low molecular weight compound include tetrmethylammonium hexyfluorophosphate, tetrabutylammonium hexafluorophosphate, dodecyltrimethylammonium p-toluenesulfonate, benzyltriethylammonium hexafluorophosphate, benzyldimethyloctylammonium hexafluorophosphate, benzyldimethyldodecylammonium hexaflurophosphate and compounds described in Paragraph Nos. [0021] to [0037] of JP-A-2008-284858 and Paragraph Nos. [0030] to [0057] of JP-A-2009-90645.

The ammonium group-containing polymer may be any polymer containing an ammonium group in its structure and is preferably a polymer containing from 5 to 80% by mole of (methacrylate having an ammonium group in its side chain as a copolymerization component. Specific examples thereof include polymers described in Paragraph Nos. [0089] to [0105] of JP-A-2009-208458.

As to the ammonium group-containing polymer, its reduced specific viscosity value (unit ml/g) determined according to the measuring method described below is preferably from 5 to 120, more preferably from 10 to 110, particularly preferably from 15 to 100. When the reduced specific viscosity value described above is calculated in terms of weight average molecular weight, from 10,000 to 150,000 is preferred, from 17,000 to 140,000 is more preferred, and 20,000 to 130,000 is particularly preferred.

<Measuring Method of Reduced Specific Viscosity>

In a 20 ml measuring flask was weighed 1.0 g of polymer and the measuring flask was filled up to the gauge line with N-methylpyrrolidone. The resulting solution was allowed to stand in a thermostatic bath of 30° C. for 30 minutes and put into an Ubbelohde viscometer (viscometer constant: (0.010 cSt/s) and a period for miming down of the solution at 30° C. was measured. The measurement was conducted twice for the same sample and an average value of the measurement was determined. The measurement was also conducted for a blank (only N-methyl pyrrolidone) in the same manner. The reduced specific viscosity was calculated according to the formula shown below.

$$\text{Reduced specific viscosity (ml/g)} = \frac{\dfrac{\text{Period for running down of sample solution (sec)} - \text{Period for running down of blank (sec)}}{\text{Period for running down of blank (sec)}}}{3.33\,(g) \times \dfrac{30}{100}}$$
$$20\,(ml)$$

Specific examples of the ammonium group-containing polymer are set forth below.
(1) 2-(Trimethylammonio)ethyl methacrylate p-toluenesulfonate/3,6-dioxaheptyl methacrylate copolymer (molar ratio: 10,90, Mw: 45,000)
(2) 2-(Trimethylammonio)ethyl methacrylate hexafluorophosphate/3,6-dioxaheptyl methacrylate copolymer (molar ratio: 20/80, Mw: 60,000)
(3) 2-(Ethyldimethylammonio)ethyl methacrylate p-toluenesulfonate/hexyl methacrylate copolymer (molar ratio: 30/70, Mw: 45,000)
(4) 2-(Trimethylammonio)ethyl methacrylate hexafluorophosphate/2-ethylhexyl methacrylate copolymer (molar ratio: 20/80, Mw: 60,000)
(5) 2-(Trimethylammonio)ethyl methacrylate methylsulfate/hexyl methacrylate copolymer (molar ratio: 40/60, Mw: 70,000)
(6) 2-(Butyldimethylammonio)ethyl methacrylate hexafluorophosphate/3,6-dioxaheptyl methacrylate copolymer (molar ratio: 25/75, Mw: 65,000)
(7) 2-(Butyldimethylammonio)ethyl acrylate hexafluorophosphate/3,6-dioxaheptyl methacrylate copolymer (molar ratio: 20/80, Mw: 65,000)
(8) 2-(Butyldimethylaminonio)ethyl methacrylate 13-ethyl-5,8,11-trioxa-1-heptadecanesulfonate/3,6-dioxaheptyl methacrylate copolymer (molar ratio: 20/80, Mw: 75,000)
(9) 2-(Butyldimethylammonio)ethyl methacrylate hexafluolophosphate/3,6-dioxaheptyl methactylate/2-hydroxy-3-methacryloyloxypropyl methacrylate copolymer (molar ratio: 15/80/5, Mw: 65,000)

The content of the oil-sensitizing agent is preferably from 0.01 to 30.0% by weight, more preferably from 0.1 to 15.0% by weight, still more preferably from 1 to 10% by weight, based on the total solid content of the image-recording layer.

(5) Chain Transfer Agent

The image-recording layer preferably further contains a chain transfer agent. As the chain transfer agent, for example, compounds having SH, PH, SiH or GeH in their molecules are used. The compound donates hydrogen to a low active radical species to generate a radical or is oxidized and deprotonized to generate a radical.

In particular, a thiol compound (for example, a 2-mercaptobenzimidazole, 2-mercaptobenzothiazole, a 2-mercaptobenzoxazole, a 3-mercaptotriazole or a 5-mercaptotetrazole) can be preferably used as the chain transfer agent in the image-recording layer.

The content of the chain transfer agent is preferably from 1 to 10% by weight based on the total solid content of the image-recording layer.

(6) Others

Other components, for example, a surfactant, a coloring agent, a print-out agent, a polymerization inhibitor, a higher fatty acid derivative, a plasticizer, an inorganic fine particle or an inorganic stratiform compound may further be added to the image-recording layer. Specifically, compounds and amounts added thereof described, for example, in Paragraph Nos. [0114] to [0159] of JP-A-2008-284817, Paragraph Nos. [0023] to [0027] of JP-A-2006-91479 and Paragraph No. of U.S. Patent Publication No. 2008/0311520 are preferably used.

(F) Formation of Image-Recording Layer

The image-recording layer according to the invention is formed by dispersing or dissolving each of the necessary constituting components described above in a solvent to prepare a coating solution and coating the solution on a support by a known method, for example, bar coater coating and drying as described in Paragraph Nos. [0142] to [0143] of JP-A-2008-195018. The coating amount (solid content) of the image-recording layer formed on a support after coating and drying may be varied according to the intended purpose but is in general preferably from 0.3 to 3.0 g/m$^2$. In the range described above, good sensitivity and good film property of the image-recording layer can be obtained.

It is preferred that an unexposed area of the image-recording layer can be removed by supplying a developer having pH from 2 to 11 after image exposure. Such an image-recording layer can be constructed by appropriately adjusting at least one of the kinds and amounts of the respective components of the image-recording layer.

It is also preferred that an unexposed area of the image-recording layer can be removed by supplying at least one of printing ink and dampening water on a printing machine after image exposure. Such an image-recording layer can be constructed by appropriately adjusting at least one of the kinds and amounts of the respective components of the image-recording layer.

The solvent used in the coating solution include, for example, 2-butanone, ethylene glycol monomethyl ether, 1-methoxy-2-propanol, 2-methoxyethyl acetate, 1-methoxy-2-propyl acetate and γ-butyrolactone, but the invention should not be construed as being limited thereto. The solvents may be used individually or as a mixture. The solid content concentration of the coating solution is preferably from 1 to 50% by weight.

The coating amount (solid content) of the image-recording layer on the support after the coating and drying is preferably from 0.3 to 3.0 g/m$^2$. Various methods can be used for the coating. Examples of the method include bar coater coating, spin coating, spray coating, curtain coating, dip coating, air knife coating, blade coating and roll coating.

(Undercoat Layer)

In the lithographic printing plate precursor according to the invention, an undercoat layer (also referred to as an intermediate layer) is preferably provided between the image-recording layer and the support. The undercoat layer strengthens adhesion between the support and the image-recording layer in the exposed area and makes removal of the image-recording layer from the support easy in the unexposed area, thereby contributing improvement in the developing property without accompanying degradation of the printing durability.

In the case where the undercoat layer is provided, the specific polymer compound (D) described above is used as a compound for the undercoat layer. In the case where the image-recording layer contains the specific polymer compound (D), the undercoat layer need not be provided, and when the undercoat layer is provided, a polymer compound for the undercoat layer is not restricted.

The undercoat layer may contain a known chelating agent, secondary or tertiary amine, polymerization inhibitor, compound containing an amino group or a functional group having polymerization inhibition ability and a group capable of interacting with a surface of aluminum support or the like (for example, 1,4-diazabicyclo[2,2,2]octane (DABCO), 2,3,5,6-tetrahydroxy-p-quinone, chloranil, sulfophthalic acid, hydroxyethylethylenediaminetriacetic acid, dihydroxyethylethylenediaminediacetic acid or hydroxyethyliminodiacetic acid) in addition to the polymer compound.

The undercoat layer is coated according to a known method. The coating amount (solid content) of the undercoat layer is preferably from 0.1 to 100 mg/m$^2$, and more preferably from 1 to 30 mg/m$^2$.

(Protective Layer)

in the lithographic printing plate precursor according to the invention, it is preferred to provide a protective layer (overcoat layer) on the image-recording layer. The protective layer has a function for preventing, for example, occurrence of scratch in the image-recording layer or ablation caused by exposure with a high illuminance laser beam, in addition to the function for restraining an inhibition reaction against the image formation by means of oxygen blocking.

With respect to the protective layer having such properties, there are described, for example, in U.S. Pat. No. 3,458,311 and JP-B-55-49729. As a polymer having low oxygen permeability for use in the protective layer, any water-soluble polymer and water-insoluble polymer can be appropriately selected to use. The polymers may be used in mixture of two or more thereof, if desired. Specifically, for example, polyvinyl alcohol, a modified polyvinyl alcohol, polyvinyl pyrrolidone, a water-soluble cellulose derivative and poly(meth)acrylonitrile are exemplified.

As the modified polyvinyl alcohol, an acid-modified polyvinyl alcohol having a carboxyl group or a sulfo group is preferably used. Specifically, modified polyvinyl alcohols described in JP-A-2005-250216 and JP-A-2006-259137 are preferably exemplified.

It is also preferred for the protective layer to contain an inorganic stratiform compound, for example, natural mica or synthetic mica as described in JP-A-2005-119273 in order to increase the oxygen blocking property.

Further, the protective layer may contain a known additive, for example, a plasticizer fOr imparting flexibility, a surfactant for improving a coating property or a fine inorganic particle for controlling a surface slipping property. The oil-sensitizing agent described with respect to the image-recording layer may also be incorporated into the protective layer.

The protective layer is coated according to a known method. The coating amount of the protective layer is preferably in a range from 0.01 to 10 g/m$^2$, more preferably in a range from 0.02 to 3 g/m$^2$, most preferably in a range from 0.02 to 1 g/m$^2$, in terms of the coating amount after drying.

(Support)

As the support for use in the lithographic printing plate precursor according to the invention, a known support is used. Particularly, an aluminum plate subjected to roughening treatment and anodizing treatment according to a known method is preferred.

Also, an enlarging treatment or a sealing treatment of micropores of the anodized film described in JP-A-2001-253181 and JP-A-2001-322365 or a surface hydrophilizing treatment, for example, with an alkali metal silicate as described in U.S. Pat. Nos. 2,714,066, 3,181,461, 3,280,734 and 3,902,734 or polyvinyl phosphonic acid as described in U.S. Pat. Nos. 3,276,868, 4,153,461 and 4,689,272 may be appropriately selected and applied to the aluminum plate, if desired.

The support preferably has a center line average roughness from 0.10 to 1.2 μm.

The support according to the invention may have a backcoat layer containing an organic polymer binder described in JP-A-5-45885 or an alkoxy compound of silicon described in JP-A-6-35174, provided on the back surface thereof, if desired.

[Plate Making Method]

The lithographic printing plate precursor according to the invention is exposed imagewise and then subjected to development processing to prepare a lithographic printing plate. The development processing includes (1) a method of developing with an alkali developer (having pH higher than 11), (2) a method of developing with a developer having pH from 2 to 11, and (3) a method of developing (on-press development) by supplying dampening water and/or ink on a printing machine. According to the invention, (2) the method of developing with a developer having pH from 2 to 11 or (3) the method of developing (on-press development) by supplying dampening water and/or ink on a printing machine is preferred.

<On-Press Development Method>

The on-press development is conducted by mounting the imagewise exposed lithographic printing plate precursor on a printing machine without undergoing any development processing and supplying oily ink and an aqueous component to initiate printing. Specifically, at an early stage of the course of printing, the unexposed area of the image-recording layer is removed by dissolution or dispersion with the oily ink and/or aqueous component and as hydrophilic surface of the support is revealed therewith to form the non-image area. On the other hand, the image-recording layer cured by the exposure forms the oily ink receptive area (image area) having an oleophilic surface. As a result, the aqueous component adheres onto the revealed hydrophilic surface and the oily ink adheres onto the exposed area of the image-recording layer so that conventional printing can be conducted.

The imagewise exposure may be performed on a printing machine after the lithographic printing plate precursor is mounted on the printing machine or may be separately performed using a platesetter or the like. As the oily ink and aqueous component, printing ink and dampening water for conventional lithographic printing can be employed, respectively.

While either the dampening water or printing ink may be supplied at first on the surface of lithographic printing plate precursor, it is preferred to supply the printing ink at first in view of preventing the dampening water from contamination with the component of the image-recording layer removed.

<Method of Developing with Developer Having pH from 2 to 11>

According to a conventional developing process using an alkali developer as the method (1), a protective layer is removed in a pre-water washing step, the alkali development is conducted, the alkali is removed by washing with water in a post-water washing step, gum solution treatment is concluded and drying is conducted in a drying step. On the contrary, in the case of conducting the development of the lithographic printing plate precursor according to the invention using a developer having pH from 2 to 11, the protective layer and the unexposed area of the image-recording layer are together removed so that the resulting lithographic priming plate can be immediately mounted on a printing machine to perform printing. By incorporating a surfactant and/or a water-soluble polymer of oil-desensitization property into such a developer having from 2 to 11, the development and guru solution treatment are conducted at the same time so that the post-water washing step is not particularly necessary and after conducting the development and gum solution treatment with one solution, the diving step can be performed. It is preferred that after the development and gum treatment, the excess developer is removed using a squeeze roller, followed by conducting the drying. Specifically, a considerably simplified processing process (gum development) composed of development and gum treatment with one solution and drying can be conducted.

The development according to the invention is performed at liquid temperature ordinarily from 0 to 60° C., preferably from 15 to 40° C. using, for example, a method wherein the imagewise exposed lithographic, printing plate precursor is immersed in the developer and rubbed with a brush or a method wherein the developer is sprayed to the imagewise exposed lithographic printing plate precursor and the exposed lithographic printing plate precursor is rubbed with a brush.

The developer having pH from 2 to 11 is preferably an aqueous solution containing water as a main component (containing 60% by weight or more of water based on weight of the developer), in particular, an aqueous solution containing a surfactant (for example, an anionic, nonionic, cationic or amphoteric surfactant) or an aqueous solution containing a water-soluble polymer is preferred. An aqueous solution containing both the surfactant and the water-soluble polymer is also preferred. The pH of the developer is more preferably from 5 to 10.7, still more preferably from 6 to 10.5, and most preferably from 7.5 to 10.3.

The anionic surfactant for use in the developer is not particularly limited and includes, for example, fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkyldiphenylether (di)sulfonic acid salts, alkylphenoxy polyoxyethylene propylsulfonic acid salts, polyoxyethylene alkylsulfophenyl ether salts, N-alkyl-N-olcyltaurine sodium salt, N-alkylsulfosuccinic acid monoamide disodium salts, petroleum sulfonic acid salts, sulfated castor oil, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Of the compounds, alkylbenzenesulfonic acid salts, alkylnaphthalenesulfonic acid salts and alkyldiphenylether (di)sulfonic acid salts are particularly preferably used.

The cationic surfactant for use in the developer is not particularly limited and hitherto known cationic surfactants may be used. For example, alkylamine salts, quaternary ammonium salts, alkylimidazolinium salts, polyoxyethylene alkyl amine salts and polyethylene polyamine derivatives are exemplified.

The nonionic surfactant for use in the developer is not particularly limited and includes, for example, polyethylene glycol type higher alcohol ethylene oxide adducts, alkylphenol ethylene oxide adducts, alkylnaphthol ethylene oxide adducts, phenol ethylene oxide adducts, naphthol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, ethylene oxide addacts of fat, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines. Of the compounds, those having an aromatic ring and an ethylene oxide chain are preferred, and alkyl-substituted or unsubstituted phenol ethylene oxide adducts and alkyl-substituted or unsubstituted naphthol ethylene oxide adducts are more preferred.

The amphoteric surfactant for use in the developer is not particularly limited and includes, for instance, amine oxide type, for example, alkyldimethylamine oxide, betaine type, for example, alkyl betaine and amino acid type, for example, sodium salt of alkylamino fatty acid. In particular, an alkyldimethylamine oxide which may have a substituent an alkyl carboxy betaine which may have a substituent and an alkyl sulfo betaine which may have a substituent are preferrably used. Specific examples of the compound are described, for example, in Paragraph Nos. [0255] to [0278] of JP-A-2008-203359 and Paragraph Nos. [0028] to [0052] of JP-A-2008-276166. Specific examples of the more preferable compound include 2-alkyl-N-carboxymethyl-N-hydroxyethyl imidazolinium betaine, alkyldiaminoethylglycine hydrochloride, lauryldimethylaminoacetic acid betaine, N-lauric acid amidopropyldimethyl betaine and N-lauric acid amidopropyldimethylamine oxide.

Two or more surfactants may be used in combination. The content of the surfactant in the developer is preferably from 0.01 to 20% by weight, and more preferably from 0.1 to 10% by weight.

The water-soluble polymer for use in the developer having pH from 2 to 11 includes, for example, soybean polysaccharide, modified starch, gum arabic, dextrin, a cellulose derivative (for example, carboxymethyl cellulose, carboxyethyl cellulose or methyl cellulose) or a modified product thereof, pllulan, polyvinyl alcohol or a derivative thereof, polyvinyl pyrrolidone, polyacrylamide, an acrylamide copolymer, a vinyl methyl ether/maleic anhydride copolymer, a vinyl acetate/maleic anhydride copolymer and a styrene/maleic anhydride copolymer.

As the soybean polysaccharide, known soybean polysaccharide can be used. For example, as a commercial product, SOYAFIVE (trade name, produced by Fuji Oil Co., Ltd.) is available and various grade products can be used. The soybean polysaccharide preferably used is that having viscosity in a range from 10 to 100 mPa/sec in the 10% by weight aqueous solution thereof.

As the modified starch, known modified starch can be used. The modified starch can be prepared, for example, by a method wherein starch, for example, of corn, potato, tapioca, rice or wheat is decomposed, for example, with an acid or an enzyme to an extent that the number of glucose residue per molecule is from 5 to 30 and then oxypropylene is added thereto in an alkali.

Two or more water-soluble polymer compounds may be used in combination. The content of the water-soluble polymer in the developer is preferably from 0.1 to 20% by weight, and more preferably from 0.5 to 10% by weight.

Into the developer having pH from 2 to 11 for use in the invention, a pH buffer agent may further be incorporated.

As the pH buffer agent used in the invention, a pH buffer agent exhibiting a pH buffer function at pH from 2 to 11 is used without particular restriction. In the invention, a weak alkaline buffer agent is preferably used and includes, for example, (a) a carbonate ion and a hydrogen carbonate ion, (b) a borate ion, (c) a water-soluble amine compound and an ion of the water-soluble amine compound, and combinations thereof. Specifically, for example, (a) a combination of a carbonate ion and a hydrogen carbonate ion, (b) a borate ion, or (c) a combination of a water-soluble amine compound and an ion of the water-soluble amine compound exhibits a pH buffer function in the developer to prevent fluctuation of the pH even when the developer is used for a long period of time. As a result, for example, the deterioration of developing property resulting from the fluctuation of pH and the occurrence of development sewn are restrained. The combination of a carbonate ion and a hydrogen carbonate ion is particularly preferred.

In order for a carbonate ion and a hydrogen carbonate ion to be present in the developer, a carbonate and a hydrogen carbonate may be added to the developer or a carbonate ion and a hydrogen carbonate ion may be generated by adding a carbonate or a hydrogen carbonate to the developer and then adjusting the pH. The carbonate or hydrogen carbonate used is not particularly restricted and it is preferably an alkali metal salt thereof. Examples of the alkali metal include lithium, sodium and potassium and sodium is particularly preferable. The alkali metals may be used individually or in combination of two or more thereof.

When the combination of (a) a carbonate ion and a hydrogen carbonate ion is adopted as the pH buffer agent, the total amount of the carbonate ion and hydrogen carbonate ion is preferably from 0.05 to 5 mole/l, more preferably from 0.1 to 2 mole/l, particularly preferably from 0.2 to 1 in the developer.

The developer may contain an organic solvent. As the organic solvent to be contained, for example, an aliphatic hydrocarbon (e.g., hexane, heptane, Isopar E, Isopar H, Isopar G (produced by Esso Chemical Co., Ltd.)), an aromatic hydrocarbon (e.g., toluene or xylem), a halogenated hydrocarbon (methylene dichloride, ethylene dichloride, trichlene or monochlorobenzene) or a polar solvent is exemplified. Examples of the polar solvent include an alcohol (e.g., methanol, ethanol, propanol, isopropanol, 1-butanol, 1-pentanoi, 1-hexanol, 1-heptanol, 1-octanol, 2-octanol, 2-ethyl-1-hexanol, 1-nonanol, 1-decanol, benzyl alcohol, ethylene glycol monomethyl ether, 2-ethyoxyethanol, diethylene glycol monoethyl ether, diethylene glycol monohexyl ether, triethylene glycol monomethyl ether, propylene glycol monoethyl ether, propylene glycol monomethyl ether, polyethylene glycol monomethyl ether, polypropylene glycol, tetraethylene glycol, ethylene glycol monobutyl ether, ethylene glycol monobenzyl ether, ethylene glycol monophenyl ether, propylene glycol monophenyl ether, methyl phenyl carbinol, n-amyl alcohol or methylamyl alcohol), a ketone (e.g., acetone, methyl ethyl ketone, ethyl butyl ketone, methyl isobutyl ketone or cyclohexanone), an ester (e.g., ethyl acetate, propyl acetate, butyl acetate, amyl acetate, benzyl acetate, methyl lactate, butyl lactate, ethylene glycol monobutyl acetate, polyethylene glycol monomethyl ether acetate, diethylene glycol acetate, diethyl phthalate or butyl levulinate) and others (e.g., triethyl phosphate, tricresyl phosphate, N-phenylethanolamine, N-phenyldiethanolatnine, N-methyldiethanolamine, N-ethyldiethanolamine, 4-(2-hydroxyethyl)morpholine, N,N-dimethylacetamide or N-methylpyrrolidone).

Two or more organic solvents may be used in the developer.

Further, when the organic solvent is insoluble in water, it may be employed by being solubilized in water using a surfactant or the like. In the case where the developer contains an organic solvent, the concentration of the organic solvent is desirably less than 40% by weight in view of safety and inflammability.

The developer having pH from 2 to 11 may contain a preservative, a chelating agent, a defoaming agent, an organic acid, an inorganic acid, an inorganic salt or the like in addition the components described above. Specifically, compounds described in Paragraph Nos. [0266] to [0270] of JP-A-2007-206217 are preferably used.

The developer described above can be used as a developer and a development replenisher for the exposed lithographic printing plate precursor and it is preferably applied to an automatic processor described hereinafter. In the case of conducting the development processing using an automatic processor, the processing solution becomes fatigued in accordance with the processing amount, and hence the processing ability may be restored using a replenisher or a fresh developer.

The development processing using the developer having pH from 2 to 11 according to the invention is preferably performed by an automatic processor equipped with a supplying means for the developer and a rubbing member. An automatic processor using a rotating brush roll as the rubbing member is particularly preferred. Further, the automatic processor is preferably provided with a means for removing the excess developer, for example, a squeeze roller or a drying means, for example, a hot air apparatus, subsequently to the development processing means.

Further, in the plate making process of preparing a lithographic printing plate from the lithographic printing plate precursor according to the invention, the lithographic printing plate precursor may be heated its entire surface before or during the exposure or between the exposure and the development, if desired. By the heating, the image-forming reaction in the image-recording layer is accelerated and advantages, for example, improvement in the sensitivity and printing durability and stabilization of the sensitivity are achieved. For the purpose of increasing the image strength and printing durability, it is also effective to perform entire after-heating or entire exposure of the image after the development. Ordinarily, the heating before the development is preferably performed under a mild condition of 150° C. or lower. When the temperature is too high, a problem may arise sometimes in that the unexposed area is also cured. On the other hand, the heating after the development can be performed using very strong conditions. Ordinarily, the heat treatment is carried out in a temperature range from 100 to 500° C. When the temperature is too low, a sufficient effect of strengthening the image may not be obtained, whereas when it is excessively high, problems of deterioration of the support and thermal decomposition of the image area may occur sometimes.

<Image Exposure>

In advance of the above-described development processing, the lithographic printing plate precursor is imagewise exposed with laser through a transparent original having a line image, a halftone dot image or the like, or imagewise exposed, for example, by scanning of laser beam based on digital data.

The wavelength of the exposure light source is preferably from 350 to 450 nm or from 750 to 1,400 nm. In case of exposing with light of 350 to 450 nm, the lithographic printing plate precursor having an image-recording layer containing a sensitizing dye having an absorption maximum in such a wavelength range is used. In case of exposing with light of 750 to 1,400 nm, the lithographic printing plate precursor containing an infrared absorbing agent which is a sensitizing dye having an absorption maximum in such a wavelength range is used. As the light source of 350 to 450 nm, a semiconductor laser is preferably used. As the light source of 750 to 1,400 nm, a solid laser or semiconductor laser emitting an infrared ray is preferably used. The exposure mechanism may be any of an internal drum system, an external drum system and a flat bed system.

With respect to the infrared ray laser, the output is preferably 100 mW or more, the exposure time per pixel is preferably within 20 microseconds, and the irradiation energy is preferably from 10 to 300 mJ/cm$^2$.

With respect to the laser exposure, in order to reduce the exposure time, it is preferred to use a multibeam laser device.

In case of the lithographic printing plate precursor requiring development processing with a developer, the lithographic printing plate precursor is imagewise exposed and subjected to development processing to prepare a lithographic printing plate and the resulting lithographic printing plate is mounted on a plate cylinder of a printing machine to conduct printing.

In case of the lithographic printing plate precursor of on-press development type, the lithographic printing plate precursor is imagewise exposed and then mounted as it is on a plate cylinder of a printing machine to initiate printing. In case of using a priming machine equipped with a laser exposure apparatus, the lithographic printing plate precursor is mounted on a plate cylinder of the printing machine and then subjected to the imagewise exposure.

EXAMPLES

The present invention will be described in more detail with reference to the following examples, but the invention should not be construed as being limited thereto. In the examples, a molecular weight of polymer compound is expressed as a weight average molecular weight (Mw). A ratio of repeating unit of the specific polymer compound according to the invention and a comparative polymer compound is expressed in weight percentage, and a ratio of repeating unit of other polymer compound is expressed in molar percentage.

Synthesis Example of Specific Polymer Compound

Synthesis Example 1

Synthesis of Specific Polymer Compound (1)

(1) Synthesis of N-aminoethylmethacrylamide

In a mixture of 100 ml of methanol and 96 g of distilled water was dissolved 24.04 g (0.4 mol) of ethylenediamine and to the solution was added 104 g (0.52 mmol) of 5.0 NI hydrochloric acid while cooling with ice. To the mixture was dropwise added 61.65 g of methacrylic anhydride while maintaining at −10° C. and after the completion of the dropwise addition, the mixture was stirred at −10° C. for 2 hours. Then, 400 ml of ethyl acetate was added to the mixture to conduct extraction and the aqueous layer was collected. To the aqueous layer was added 21 g (0.52 mol) of sodium hydroxide, the white crystals deposited were removed by filtration, and extraction treatment was conducted with 400 ml of acetonitrile. The acetonitrile solution was dried on 40 g of magnesium sulfate for 2 hours and the acetonitrile was distilled off to obtain 14.4 g (yield: 28%) of N-aminoethylmethacrylamide.

(2) Separatory Purification of LIGHT-ESTER P-1M

An aqueous solution prepared by dissolving 40.0 g of LIGHT-ESTER P-1M (produced by Kyoeisha Chemical Co., Ltd.) in 100 g of distilled water was subjected twice to separatory purification with 100 g of diethylene glycol dibutyl ether to obtain an aqueous solution of LIGHT-ESTER PAM (concentration: 10.5% by weight).

(3) Polymerization Step

To a 200 ml flask equipped with a condenser and a stirrer was charged 27.32 g of distilled water and heated to 55° C. under nitrogen stream. A solution composed of 0.71 g of N-aminoethylmethacrylamide synthesized above, 20.01 g of the aqueous solution of LIGHT-ESTER P-1M purified above, 6.83 g of 3-sulfonatopropyl[3-(methacryloyloxy)ethyl]dimethylammonium (produced by Sigma-Aldrich Corp.), 0.386 g of a polymerization initiator (VA046B, produced by Wako Pure Chemical Industries, Ltd.) and 9.41 g of distilled water was dropwise added to the distilled water in the 200 ml flask over a period of 2 hours. After the completion of the dropwise addition, the mixture was stirred at 55° C. for 2 hours, 0.386 g of a polymerization initiator (VA046B, produced by Wako Pure Chemical industries, Ltd.) was added thereto and further stirred at 55° C. for 2 hours to obtain a precursor of Specific polymer compound (1).

To 50.0 g of the precursor of Specific polymer compound (1) was added 1.38 g of sodium hydroxide to be dissolved, and the solution was raised to 40° C., 7.23 g of KARENZ MO1 (produced by Showa Denko K.K.) was added thereto and stirred at 40° C. for 6 hours. Then, the white crystals deposited were removed by filtration and to the resulting solution was added 8.83 g of AMBERLYST R15 (produced by Sigma-Aldrich Corp.). The mixture was stirred at room temperature for 2 hours and then the AMBERLYST R15 was removed by filtration to obtain Specific polymer compound (1). A weight average molecular weight (Mw) of Specific polymer compound (1) thus-obtained was measured by a gel permeation chromatography (GPC) method using polyethylene glycol as a standard substance and found to be 150,000.

Synthesis Example 2

Synthesis of Specific Polymer Compound (33)

(1) Synthesis of 4-sulfonatobutyl[3-(methaeryloylamino)propyl]dimethylammonium

In 380 ml of acetonitrile were dissolved 130 g (0.764 mol) of N-[3-(dimethylamino)propyl]methacrylamide, 104 g of butanesultone and 234 mg of 4-hydroxy-2,2,6,6-tetramethylpiperidinoxy and the solution was heated at 70° C. for 6 hours. After allowing to cooling, to the reaction mixture were added 1,350 ml of acetone and 150 ml of methanol and the mixture was stirred at room temperature for one hour. The crystals deposited were collected by filtration and thoroughly washed with acetone to obtain 200.0 g (yield: 85%) of 4-sulfonatobutyl[3-(methacryloylamino)propyl]dimethylammonium.

(2) Polymerization Step

To a 200 ml flask equipped with a condenser and a stirrer was charged 40.85 g of distilled water and heated to 55° C. under nitrogen stream. A solution composed of 1.07 g of N-aminoethylmethacrylamide synthesized above, 29.92 g of the aqueous solution of LIGHT-ESTER P-1M purified above, 4.71 g of 4-sulfonatobutyl[3-(methacryloylamino)propyl]dimethylammonium synthesized above, 5.50 g of BRENNER. PME4000 (produced by NOF Corp.), 0.386 g of a polymerization initiator (VA04613, produced by Wako Pure Chemical Industries, Ltd.) and 14.07 g of distilled water was dropwise added to the distilled water in the 200 ml flask over a period of 2 hours. After the completion of the dropwise addition, the mixture was stirred at 55° C. for 2 hours, 0.386 g of a polymerization initiator (VA046B, produced by Wako Pure Chemical Industries, Ltd.) was added thereto and further stirred at 55° C. for 2 hours to obtain a precursor of Specific polymer compound (33).

To 50.0 g of the precursor of Specific polymer compound (33) was added 1.36 g of sodium hydroxide, and the solution was raised to 40° C., 7.25 g of KARENZ MOI (produced by Showa Denko K.K.) was added thereto and stirred at 40° C. for 6 hours. Then, the white crystals deposited were removed by filtration and to the resulting solution was added 8.67 g of AMBERLYST R15 (produced by Sigma-Aldrich Corp.). The mixture was stirred at room temperature for 2 hours and then the AMBERLYST R15 was removed by filtration to obtain Specific polymer compound (33). A weight average molecular weight (Mw) of Specific polymer compound (33) thus-obtained was measured by a gel permeation chromatography (GPC) method using polyethylene glycol as a standard substance and found to be 210,000.

Synthesis Example 3

Synthesis of Specific Polymer Compound (84)

(1) Synthesis of N-(2-aminoethyl)methacrylamide monophosphate

To a 2 liter 3-necked flask were charged 27.0 g of ethylenediamine (produced by Wako Pure Chemical Industries, Ltd.), 225 g of ion-exchanged water and 225 g of methanol and the mixture was cooled to inner temperature of 5'C. To the mixture was added 114.3 g of benzoic acid (produced by Wako Pure Chemical Industries, Ltd.) and 118.08 g of methacrylic anhydride (produced by Sigma-Aldrich Corp.) was dropwise added thereto over a period of one hour while maintaining the inner temperature at 5° C. or lower. After the completion of the dropwise addition, the mixture was stirred for 3 hours while maintaining the inner temperature at 5° C. or lower, returned to room temperature and an aqueous 85% by weight phosphoric acid solution (produced by Wako Pure Chemical Industries, Ltd.) was added thereto to adjust pH of the reaction solution to 3.0.

To the reaction solution were added 1064.1 g of ethyl acetate and 327 g of ion-exchanged water to conduct extraction purification and the aqueous layer was collected. The aqueous layer was washed twice with one liter of ethyl acetate and then once with one liter of hexane and then 13.5 mg of 4-hydroxy-2,2,6,6-tetramethylpiperidinyl-N-oxyl to obtain 366.0 g (yield: 45%) of N-(2-aminoethyl)methacrylamide monophosphate (12.5% by weight aqueous solution).

(2) Polymerization Step

To a 500 ml flask equipped with a condenser and a stirrer was charged 41.72 g of distilled water and heated to 55° C. under nitrogen stream. A solution composed of 7.30 g of the aqueous solution of N-(2-aminoethyl)methacrylamide monophosphate synthesized above, 26.12 g of the aqueous solution of LIGHT-ESTER P-1M purified above, 6.38 g of 4-sulfonatobutyl[3-(methacryloylamino)propyl]dimethylammonium synthesized above, 8.21 g of BREMMER PME4000 (produced by NOF corp.), 0.385 g of a polymerization initiator (VA046B, produced by Wako Pure Chemical Industries, Ltd.) and 14.51 g of distilled water was dropwise added to the distilled skater in the 500 ml flask over a period of 2 hours. After the completion of the dropwise addition, the mixture was stirred at 55° C. for 2 hours, 0.385 g of a polymerization initiator (VA046B, produced by Wako Pure Chemical Industries, Ltd.) was added thereto and the temperature was raised to 80° C., followed by stirring for 2 hours to obtain a precursor of Specific polymer compound (84).

To 100.0 g of the precursor of Specific polymer compound (84) were added 11.2 g of an aqueous 30% by weight sodium hydroxide solution and 10 mg of 4-hydroxy-2,2,6,6-tetramethylpiperidinyl-N-oxyl and the solution was raised to 55° C., 3.13 g of KARENZ MOI (produced by Showa Denko K.K.) was added thereto and stirred for 3 hours. After allowing to cooling to room temperature, extraction purification was conducted by adding 204 g of tert-butyl methyl ether and 48.7 g of distilled water to obtain Specific polymer compound (84). A weight average molecular weight (Mw) of Specific polymer compound (84) thus-obtained was measured by a gel permeation chromatography (GPC) method using polyethylene glycol as a standard substance and found to be 240,000.

The structure of the polymer compound obtained in each of Synthesis Examples 1 to 3 above was confirmed by 1H-NMR measurement (400 MHz, D2O) and as a result, the signals of an ethylenic proton of methacryloyloxy group introduced into a side chain of the polymer were observed around δ=5.7 ppm and 6.2 ppm.

The specific polymer compounds used in the examples were synthesized by changing the monomer component for repeating unit in the synthesis examples described above and further using an existing synthesis method, if desired.

Examples 1 to 33, 74 to 98 and 124 to 126 and Comparative Examples 1 to 6

1. Lithographic Printing Plate Precursor of on-Press Development Type-1 (Case where Undercoat Layer Contains Specific Polymer Compound)

(1) Preparation of Support

An aluminum plate (material: JIS A 1050) having a thickness of 0.3 mm was subjected to a degreasing treatment at 50° C. for 30 seconds using a 10% by weight aqueous sodium aluminate solution in order to remove rolling oil on the surface thereof and then grained the surface thereof using three nylon brushes embedded with bundles of nylon bristle having a diameter of 0.3 mm and an aqueous suspension (specific gravity: 1.1 $g/cm^3$) of pumice having a median size of 25 μm, followed by thorough washing with water. The plate was subjected to etching by immersing in a 25% by weight aqueous sodium hydroxide solution of 45° C. for 9 seconds, washed with water, then immersed in a 20% by weight aqueous nitric acid solution at 60° C. for 20 seconds, and washed with water. The etching amount of the grained surface was about 3 $g/m^2$.

Then, using an alternating current of 60 Hz, an electrochemical roughening treatment was continuously carried out on the plate. The electrolytic solution used was a 1% by weight aqueous nitric acid solution (containing 0.5% by weight of aluminum ion) and the temperature of electrolytic solution was 50° C. The electrochemical roughening treatment was conducted using an alternating current source, which provides a rectangular alternating current having a trapezoidal waveform such that the time TP necessary for the current value to reach the peak from zero was 0.8 msec and the duty ratio was 1:1, and using a carbon electrode as a counter electrode. A ferrite was used as an auxiliary anode. The current density was 30 A/dm² in terms of the peak value of the electric current and 5% of the electric current flowing from the electric source was divided to the auxiliary anode. The quantity of electricity in the nitric acid electrolysis was 175 C/dm² in terms of the quantity of electricity when the aluminum plate functioned as an anode. The plate was then washed with water by spraying.

The plate was then subjected to an electrochemical roughening treatment in the same manner as in the nitric acid electrolysis above using as an electrolytic solution, a 0.5% by weight aqueous hydrochloric acid solution (containing 0.5% by weight of aluminum ion) having temperature of 50° C. and under the condition that the quantity of electricity was 50 C/dm² in terms of the quantity of electricity when the aluminum plate functioned as an anode. The plate was then washed with water by spraying.

The plate was then subjected to an anodizing treatment using as an electrolytic solution, a 15% by weight aqueous sulfuric acid solution (containing 0.5% by weight of aluminum ion) at a current density of 15 A/dm² to form a direct current anodized film of 2.5 g/m², washed with water and dried to prepare Support (1).

Thereafter, in order to ensure the hydrophilicity of the non-image area, Support (1) was subjected to silicate treatment using a 2.5% by weight aqueous sodium silicate No. 3 solution at 60° C. for 10 seconds and subsequently washed with water to obtain Support (2). The adhesion amount of Si was 10 mg/m². The center line average roughness (Ra) of Support (2) was measured using a stylus having a diameter of 2 μm and found to be 0.51 μm.

(2) Formation of Undercoat Layer

Coating solution (1) for undercoat layer having the composition shown below was coated on Support (2) described above so as to have a dry coating amount of 20 mw/m² to prepare a support having an undercoat layer.

<Coating Solution (1) for Undercoat Layer>

| | |
|---|---|
| Specific polymer compound or Comparative polymer compound shown in Table 1 | 0.50 g |
| Water | 500.00 g |

<Comparative Polymer Compound>

(R-1)
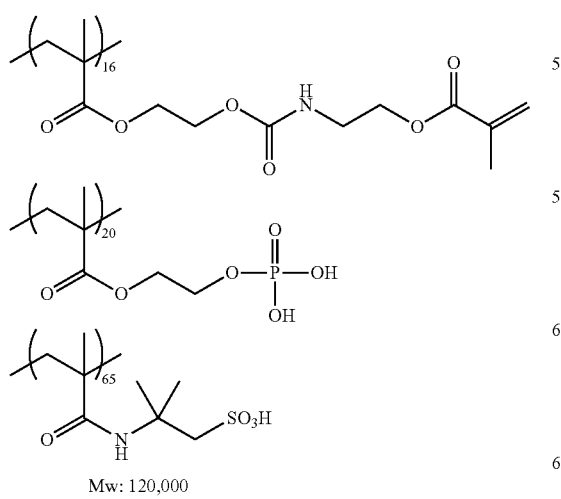
Mw: 120,000

(R-2)
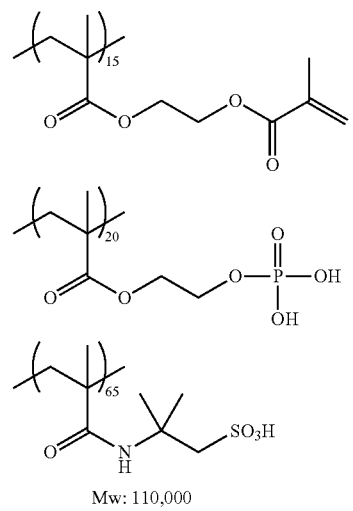

(R-3)
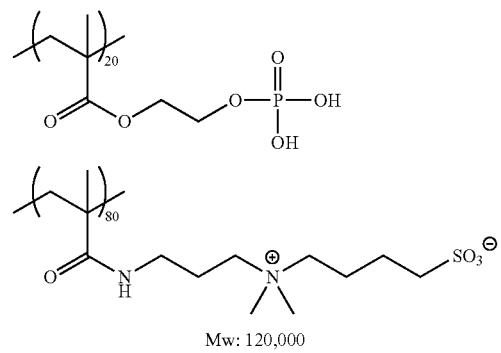
Mw: 110,000

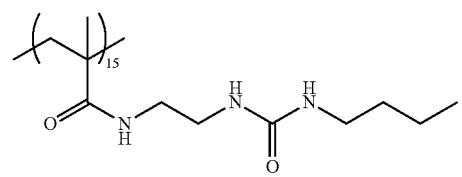
Mw: 120,000

(R-4)
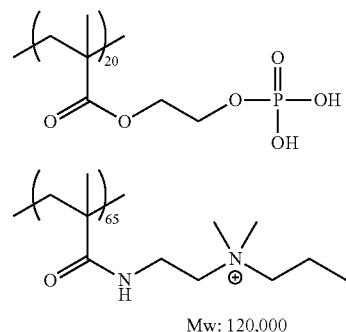

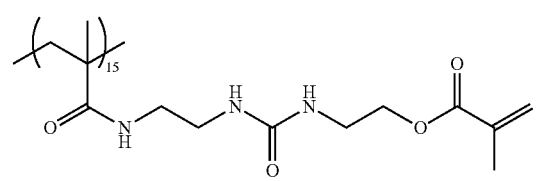
Mw: 120,000

(R-5)

-continued

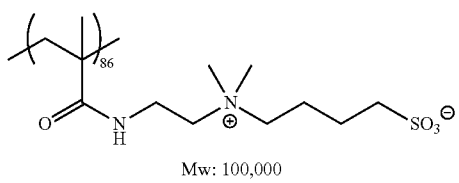

Mw: 100,000

(3) Formation of Image-Recording Layer

Coating solution (1) for image-recording layer having the composition shown below was coated on the undercoat layer formed as described above by a bar and dried in an oven at 100° C. for 60 seconds to form an image-recording layer having a dry coating amount of 1.0 g/m².

Coating solution (1) for image-recording layer was prepared by mixing Photosensitive solution (1) shown below with Microgel solution (1) shown below just before the coating, followed by stirring.

<Photosensitive Solution (1)>

| | |
|---|---|
| Binder polymer (1) having structure shown below | 0.240 g |
| Infrared absorbing agent (1) having structure shown below | 0.030 g |
| Polymerization initiator (1) having structure show below | 0.162 g |
| Radical polymerizable compound (Tris(acryloyloxyethyl) isocyanurate (NK ESTER A-9300, produced by Shin-Nakamura Chemical Co., Ltd.)) | 0.192 g |
| Hydrophilic low molecular weight compound (Tris(2-hydroxyethyl)isocyanurate) | 0.062 g |
| Hydrophilic low molecular weight compound (1) having structure shown below | 0.050 g |
| Oil-sensitizing agent (Phosphonium compound (1) having structure shown below) | 0.055 g |
| Oil-sensitizing agent (Benzyl dimethyl octyl ammonium PF₆ salt) | 0.018 g |
| Oil-sensitizing agent (Ammonium group-containing polymer having structure shown below (reduced specific viscosity: 44 ml/g) | 0.035 g |
| Fluorine-based surfactant (1) having structure shown below | 0.008 g |
| 2-Butanone | 1.091 g |
| 1-Methoxy-2-propanol | 8.609 g |

<Microgel Solution (1)>

| | |
|---|---|
| Microgel (1) shown below | 2.640 g |
| Distilled water | 2.425 g |

The structures of Binder polymer (1). Infrared absorbing agent (1), Polymerization initiator (1), Phosphonium compound (1), Hydrophilic low molecular weight compound (1), Oil-sensitizing agent (ammonium group-containing polymer) and Fluorine-based surfactant (1) are shown below.

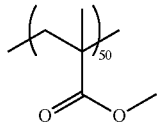 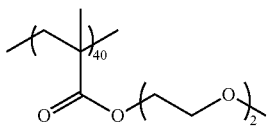

-continued

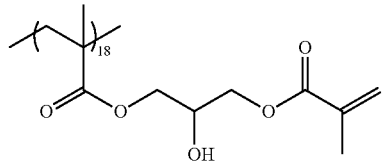

Binder polymer (1)
(Mw: 70,000)

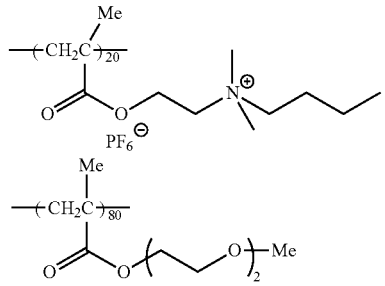

Ammonium group-containing polymer

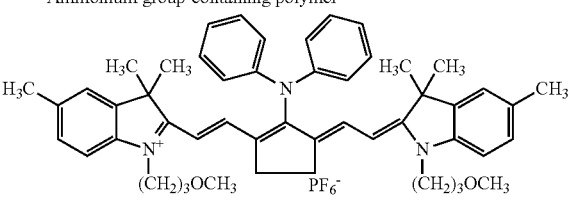

Infrared absorbing agent (1)

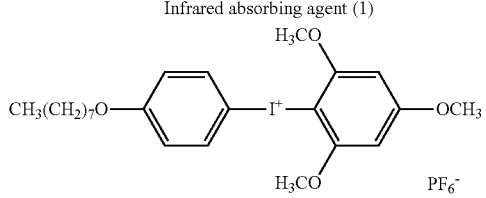

Polymerization initiator (1)

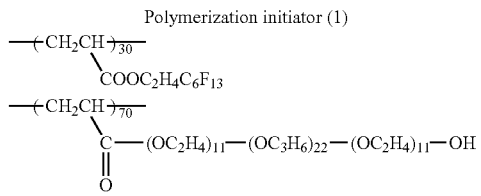

Fluorine-based surfactant (1)
(Mw 13,000)

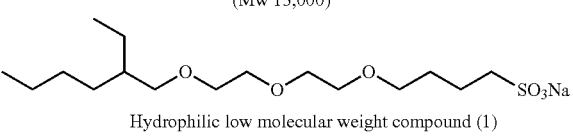

Hydrophilic low molecular weight compound (1)

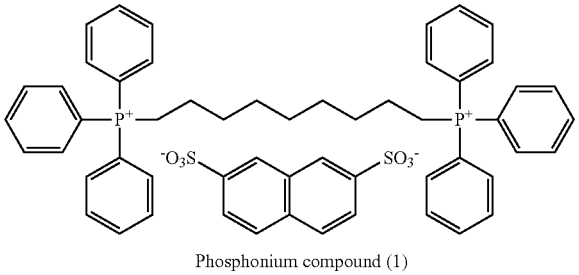

Phosphonium compound (1)

<Preparation of Microgel (1)>

An oil phase component was prepared by dissolving 4.46 g of polyfunctional isocyanate having the structure shown below (produced by Mitsui Chemicals, Inc., 75% by weight ethyl acetate solution), 10 g of adduct obtained by addition of trimethylolpropane (6 mol) and xylene diisocyanate (18 mol) and further addition of methyl-terminated polyoxyethylene (1 mol) (number of oxyethylene repeating unit: 90) (produced by Mitsui Chemicals, Inc., 50% by weight ethyl acetate solution), 3.15 g of pentaerythritol triacrylate (SR444, produced by Nippon Kayaku Co., Ltd.) and 0.1 g of PIONIN A-41C (produced by Takemoto Oil & Fat Co., Ltd.) in 17 g of ethyl acetate. As an aqueous phase component, 40 g of a 4% by weight aqueous solution of PVA-205 (produced by Kuraray Co., Ltd.) was prepared. The oil phase component and the aqueous phase component were mixed and emulsified using a homogenizer at 12,000 rpm for 10 minutes. The resulting emulsion was added to 25 g of distilled water and stirred at room temperature for 30 minutes and then at 50° C. for 3 hours. The microgel liquid thus-obtained was diluted using distilled water so as to have the solid content concentration of 15% by weight to prepare Microgel (1). The average particle size of the microgel was measured by a light scattering method and found to be 0.2 µm.

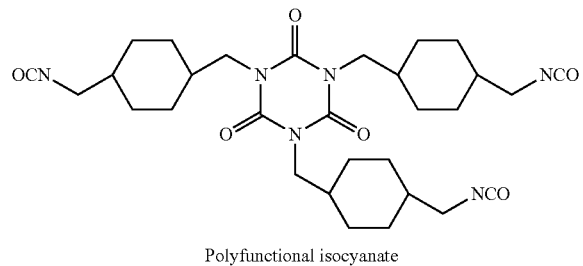

Polyfunctional isocyanate (4) Formation of Protective Layer

Coating solution (1) for protective layer having the composition shown below was coated on the image-recording layer described above by a bar and dried in an oven at 120° C. for 60 seconds to form a protective layer having a dry coating amount of 0.15 g/m², thereby preparing Lithographic printing plate precursors (1) to (33) for Examples 1 to 33, Lithographic printing plate precursors (74) to (98) for Examples 74 to 98, Lithographic printing plate precursors (124) to (126) for Examples 124 to 126 and Lithographic printing plate precursors (R-1) to (1-6) for Comparative Examples 1 to 6, respectively.

<Coating Solution (1) for Protective Layer>

| | |
|---|---|
| Dispersion of inorganic stratiform compound (1) shown below | 1.5 g |
| Aqueous 6% by weight solution of polyvinyl alcohol (CKS 50, sulfonic acid-modified, saponification degree: 99% by mole or more, polymerization degree: 300, produced by Nippon Synthetic Chemical Industry Co., Ltd.) | 0.55 g |
| Aqueous 6% by weight solution of polyvinyl alcohol (PVA-405, saponification degree: 81.5% by mole, polymerization degree: 500, produced by Kuraray Co., Ltd.) | 0.03 g |
| Aqueous 1% by weight solution of surfactant (EMALEX 710, produced by Nihon Emulsion Co., Ltd.) | 0.86 g |
| Ion-exchanged water | 6.0 g |

<Preparation of Dispersion of Inorganic Stratiform Compound (1)>

To 193.6 g of ion-exchanged water was added 6.4 g of synthetic mica (SOMASIF ME-100, produced by CO—OP Chemical Co., Ltd.) and the mixture was dispersed using a homogenizer until an average particle size (according to a laser scattering method) became 3 µm to prepare Dispersion of inorganic stratiform compound (1). The aspect ratio of the inorganic particle thus-dispersed was 100 or more.

(5) Evaluation

Each of the lithographic printing plate precursors thus-obtained was exposed by LUXEL PLATESETTER T-6000III equipped with an infrared semiconductor laser, produced by FUJIFILM Corp. under the conditions of a rotational number of an external drum of 1,000 rpm, laser output of 70% and resolution of 2,400 dpi. The exposed image contained a solid image and a 50% halftone dot chart of a 20 µm-dot FM screen.

The exposed lithographic printing plate precursor was mounted without undergoing development processing on a plate cylinder of a printing machine (LITHRONE 26, produced by Komori Corp.). Using dampening water (ECOLITY-2 (produced by FUJIFILM Corp.)/tap water=2/98 (volume ratio)) and VALUES-G (N) Black. Ink (produced by Dainippon Ink & Chemicals, Inc.), the dampening water and ink were supplied according to the standard automatic printing start method of LITHRONE 26 to conduct printing on Tokubishi art paper (76.5 kg) at a printing speed of 10,000 sheets per hour.

<On-Press Development Property>

A number of the printing papers required until the on-press development of the unexposed area of the image-recording layer on the printing machine was completed to reach a state where the ink was not transferred to the printing paper in the non-image area was measured to evaluate the on-press development property.

<On-Press Development Property after Passage of Time>

The lithographic printing plate precursor obtained was allowed to stand in a temperature and humidity controlled chamber set at temperature of 60° C. and relative humidity of 60% for 4 days and then subjected to the exposure, on-press development and printing in the same manner as described above. A number of the printing papers required until the on-press development of the unexposed area of the image-recording layer on the printing machine was completed to reach a state where the ink was not transferred to the printing paper in the non-image area was measured to evaluate the on-press development property.

<Printing Durability>

After performing the evaluation for the on-press development property described above, the printing was continued. As the increase in a number of printing papers, the image-recording layer was gradually abraded to cause decrease in the ink density on the printing paper. A number of printing papers wherein a value obtained by measuring a halftone dot area rate of the 50% halftone dot of FM screen on the printing paper using a Gretag densitometer decreased by 5% from the value measured on the 100$^{th}$ paper of the printing was determined to evaluate the printing durability.

<Stain Resistance>

After conducting the printing of 10,000 sheets as described above, the printing was stopped and the lithographic printing plate was allowed to stand for one hour on the printing machine. Then, the printing was restarted and the density of ink adhered on the non-image area was determined to evaluate the stain resistance. The evaluation was visually conducted on a ten point scale. As the point increases, the stain resistance is better. Since it was not necessarily the case that the adhesion of ink on the non-image area occurred uniform, the evaluation of stain resistance was conducted using the point of the visual observation.

The point of the visual observation was determined based on a guide that the point was 10 in case a ratio of an area wherein the adhesion of ink on the non-image area was occurred was 0%, the point was 9 in case the ratio was 1 to 10%, the point was 8 in case the ratio was 11 to 20%, the point was 7 in case the ratio was 21 to 30%, the point was 6 in case the ratio was 31 to 40%, the point was 5 in case the ratio was 41 to 50%, the point was 4 in case the ratio was 51 to 60%, the point was 3 in case the ratio was 61 to 70%, the point was 2 in case the ratio was 71 to 80%, the point was 1 in case the ratio was 81 to 90% and the point was 0 in case the ratio was 91 to 100%.

<Stain Resistance after Passage of Time>

The lithographic printing, plate precursor obtained was allowed to stand in a temperature and humidity controlled chamber set at temperature of 60° C. and relative humidity of 60% for 4 days and then subjected to the exposure, on-press development and printing in the same manner as described above. After conducting the printing of 10,000 sheets, the printing was stopped and the lithographic printing plate was allowed to stand for one hour on the printing machine. Then, the printing was restarted and the density of ink adhered on the non-image area was determined to evaluate the stain resistance. The evaluation was visually conducted on a ten point scale. The criteria of the visual observation were same as those described in the stain resistance described above. As the point increases, the stain resistance is better. The results obtained are shown in Table 1.

TABLE 1

| Lithographic Printing Plate Precursor | Specific Polymer Compound | On-press Development Property (sheets) | | Stain Resistance (point) | | Printing Durability (sheets) |
|---|---|---|---|---|---|---|
| | | Just after Preparation | After Passage of Time | Just after Preparation | After Passage of Time | |
| Examples 1 to 33 | | | | | | |
| Example 1 | (1) | (1) | 20 | 22 | 10 | 8 | 50,000 |
| Example 2 | (2) | (2) | 25 | 50 | 8 | 6 | 65,000 |
| Example 3 | (3) | (3) | 18 | 22 | 10 | 9 | 45,000 |
| Example 4 | (4) | (4) | 25 | 30 | 8 | 6 | 52,000 |
| Example 5 | (5) | (5) | 25 | 30 | 10 | 8 | 40,000 |
| Example 6 | (6) | (6) | 23 | 30 | 10 | 8 | 42,000 |
| Example 7 | (7) | (7) | 20 | 25 | 10 | 8 | 52,000 |
| Example 8 | (8) | (8) | 22 | 27 | 9 | 7 | 56,000 |
| Example 9 | (9) | (9) | 18 | 20 | 9 | 7 | 52,000 |
| Example 10 | (10) | (10) | 18 | 20 | 9 | 7 | 52,000 |
| Example 11 | (11) | (11) | 22 | 25 | 10 | 8 | 45,000 |
| Example 12 | (12) | (12) | 18 | 20 | 10 | 9 | 50,000 |
| Example 13 | (13) | (13) | 20 | 22 | 9 | 7 | 50,000 |
| Example 14 | (14) | (14) | 18 | 20 | 10 | 9 | 50,000 |
| Example 15 | (15) | (15) | 18 | 20 | 10 | 8 | 50,000 |
| Example 16 | (16) | (16) | 18 | 20 | 10 | 8 | 50,000 |
| Example 17 | (17) | (17) | 22 | 30 | 9 | 7 | 50,000 |
| Example 18 | (18) | (18) | 18 | 22 | 9 | 7 | 50,000 |
| Example 19 | (19) | (19) | 22 | 24 | 8 | 6 | 50,000 |
| Example 20 | (20) | (20) | 22 | 24 | 8 | 6 | 50,000 |
| Example 21 | (21) | (25) | 19 | 23 | 9 | 7 | 52,000 |
| Example 22 | (22) | (26) | 18 | 22 | 9 | 7 | 52,000 |
| Example 23 | (23) | (27) | 20 | 24 | 9 | 7 | 51,000 |
| Example 24 | (24) | (33) | 15 | 17 | 10 | 8 | 52,000 |
| Example 25 | (25) | (42) | 15 | 17 | 10 | 8 | 52,000 |
| Example 26 | (26) | (43) | 15 | 17 | 10 | 8 | 55,000 |
| Example 27 | (27) | (49) | 20 | 24 | 9 | 7 | 51,000 |
| Example 28 | (28) | (50) | 22 | 27 | 8 | 6 | 51,000 |
| Example 29 | (29) | (51) | 22 | 27 | 8 | 6 | 51,000 |
| Example 30 | (30) | (52) | 18 | 20 | 8 | 6 | 45,000 |
| Example 31 | (31) | (53) | 18 | 20 | 8 | 6 | 45,000 |
| Example 32 | (32) | (54) | 18 | 20 | 8 | 6 | 45,000 |
| Example 33 | (33) | (55) | 16 | 18 | 10 | 8 | 50,000 |
| Examples 74 to 98 and 124 to 126 and Comparative Examples 1 to 6 | | | | | | |
| Example 74 | (74) | (65) | 18 | 20 | 10 | 8 | 45,000 |
| Example 75 | (75) | (66) | 20 | 22 | 10 | 9 | 46,000 |
| Example 76 | (76) | (67) | 20 | 22 | 9 | 8 | 48,000 |
| Example 77 | (77) | (68) | 22 | 25 | 9 | 8 | 45,000 |
| Example 78 | (78) | (69) | 19 | 22 | 9 | 8 | 49,000 |
| Example 79 | (79) | (70) | 20 | 22 | 9 | 8 | 52,000 |
| Example 80 | (80) | (71) | 21 | 25 | 10 | 9 | 42,000 |
| Example 81 | (81) | (72) | 20 | 22 | 10 | 8 | 51,000 |
| Example 82 | (82) | (73) | 18 | 20 | 9 | 8 | 47,000 |
| Example 83 | (83) | (74) | 20 | 22 | 8 | 7 | 48,000 |
| Example 84 | (84) | (75) | 20 | 24 | 9 | 7 | 49,000 |
| Example 85 | (85) | (76) | 18 | 20 | 9 | 8 | 50,000 |
| Example 86 | (86) | (77) | 16 | 20 | 10 | 8 | 49,000 |
| Example 87 | (87) | (78) | 20 | 22 | 10 | 8 | 48,000 |

TABLE 1-continued

|  | Lithographic Printing Plate Precursor | Specific Polymer Compound | On-press Development Property (sheets) | | Stain Resistance (point) | | Printing Durability (sheets) |
|---|---|---|---|---|---|---|---|
|  |  |  | Just after Preparation | After Passage of Time | Just after Preparation | After Passage of Time |  |
| Example 88 | (88) | (79) | 20 | 24 | 9 | 8 | 53,000 |
| Example 89 | (89) | (80) | 20 | 24 | 9 | 7 | 51,000 |
| Example 90 | (90) | (81) | 22 | 25 | 8 | 7 | 51,000 |
| Example 91 | (91) | (82) | 18 | 20 | 9 | 7 | 50,000 |
| Example 92 | (92) | (83) | 20 | 22 | 9 | 7 | 49,000 |
| Example 93 | (93) | (84) | 14 | 16 | 10 | 8 | 58,000 |
| Example 94 | (94) | (85) | 15 | 17 | 9 | 7 | 60,000 |
| Example 95 | (95) | (91) | 15 | 17 | 10 | 8 | 54,000 |
| Example 96 | (96) | (94) | 15 | 17 | 10 | 8 | 60,000 |
| Example 97 | (97) | (95) | 16 | 20 | 9 | 8 | 61,000 |
| Example 98 | (98) | (96) | 16 | 18 | 10 | 8 | 52,000 |
| Example 124 | (124) | (97) | 15 | 17 | 10 | 8 | 57,000 |
| Example 125 | (125) | (98) | 15 | 18 | 9 | 7 | 53,000 |
| Example 126 | (126) | (102) | 16 | 18 | 9 | 8 | 52,000 |
| Comparative Example 1 | (R-1) | (R-1) | 50 | 200 | 8 | 3 | 30,000 |
| Comparative Example 2 | (R-2) | (R-2) | 50 | 200 | 8 | 3 | 35,000 |
| Comparative Example 3 | (R-3) | (R-3) | 20 | 30 | 9 | 7 | 5,000 |
| Comparative Example 4 | (R-4) | (R-4) | 20 | 30 | 8 | 6 | 8,000 |
| Comparative Example 5 | (R-5) | (R-5) | 50 | 200 | 6 | 3 | 5,000 |
| Comparative Example 6 | (R-6) | None | 100 | Unable to be developed | 3 | 1 | 10,000 |

Examples 34 to 66, 99 to 123 and 127 to 129 and Comparative Examples 7 to 11

2. Lithographic Printing Plate Precursor of on-Press Development Type-2 (Case where Image-Recording Layer Contains Specific Polymer Compound)

(1) Formation of Image-Recording Layer

Coating solution (2) for image-recording layer having the composition shown below was coated on Support (2) tinned as described above by a bar and dried in an oven at 100° C. for 60 seconds to form an image-recording layer having a dry coating amount of 1.0 g/m$^2$.

Coating solution (2) for image-recording layer was prepared by mixing Photosensitive solution (2) shown below with Microgel solution (1) shown below just before the coating, followed by stirring.

<Photosensitive Solution (2)>

| | |
|---|---|
| Binder polymer (1) having structure shown above | 0.240 g |
| Infrared absorbing agent (1) having structure shown above | 0.030 g |
| Polymerization initiator (1) having structure shown above | 0.162 g |
| Radical polymerizable compound (Tris(acryloyloxyethyl) isocyanurate (NK ESTER A-9300, produced by Shin-Nakamura Chemical Co., Ltd.)) | 0.192 g |
| Hydrophilic low molecular weight compound (Tris(2-hydroxyethyl) isocyanurate) | 0.062 g |
| Hydrophilic low molecular weight compound (1) having structure shown above | 0.050 g |
| Oil-sensitizing agent (Phosphonium compound (1) having structure shown above) | 0.055 g |
| Oil-sensitizing agent (Benzyl dimethyl octyl ammonium PF$_6$ salt) | 0.018 g |
| Oil-sensitizing agent (Ammonium group-containing polymer having structure shown below (reduced specific viscosity: 44 cSt/g/ml) | 0.035 g |
| Specific polymer compound or Comparative polymer compound shown in Table 2 | 0.80 g |
| Fluorine-based surfactant (1) having structure shown above | 0.008 g |
| 2-Butanone | 1.091 g |
| 1-Methoxy-2-propanol | 8.609 g |

<Microgel Solution (1)>

| | |
|---|---|
| Microgel (1) shown above | 2.640 g |
| Distilled water | 2.425 g |

(2) Formation of Protective Layer

A protective layer was formed on the image-recording layer described above in the same manner as in Example 1, thereby preparing Lithographic printing plate precursors (34) to (66) for Examples 34 to 66, Lithographic printing plate precursors (99) to (123) for Examples 99 to 123, Lithographic printing plate precursors (127) to (129) for Examples 127 to 129 and Lithographic printing plate precursors (R-7) to (R-11) for Comparative Examples 7 to 11, respectively.

(3) Evaluation

The on-press development property, on-press development property after the passage of time, printing durability, stain resistance and stain resistance after the passage of time were evaluated in the same manner as in Examples 1 to 33, 74 to 98 and 124 to 126. The evaluation results obtained are shown in Table 2.

TABLE 2

| Lithographic Printing Plate Precursor | Specific Polymer Compound | On-press Development Property (sheets) | | Stain Resistance (point) | | Printing Durability (sheets) |
|---|---|---|---|---|---|---|
| | | Just after Preparation | After Passage of Time | Just after Preparation | After Passage of Time | |
| Examples 34 to 66 | | | | | | |
| Example 34 | (34) | (1) | 25 | 27 | 9 | 7 | 48,000 |
| Example 35 | (35) | (2) | 30 | 55 | 7 | 5 | 63,000 |
| Example 36 | (36) | (3) | 23 | 27 | 9 | 8 | 43,000 |
| Example 37 | (37) | (4) | 30 | 35 | 7 | 5 | 50,000 |
| Example 38 | (38) | (5) | 30 | 35 | 9 | 7 | 38,000 |
| Example 39 | (39) | (6) | 28 | 35 | 9 | 7 | 40,000 |
| Example 40 | (40) | (7) | 25 | 30 | 9 | 7 | 50,000 |
| Example 41 | (41) | (8) | 27 | 32 | 8 | 6 | 54,000 |
| Example 42 | (42) | (9) | 23 | 25 | 8 | 6 | 50,000 |
| Example 43 | (43) | (10) | 23 | 25 | 8 | 6 | 50,000 |
| Example 44 | (44) | (11) | 27 | 30 | 9 | 7 | 43,000 |
| Example 45 | (45) | (12) | 23 | 25 | 9 | 8 | 48,000 |
| Example 46 | (46) | (13) | 25 | 27 | 8 | 6 | 48,000 |
| Example 47 | (47) | (14) | 23 | 25 | 9 | 8 | 48,000 |
| Example 48 | (48) | (15) | 23 | 25 | 9 | 7 | 48,000 |
| Example 49 | (49) | (16) | 23 | 25 | 9 | 7 | 48,000 |
| Example 50 | (50) | (17) | 27 | 35 | 8 | 6 | 48,000 |
| Example 51 | (51) | (18) | 23 | 27 | 8 | 6 | 48,000 |
| Example 52 | (52) | (19) | 27 | 29 | 7 | 5 | 48,000 |
| Example 53 | (53) | (20) | 27 | 29 | 7 | 5 | 48,000 |
| Example 54 | (54) | (25) | 24 | 28 | 8 | 6 | 50,000 |
| Example 55 | (55) | (26) | 23 | 27 | 8 | 6 | 50,000 |
| Example 56 | (56) | (27) | 25 | 29 | 8 | 6 | 49,000 |
| Example 57 | (57) | (33) | 20 | 22 | 9 | 7 | 50,000 |
| Example 58 | (58) | (42) | 20 | 22 | 9 | 7 | 50,000 |
| Example 59 | (59) | (43) | 20 | 22 | 9 | 7 | 53,000 |
| Example 50 | (60) | (49) | 25 | 29 | 8 | 6 | 49,000 |
| Example 61 | (61) | (50) | 27 | 32 | 7 | 5 | 49,000 |
| Example 62 | (62) | (51) | 27 | 32 | 7 | 5 | 49,000 |
| Example 63 | (63) | (52) | 23 | 25 | 7 | 5 | 43,000 |
| Example 64 | (64) | (53) | 23 | 25 | 7 | 5 | 43,000 |
| Example 65 | (65) | (54) | 23 | 25 | 7 | 5 | 43,000 |
| Example 66 | (66) | (55) | 21 | 23 | 9 | 7 | 48,000 |
| Examples 99 to 123 and 127 to 129 and Comparative Examples 7 to 11 | | | | | | |
| Example 99 | (99) | (65) | 22 | 24 | 9 | 7 | 43,000 |
| Example 100 | (100) | (66) | 24 | 26 | 9 | 8 | 44,000 |
| Example 101 | (101) | (67) | 24 | 26 | 8 | 7 | 46,000 |
| Example 102 | (102) | (68) | 26 | 29 | 8 | 7 | 43,000 |
| Example 103 | (103) | (69) | 23 | 26 | 8 | 7 | 47,000 |
| Example 104 | (104) | (70) | 24 | 26 | 8 | 7 | 50,000 |
| Example 105 | (105) | (71) | 25 | 29 | 9 | 8 | 40,000 |
| Example 106 | (106) | (72) | 24 | 26 | 9 | 7 | 49,000 |
| Example 107 | (107) | (73) | 22 | 24 | 8 | 7 | 45,000 |
| Example 108 | (108) | (74) | 24 | 26 | 7 | 6 | 46,000 |
| Example 109 | (109) | (75) | 24 | 28 | 8 | 6 | 47,000 |
| Example 110 | (110) | (76) | 22 | 24 | 8 | 7 | 48,000 |
| Example 111 | (111) | (77) | 20 | 24 | 9 | 7 | 47,000 |
| Example 112 | (112) | (78) | 24 | 26 | 9 | 7 | 46,000 |
| Example 113 | (113) | (79) | 24 | 28 | 8 | 7 | 51,000 |
| Example 114 | (114) | (80) | 24 | 28 | 8 | 6 | 49,000 |
| Example 115 | (115) | (81) | 26 | 29 | 7 | 6 | 49,000 |
| Example 116 | (116) | (82) | 22 | 24 | 8 | 6 | 48,000 |
| Example 117 | (117) | (83) | 24 | 26 | 8 | 6 | 47,000 |
| Example 118 | (118) | (84) | 18 | 20 | 9 | 7 | 56,000 |
| Example 119 | (119) | (85) | 19 | 21 | 8 | 6 | 58,000 |
| Example 120 | (120) | (91) | 19 | 21 | 9 | 7 | 52,000 |
| Example 121 | (121) | (94) | 19 | 21 | 9 | 7 | 58,000 |
| Example 122 | (122) | (95) | 20 | 24 | 8 | 7 | 59,000 |
| Example 123 | (123) | (96) | 20 | 22 | 9 | 7 | 50,000 |
| Example 127 | (127) | (97) | 20 | 22 | 9 | 7 | 55,000 |
| Example 128 | (128) | (98) | 20 | 22 | 8 | 6 | 51,000 |
| Example 129 | (129) | (102) | 21 | 23 | 8 | 7 | 50,000 |
| Comparative Example 7 | (R-7) | (R-1) | 100 | 250 | 7 | 2 | 28,000 |
| Comparative Example 8 | (R-8) | (R-2) | 100 | 250 | 7 | 2 | 33,000 |
| Comparative Example 9 | (R-9) | (R-3) | 100 | 400 | 8 | 6 | 3,000 |

TABLE 2-continued

| Lithographic Printing Plate Precursor | Specific Polymer Compound | On-press Development Property (sheets) | | Stain Resistance (point) | | Printing Durability (sheets) |
|---|---|---|---|---|---|---|
| | | Just after Preparation | After Passage of Time | Just after Preparation | After Passage of Time | |
| Comparative Example 10 | (R-10) | (R-4) | 50 | 100 | 7 | 5 | 4,000 |
| Comparative Example 11 | (R-11) | (R-5) | 100 | Unable to be developed | 5 | 1 | 10,000 |
| Comparative Example 6 | (R-6) | None | 100 | Unable to be developed | 3 | 1 | 10,000 |

Examples 67 to 73 and Comparative Example 12

3. Lithographic Printing Plate Precursor of Simple Processing Type (1) Preparation of Lithographic Printing Plate Precursor Coating solution (2) for undercoat layer having the composition shown below was coated on Support (1) formed as described above and dried at 100° C. for one minute to prepare an undercoat layer. The coating amount of the solution for undercoat layer was 10 mg/m².

<Coating Solution (2) Tier Undercoat Layer>

| | |
|---|---|
| Specific polymer compound or Comparative polymer compound shown in Table 4 | 0.50 g |
| Water | 500.00 g |

Coating solution (3) for image-recording layer having the composition shown below was coated on the undercoat layer so as to have a dry coating amount of 1.4 g/m² and dried at 100° C. for one minute to form an image-recording layer.

<Coating Solution (3) for Image-Recording Layer>

| | |
|---|---|
| Polymerizable compound (M-1) | 3.33 parts by weight |
| Binder polymer (B-1) (Mw: 47,000) | 2.67 parts by weight |
| Sensitizing dye (D-1) | 0.32 parts by weight |
| Polymerization initiator (I-1) | 0.61 parts by weight |
| Chain transfer agent (S-2) | 0.57 parts by weight |
| N-Nitrosophenylhydroxylamine aluminum salt | 0.020 part by weight |
| Dispersion of ε-phthalocyanine pigment | 0.71 parts by weight |
| [pigment: 15% by weight; dispersing agent (allyl methacrylate/methacrylic acid (molar ratio: 80/20) copolymer) (Mw: 60,000): 10% by weight; solvent (cyclohexanone/methoxypropyl acetate/1-methoxy-2-propanol = 15% by weight/20% by weight/40% by weight)] | |
| Fluorine-based nonionic surfactant (MEGAFAC F780F, produced by Dainippon Ink & Chemicals Inc.) | 0.016 part by weight |
| 2-Butanone | 47 parts by weight |
| Propylene glycol monomethyl ether | 45 parts by weight |

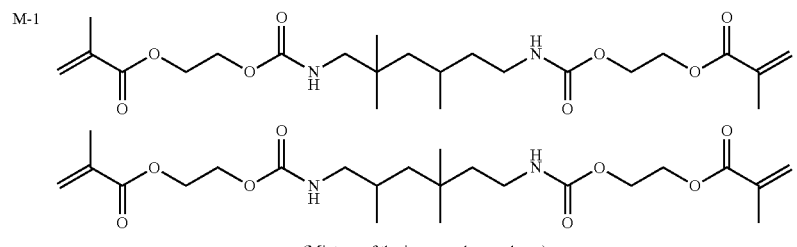

(Mixture of the isomers shown above)

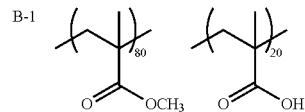

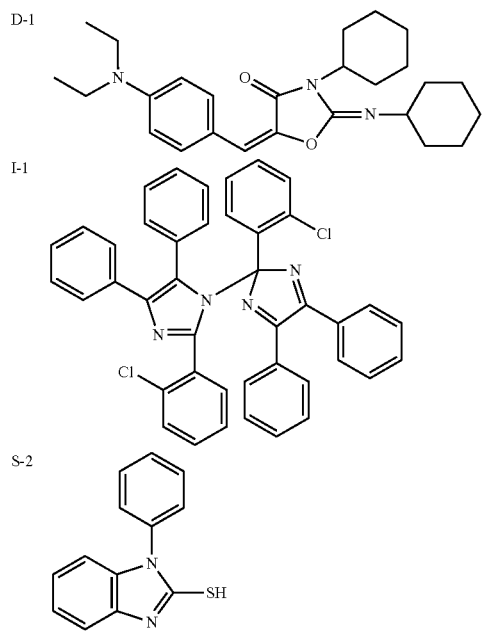

Coating solution (2) for protective layer having the composition shown below was coated on the image-recording layer using a bar so as to have a dry coating amount of 0.50 g/m² and dried at 125° C. for 70 seconds to form a protective layer, thereby preparing Lithographic printing plate precursors (67) to (73) for Examples 67 to 73 and Lithographic printing plate precursor (R-12) for Comparative Example 12, respectively.

<Coating Solution (2) for Protective Layer>

| | |
|---|---|
| Dispersion of mica shown below | 0.6 g |
| Sulfonic acid-modified polyvinyl alcohol [GOSERAN CKS-50, produced by Nippon Synthetic Chemical Industry Co., Ltd. (saponification degree: 99% by mole; average polymerization degree: 300; modification degree: about 0.4% by mole)] | 0.8 g |
| Surfactant (EMALEX 710, produced by Nihon Emulsion Co., Ltd.) | 0.002 g |
| Water | 13. g |

(Preparation of Dispersion of Mica)

In 368 g of water was added 32 g of synthetic mica (SO-MASIF ME-100, produced by CO—OP Chemical Co., Ltd.; aspect ratio: 1,000 or more) and the mixture was dispersed using a homogenizer until the average particle diameter (measured by a laser scattering method) became 0.5 μm to obtain dispersion of mica.

(2) Exposure, Development and Printing

Each of the lithographic printing plate precursors was subjected to image exposure by Violet semiconductor laser plate setter Vx9600 (having InGaN semiconductor laser (emission wavelength: 405 nm±10 nm/output: 30 mW)) produced by RISIFILM. Electronic Imaging Ltd. (FFEI). The image drawing was performed at resolution of 2,438 dpi using FM screen (TAFFETA 20, produced by FUJIFILM Corp.) in a plate surface exposure amount of 0.05 mJ/cm² so as to have a halftone dot area rate of 50%.

The exposed lithographic printing plate precursor was subjected to preheating at 100° C. for 30 seconds and then subjected to development processing in an automatic development processor having a structure as shown in FIG. 1 using a developer having the composition shown below.

The automatic development processor comprises a developing unit 6 for developing a lithographic printing plate precursor (hereinafter, also referred to as a "PS plate") 4 and a drying unit 10 for drying the developed PS plate 4. An insertion slot is formed in a side plate of the automatic development processor (on the left side in FIG. 1) and the PS plate 4 inserted through the insertion slot, is transported into the developing unit 6 by carrying-in rollers 16 provided inside the side plate of the automatic development processor. In a developing tank 20 of the developing unit 6, transport rollers 22, a brush roller 24 and squeeze rollers 26 are provided in order from the upstream side in the transporting direction and backup rollers 28 are disposed in appropriate positions therebetween. The PS plate 4 is immersed in the developer while being transported by the transport rollers 22 and the protective layer and the unexposed area of the image-recording layer of PS plate 4 were removed by rotation of the brush roller 24 to conduct development processing. The PS plate 4 subjected to the development processing is transported into the drying unit 10 by the squeeze rollers (carrying-out rollers) 26.

In the drying unit 10, a guide roller 36 and a pair of skewer rollers 38 are disposed in order from the upstream side in the transporting direction. In the drying unit 10, drying means, for example, hot air supply means or heat generating means (not shown) is also provided. A discharge slot is provided in the drying unit 10 and the PS plate 4 dried by the drying means is discharged through the discharge slot, whereby the processing of PS plate by the automatic development processor is completed. The automatic development processor used in the example had one brush roller having an outer diameter of 50 mm and being implanted with fiber of polybutylene terephthalate (bristle diameter: 200 μm, bristle length: 17 mm), and the brush roller was rotated at 200 rpm (peripheral velocity at the tip of brush: 0.52 m/sec) in the same direction as the transporting direction of the lithographic printing plate precursor. The temperature of the developer was 30° C. The transportation of the lithographic printing plate precursor was conducted at transporting speed of 100 cm/min. After the development processing, the lithographic printing plate was dried in the drying unit. The drying temperature was 80° C.

The lithographic printing plate obtained was mounted on a printing machine (SOR-M, produced by Heidelberg) and printing was performed at a printing speed of 6,000 sheets per hour using dampening water (EU-3 (etching solution, produced by FUJILFILM Corp))/water/isopropyl alcohol=1/89/10 (by volume ratio)) and TRANS-G (N) Black Ink (Produced by Dainippon Ink & Chemicals, Inc.).

(Developer)

The compositions of Developer 1 used in the examples and comparative examples are shown below. In the developer, NEWCOL B13 is polyoxyethylene β-naphthyl ether (average number of oxyethylene: n=13, produced by Nippon Nyukazai Co., Ltd) and gum arabic used has a weight average molecular weight (Mw) of 200,000.

TABLE 3

Developer 1 (pH: 9.8)

| | |
|---|---|
| 0.2M Aqueous boric acid solution | 25.00 parts by weight |
| 0.2M Aqueous sodium chloride solution | 25.00 parts by weight |
| 0.1M Aqueous sodium hydroxide solution | 40.60 parts by weight |
| Water | 9.40 parts by weight |
| NEWCOL B13 (produced by Nippon Nyukazai Co., Ltd.) | 5.00 parts by weight |
| Gum arabic | 2.50 parts by weight |
| Hydroxy-alkylated starch (PENON JE66, produced by Nippon Starch Chemical Co., Ltd.) | 7.00 parts by weight |

(3) Evaluation

Printing durability, stain resistance, stain resistance after passage of time and developing property were evaluated in the following manner. The results obtained are shown in Table 4.

<Printing Durability>

As increase in the number of printing sheets, the image-recording layer was gradually abraded to cause decrease in the ink receptivity, resulting in decrease of ink density on printing paper. With respect to the lithographic printing plate obtained by the exposure in the same exposure amount, a number of printed materials obtained until the ink density (reflection density) decreased by 0.1 from that at the initiation of printing was determined to evaluate the printing durability. The evaluation of printing durability is indicated as a relative printing durability defined as below using Comparative Example 12 as the criterion (1.0). As the value of relative printing durability increases, the printing durability is higher.

Relative printing durability (Printing durability of
 subject lithographic printing plate precursor)/
 (Printing durability of criterion lithographic
 printing plate precursor)

<Stain Resistance>

The 20$^{th}$ sheet of the printed material from the initiation of printing was picked up and the density of ink adhered on the non-image area was measured to evaluate the stain resistance. The evaluation was visually conducted on a ten point scale. As the point increases, the stain resistance is better. Since it was not necessarily the ease that the adhesion of ink on the non-image area occurred uniform, the evaluation of stain resistance was conducted using the point of the visual observation.

The point of the visual observation was determined based on a guide that the point was 10 in case a ratio of an area wherein the adhesion of ink on the non-image area was occurred was 0%, the point was 9 in case the ratio was 1 to 10%, the point was 8 in case the ratio was 11 to 20%, the point was 7 in case the ratio was 21 to 30%, the point was 6 in case the ratio was 31 to 40%, the point was 5 in case the ratio was 41 to 50%, the point was 4 in case the ratio was 51 to 60%, the point was 3 in case the ratio was 61 to 70%, the point was 2 in case the ratio was 71 to 80%, the point was 1 in case the ratio was 81 to 90% and the point was 0 in case the ratio was 91 to 100%.

<Stain Resistance after Passage of Time>

The lithographic printing plate precursor obtained was allowed to stand in a temperature and humidity controlled chamber set at temperature of 60° C. and relative humidity of 60% for 4 days and then subjected to the exposure, development and printing in the same manner as described above. The 20$^{th}$ sheet of the printed material from the initiation of printing was picked up and the density of ink adhered on the non-image area was measured to evaluate the stain resistance. The evaluation was visually conducted on a ten point scale. The criteria of the visual observation were same as those described in the stain resistance described above. As the point increases, the stain resistance after the passage of time is better.

<Developing Property>

With the lithographic printing plates obtained by performing the development while varying the transporting speed, cyan density of the non-image area was measured by a Macbeth densitometer. The transporting speed at which the cyan density of the non-image area became equivalent to cyan density of the aluminum support was determined and regarded as the developing property. The evaluation of developing property is indicated as a relative developing property defined as below using Comparative Example 12 as a criterion (1.0). As the value of relative developing property increases, the developing property is better and the performance is more preferable.

Relative developing property=(Transporting speed of
 subject lithographic printing plate precursor)/
 (Transporting speed of criterion lithographic
 printing plate precursor)

<Developing Property after Passage of Time>

The lithographic printing plate precursor obtained was allowed to stand in a temperature and humidity controlled chamber set at temperature of 60° C. and relative humidity of 60% for 4 days and then subjected to the exposure and development in the same manner as described above, and cyan density of the non-image area was measured by a Macbeth densitometer. The transporting speed at which the cyan density of the non-image area became equivalent to cyan density of the aluminum support was determined and regarded as the developing property. The evaluation of developing property is indicated as a relative developing property defined as below using Comparative Example 12 as a criterion (1.0). As the value of relative developing property increases, the developing property after passage of time is better and the performance is more preferable.

Relative developing property (Transporting speed of
 subject lithographic printing plate precursor)/
 (Transporting speed of oiterion lithographic
 printing plate precursor)

TABLE 4

Examples 67 to 73 and Comparative Example 12

| | Lithographic Printing Plate Precursor | Specific Polymer Compound | Developing Property (relative value) | | Stain Resistance (point) | | Printing Durability (relative value) |
|---|---|---|---|---|---|---|---|
| | | | Just after Preparation | After Passage of Time | Just after Preparation | After Passage of Time | |
| Example 67 | (67) | (1) | 1.8 | 1.8 | 9 | 7 | 2.5 |
| Example 68 | (68) | (2) | 1.8 | 1.8 | 8 | 6 | 3.0 |
| Example 69 | (69) | (3) | 2.5 | 2.5 | 10 | 9 | 2.0 |
| Example 70 | (70) | (4) | 2 | 2 | 8 | 6 | 2.0 |
| Example 71 | (71) | (33) | 2.5 | 2.5 | 10 | 8 | 3.0 |
| Example 72 | (72) | (42) | 2.5 | 2.5 | 10 | 8 | 3.0 |
| Example 73 | (73) | (43) | 2.5 | 2.5 | 10 | 8 | 3.0 |
| Comparative Example 12 | (R-12) | (R-2) | 1.0 | 1.0 | 1 | 0 | 1.0 |

INDUSTRIAL APPLICABILITY

According to the present invention, a lithographic printing plate precursor which is capable of conducting a so-called direct plate making, in which the plate making is directly conducted based on digital signals, for example, from a computer using various kinds of lasers and exhibits high productivity, can be developed on a printing machine or with an aqueous solution having pH of 11 or less, is prevented from degradation in developing property after the passage of time, and can provide a lithographic printing plate exhibiting high printing durability and good stain resistance (including stain resistance after the passage of time) can be provided.

This application is based on Japanese patent applications No. 2010-125336 filed on May 31, 2010, No. 2011-036385 filed on Feb. 22, 2011 and No. 2011-099721 filed on Apr. 27, 2011, the entire contents of which are hereby incorporated by reference, the same as if set forth at length.

The invention claimed is:

1. A lithographic printing plate precursor comprising:
a support; and
an image-recording layer comprising (A) a polymerization initiator, (B) a sensitizing dye and (C) a polymerizable compound,
wherein the image-recording layer or an undercoat layer which is optionally provided between the support and the image-recording layer comprises (D) a polymer compound comprising (a1) a repeating unit having a side chain having a structure represented by the following formula (a1-1) and (a2) a repeating unit having a side chain having at least one structure of the following formulae (a2-1), (a2-2), (a2-3), (a2-4), (a2-5) and (a2-6):

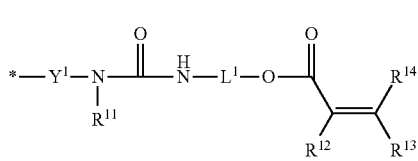

(a1-1)

wherein $R^{11}$ represents a hydrogen atom, an alkyl group, an aryl group, a heterocyclic group, a sulfo group, an alkylsulfonyl group, a arylsulfonyl group, an acyl group, an aryloxycarbonyl group, an alkoxycarbonyl group or a carbamoyl group, $R^{12}$, $R^{13}$ and $R^{14}$ each independently represents a hydrogen atom, an alkyl group or an aryl group, $L^1$ represents a connecting group, $Y^1$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound;

(a2-1)

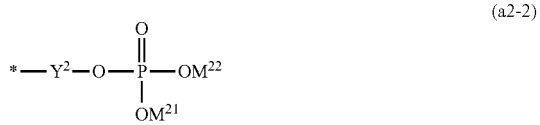

(a2-2)

(a2-3)

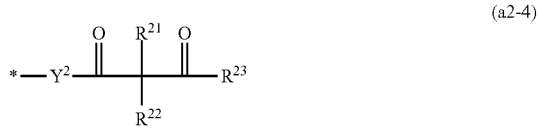

(a2-4)

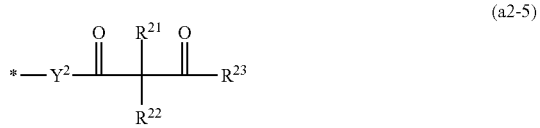

(a2-5)

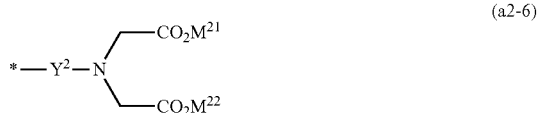

(a2-6)

wherein $M^{21}$ and $M^{22}$ each independently represents a hydrogen atom, a metal atom belonging to alkali metal or alkaline earth metal or an ammonium, $R^{21}$ to $R^{23}$ each independently represents a hydrogen atom or an alkyl group, $Y^2$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

2. The lithographic printing plate precursor as claimed in claim 1, wherein the repeating unit (a2) has a side chain having a structure represented by the formula (a2-1) or the formula (a2-2).

3. The lithographic printing plate precursor as claimed in claim 1, wherein the polymer compound (D) further comprises (a3) a repeating unit having a side chain having a structure represented by the following formula (a3-1) or (a3-2):

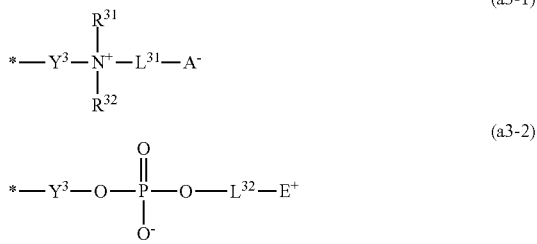

wherein, in the formula (a3-1), $R^{31}$ and $R^{32}$ each independently represents a hydrogen atom, an alkyl group, an alkenyl group, an alkynyl group, an aryl group or a heterocyclic group, or $R^{31}$ and $R^{32}$ may be combined with each other to from a ring structure, $L^{31}$ represents a connecting group, $A^-$ represents a structure having an anion, $Y^3$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound; in the formula (a3-2), $L^{32}$ represents a connecting group, $E^+$ represents a structure having a cation, $Y^3$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

4. The lithographic printing plate precursor as claimed in claim 3, wherein a side chain having a zwitter ion structure in the repeating unit (a3) has a structure represented by the formula (a3-1) and in the formula (a3-1), $A^-$ represents a sulfonate.

5. The lithographic printing plate precursor as claimed in claim 1, wherein the polymer compound (D) further has a side chain having a polyoxyalkylene structure represented by the following formula (a4-1):

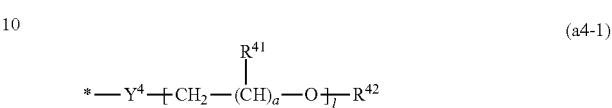

wherein $R^{41}$ represents a hydrogen atom or an alkyl group, $R^{42}$ represents a hydrogen atom, an alkyl group or an aryl group, a represents an integer from 1 to 5, 1 represents an integer from 2 to 150, $Y^4$ represents a single bond or a divalent connecting group selected from the group consisting of —CO—, —O—, —HN—, a divalent aliphatic group, a divalent aromatic group and a combination of these groups, and * indicates a site connecting to a main chain of the polymer compound.

6. The lithographic printing plate precursor as claimed in claim 1, wherein the polymer compound (D) is contained in the undercoat layer.

7. A method of preparing a lithographic printing plate comprising:
exposing imagewise the lithographic printing plate precursor as claimed in claim 1; and
removing an unexposed area of the image-recording layer by supplying printing ink and dampening water on a printing machine.

8. A method of preparing a lithographic printing plate comprising:
exposing imagewise the lithographic printing plate precursor as claimed in claim 1; and
removing an unexposed area of the image-recording layer by an automatic development processor in the presence of a developer having pH from 2 to 11.

* * * * *